United States Patent [19]

Kasai et al.

[11] Patent Number: 5,313,401
[45] Date of Patent: May 17, 1994

[54] MOUNTING SYSTEM INCLUDING A PLURALITY OF HAND MECHANISMS FOR PICKING UP, MOVING AND MOUNTING WORKS ON AN OBJECT BOARD

[75] Inventors: Shozo Kasai, Kawasaki; Yusaku Azuma; Yasushi Aoki, both of Yokohama; Makoto Akahira, Kawasaki; Takeshi Yakou, Tokyo; Katsumi Ishihara, Yokohama, all of Japan

[73] Assignee: Canon Kabushiki Kaisha, Tokyo, Japan

[21] Appl. No.: 552,126

[22] Filed: Jul. 13, 1990

[30] Foreign Application Priority Data

| Jul. 17, 1989 | [JP] | Japan | 1-182432 |
| Dec. 25, 1989 | [JP] | Japan | 1-332788 |
| Dec. 25, 1989 | [JP] | Japan | 1-332789 |
| Jul. 5, 1990 | [JP] | Japan | 2-176254 |
| Jul. 5, 1990 | [JP] | Japan | 2-176255 |
| Jul. 5, 1990 | [JP] | Japan | 2-176256 |
| Jul. 5, 1990 | [JP] | Japan | 2-176257 |

[51] Int. Cl.⁵ .......................... G06F 15/46; H05K 3/30
[52] U.S. Cl. .................................. 364/474.02; 29/838; 29/829; 29/834
[58] Field of Search ............... 364/474.02, 468; 29/739, 564.2, 740, 741, 834–836, 759, 705, 838, 829

[56] References Cited

U.S. PATENT DOCUMENTS

| 4,621,406 | 11/1986 | Fujiwara et al. | 29/564.2 |
| 4,681,452 | 7/1987 | Watanabe | 364/468 |
| 4,706,187 | 11/1987 | Arai et al. | 364/468 |
| 4,805,110 | 2/1989 | Takahashi et al. | 364/468 |
| 4,820,114 | 4/1989 | Inaba et al. | 414/751 |
| 4,844,680 | 7/1989 | Kawata et al. | 414/331 |
| 4,932,828 | 6/1990 | Katae et al. | 414/286 |
| 4,934,278 | 6/1990 | Tanita et al. | 104/119 |
| 4,951,388 | 8/1990 | Eguchi et al. | 29/739 |
| 4,951,517 | 8/1990 | Azuma et al. | 74/209 |
| 5,060,366 | 10/1991 | Asai et al. | 29/739 |
| 5,117,761 | 6/1992 | Kasai et al. | 108/22 |
| 5,165,165 | 11/1992 | Aoki et al. | 29/838 |

Primary Examiner—Jerry Smith
Assistant Examiner—Jim Trammell
Attorney, Agent, or Firm—Fitzpatrick, Cella, Harper & Scinto

[57] ABSTRACT

A mounting system having a function of picking up one of several different type works from a pickup position where the works having the different types are selectively fed, and of moving a picked up work to an insertion position so as to mount the work on a printed circuit board. The mounting system includes a rotary member arranged to be rotatable, head mechanisms having different types and mounted on the rotary member, the head mechanisms having a number of types corresponding to that of the types of the works, a memory for storing a pickup order and an insertion order in units of types of works, a driver for rotating and stopping the rotary member at predetermined angles, and a control device for preferentially driving the head mechanism to the pickup or insertion position.

21 Claims, 65 Drawing Sheets

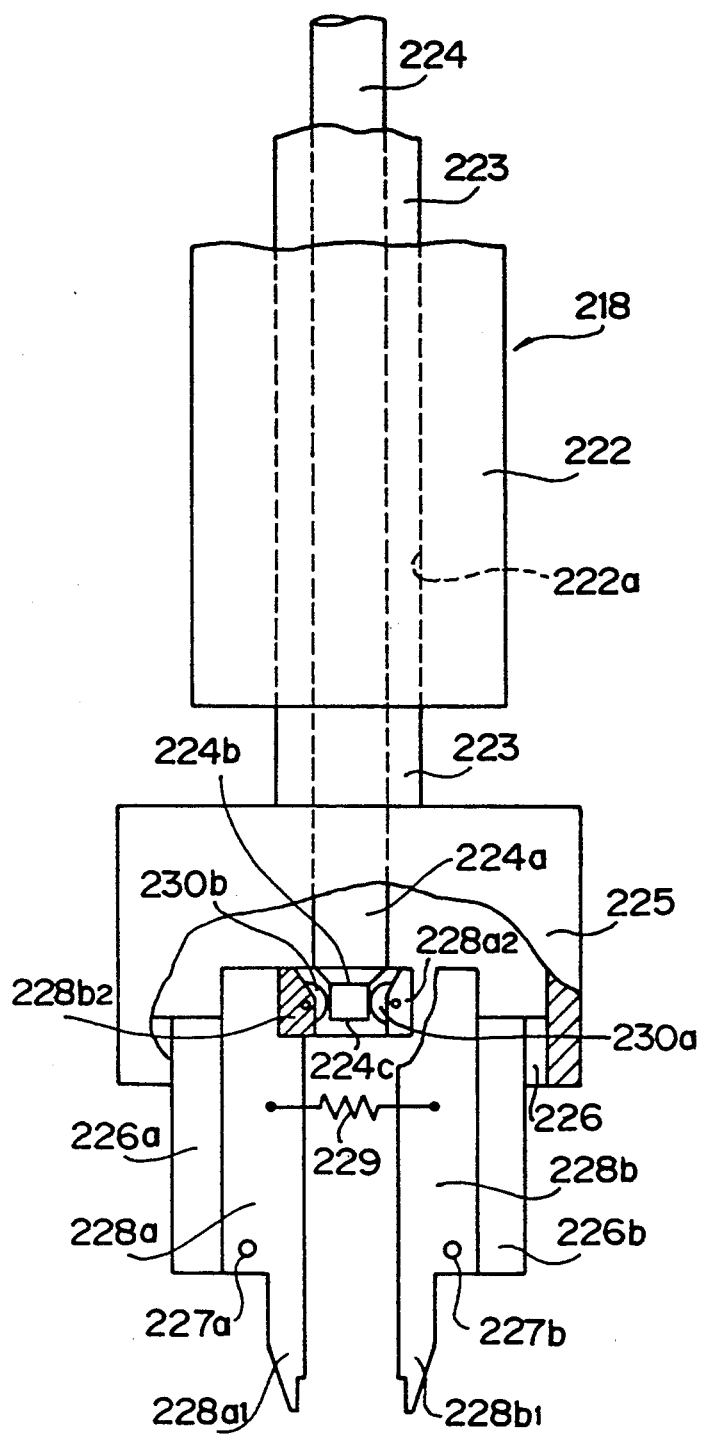
F I G. 10

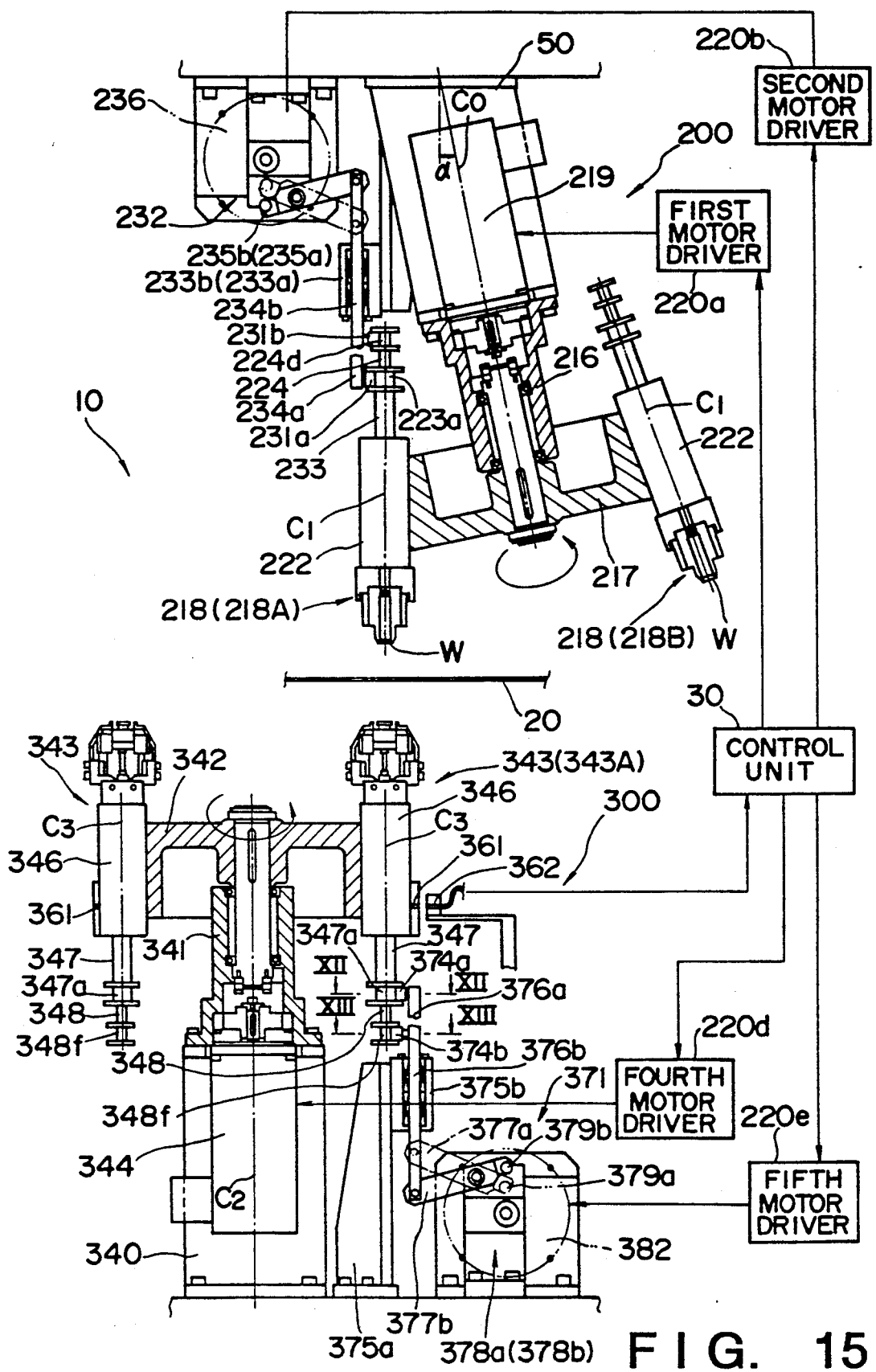
F I G. 15

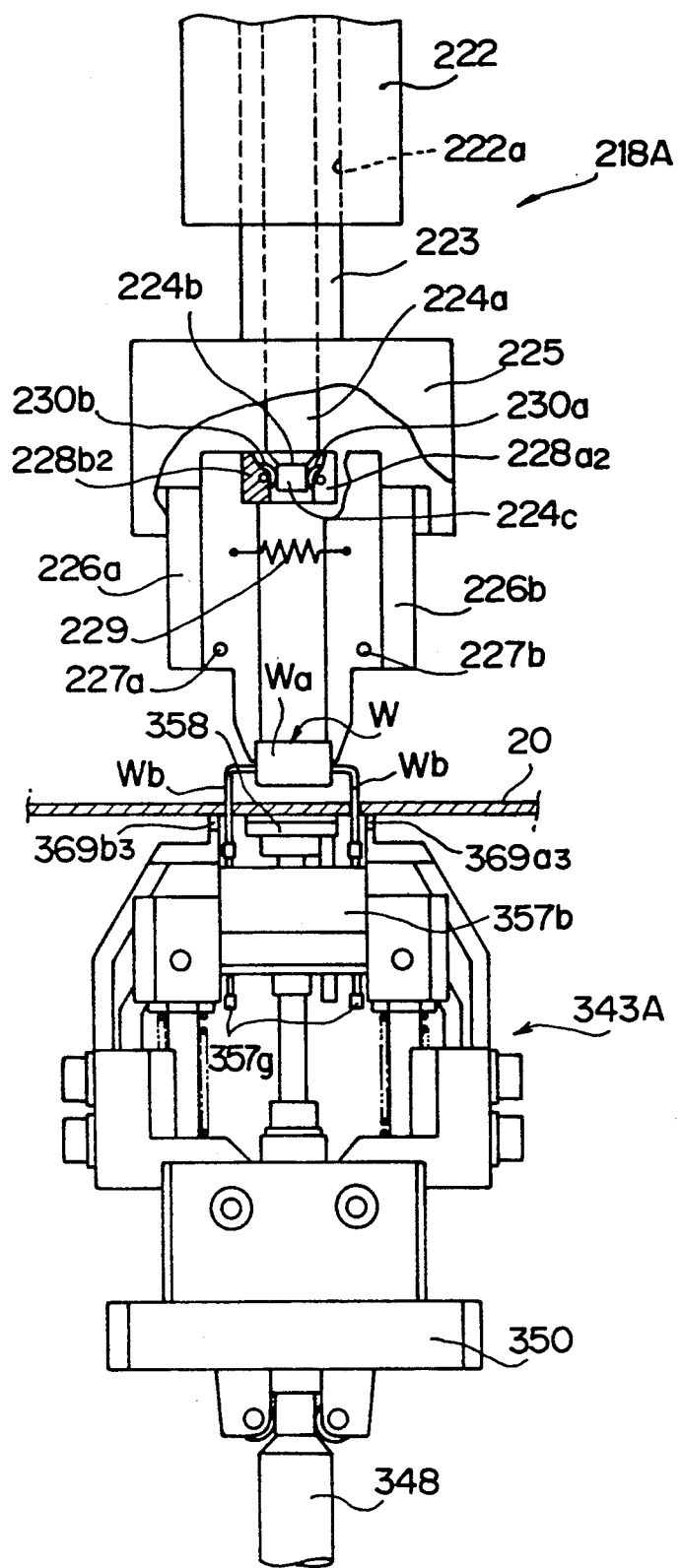
F I G. 27B

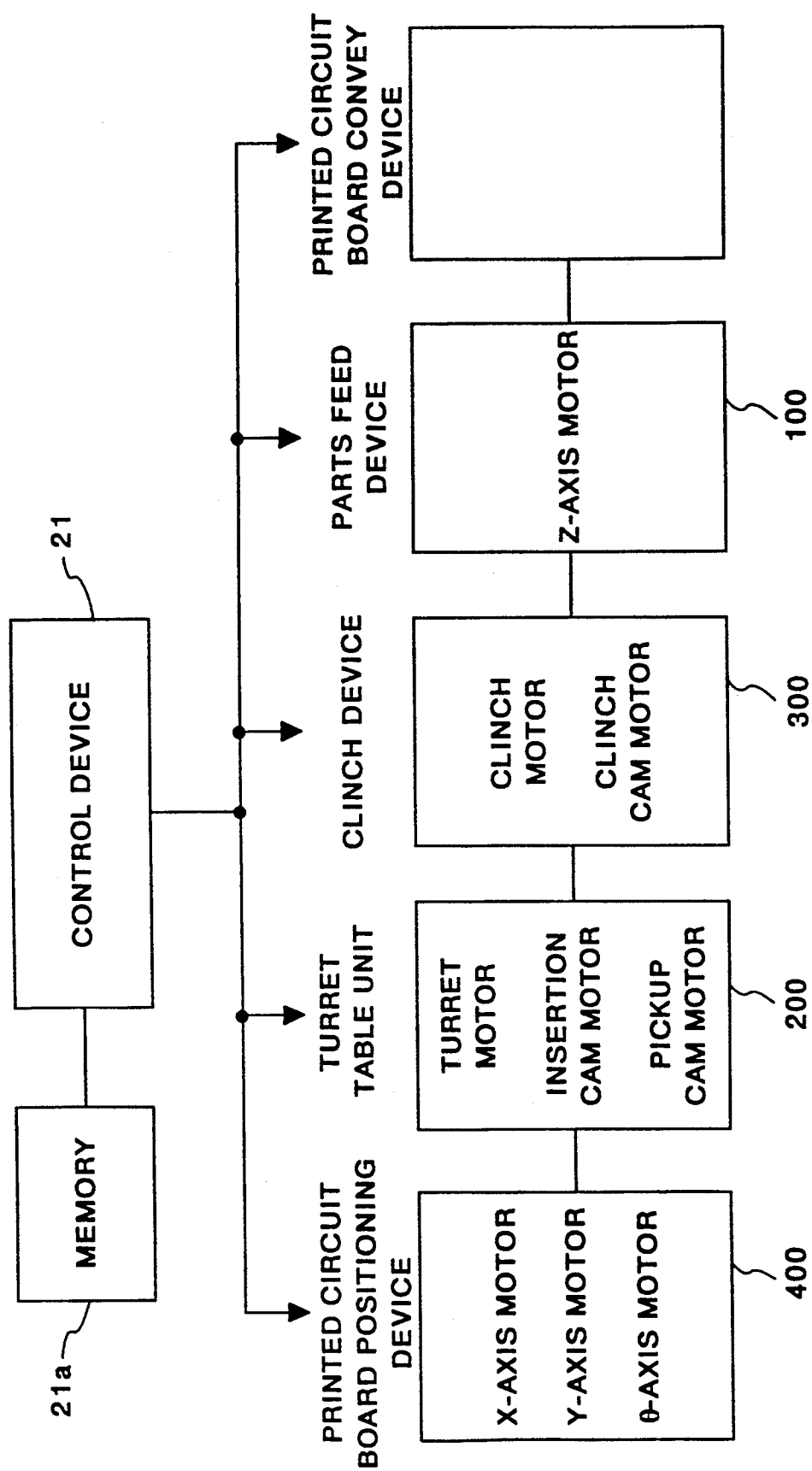
F I G. 32

PROCESS TABLE (PT)

| | X | Y | θ | Z | HD |
|---|---|---|---|---|---|
| S1 | 10 | 10 | 90 | 1 | 1 |
| S2 | 50 | 20 | 0 | 2 | 2 |
| S3 | 100 | 15 | 180 | 3 | 5 |
| S4 | 150 | 50 | 0 | 4 | 6 |
| S5 | 30 | 30 | 270 | 5 | 9 |
| S6 | 40 | 60 | 0 | 6 | 10 |
| S7 | 120 | 80 | 90 | 7 | 1 |
| . | . | . | . | . | . |
| . | . | . | . | . | . |
| . | . | . | . | . | . |
| $S_{MAX}$ | . | . | . | . | . |

SP points to the table.

F I G. 34

INSERTION TABLE (IT)

| | X | Y | θ |
|---|---|---|---|
| P(1) | | | |
| P(2) | | | |
| P(3) | | | |
| P(4) | | | |
| P(5) | | | |
| P(6) | | | |
| P(7) | | | |
| P(10) | | | |

IP points to P(4).

F I G. 35

|  | X | Y | θ |
|---|---|---|---|
| P(1) | 10 | 10 | 90 |
| P(2) |  |  |  |
| P(3) |  |  |  |
| P(4) |  |  |  |
| P(5) |  |  |  |
| P(6) |  |  |  |
| P(7) |  |  |  |
| P(8) |  |  |  |
| P(9) |  |  |  |
| P(10) |  |  |  |

(a)

|  | X | Y | θ |
|---|---|---|---|
| P(1) | 10 | 10 | 90 |
| P(2) | 50 | 20 | 0 |
| P(3) |  |  |  |
| P(4) |  |  |  |
| P(5) |  |  |  |
| P(6) |  |  |  |
| P(7) |  |  |  |
| P(8) |  |  |  |
| P(9) |  |  |  |
| P(10) |  |  |  |

(b)

|  | X | Y | θ |
|---|---|---|---|
| P(1) | 10 | 10 | 90 |
| P(2) | 50 | 20 | 0 |
| P(3) |  |  |  |
| P(4) |  |  |  |
| P(5) | 100 | 15 | 180 |
| P(6) |  |  |  |
| P(7) |  |  |  |
| P(8) |  |  |  |
| P(9) |  |  |  |
| P(10) |  |  |  |

(c)

|  | X | Y | θ |
|---|---|---|---|
| P(1) | 10 | 10 | 90 |
| P(2) | 50 | 20 | 0 |
| P(3) |  |  |  |
| P(4) |  |  |  |
| P(5) | 100 | 15 | 180 |
| P(6) | 150 | 50 | 0 |
| P(7) |  |  |  |
| P(8) |  |  |  |
| P(9) |  |  |  |
| P(10) |  |  |  |

|       | X   | Y  | θ   |
|-------|-----|-----|-----|
| P(1)  |     |    |     |
| P(2)  | 50  | 20 | 0   |
| P(3)  |     |    |     |
| P(4)  |     |    |     |
| P(5)  | 100 | 15 | 180 |
| P(6)  | 150 | 50 | 0   |
| P(7)  |     |    |     |
| P(8)  |     |    |     |
| P(9)  |     |    |     |
| P(10) |     |    |     |

(f)

|       | X   | Y  | θ   |
|-------|-----|-----|-----|
| P(1)  |     |    |     |
| P(2)  |     |    |     |
| P(3)  |     |    |     |
| P(4)  |     |    |     |
| P(5)  | 100 | 15 | 180 |
| P(6)  | 150 | 50 | 0   |
| P(7)  |     |    |     |
| P(8)  |     |    |     |
| P(9)  |     |    |     |
| P(10) |     |    |     |

(g)

|       | X   | Y  | θ   |
|-------|-----|-----|-----|
| P(1)  |     |    |     |
| P(2)  |     |    |     |
| P(3)  |     |    |     |
| P(4)  |     |    |     |
| P(5)  | 100 | 15 | 180 |
| P(6)  | 150 | 50 | 0   |
| P(7)  |     |    |     |
| P(8)  |     |    |     |
| P(9)  | 30  | 30 | 270 |
| P(10) |     |    |     |

(h)

|       | X   | Y  | θ   |
|-------|-----|-----|-----|
| P(1)  |     |    |     |
| P(2)  |     |    |     |
| P(3)  |     |    |     |
| P(4)  |     |    |     |
| P(5)  |     |    |     |
| P(6)  | 150 | 50 | 0   |
| P(7)  |     |    |     |
| P(8)  |     |    |     |
| P(9)  | 30  | 30 | 270 |
| P(10) | 40  | 60 | 0   |

FIG. 37B

|       | X   | Y  | θ  |
|-------|-----|----|-----|
| P(1)  | 120 | 80 | 90 |
| P(2)  |     |    |    |
| P(3)  |     |    |    |
| P(4)  |     |    |    |
| P(5)  |     |    |    |
| P(6)  | 150 | 50 | 0  |
| P(7)  |     |    |    |
| P(8)  |     |    |    |
| P(9)  | 30  | 30 | 270 |
| P(10) | 40  | 60 | 0  |
(i)
|       | X   | Y  | θ  |
|-------|-----|----|-----|
| P(1)  | 120 | 80 | 90 |
| P(2)  |     |    |    |
| P(3)  |     |    |    |
| P(4)  |     |    |    |
| P(5)  |     |    |    |
| P(6)  |     |    |    |
| P(7)  |     |    |    |
| P(8)  |     |    |    |
| P(9)  | 30  | 30 | 270 |
| P(10) | 40  | 60 | 0  |
(j)
F I G. 37C

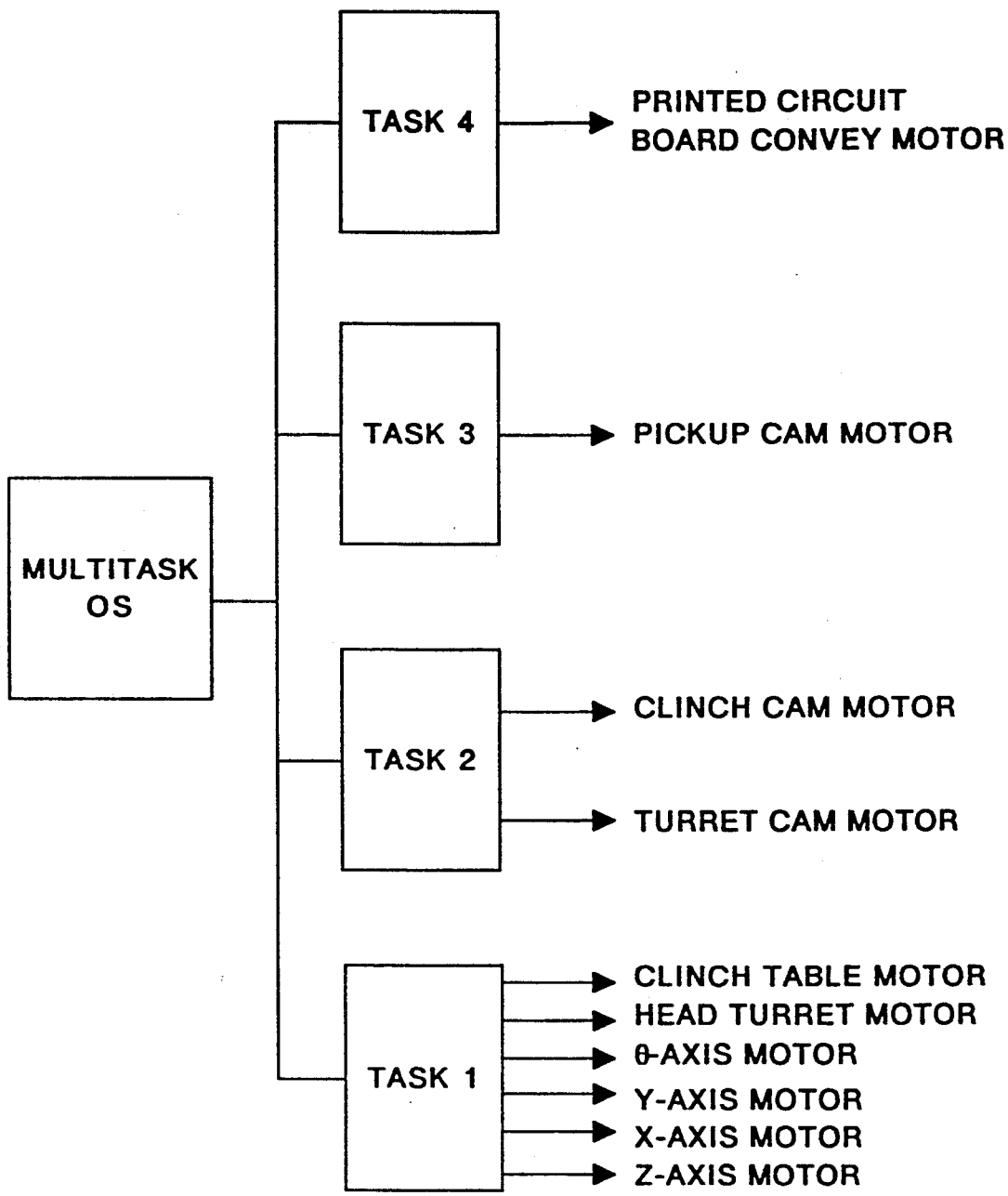
F I G. 38

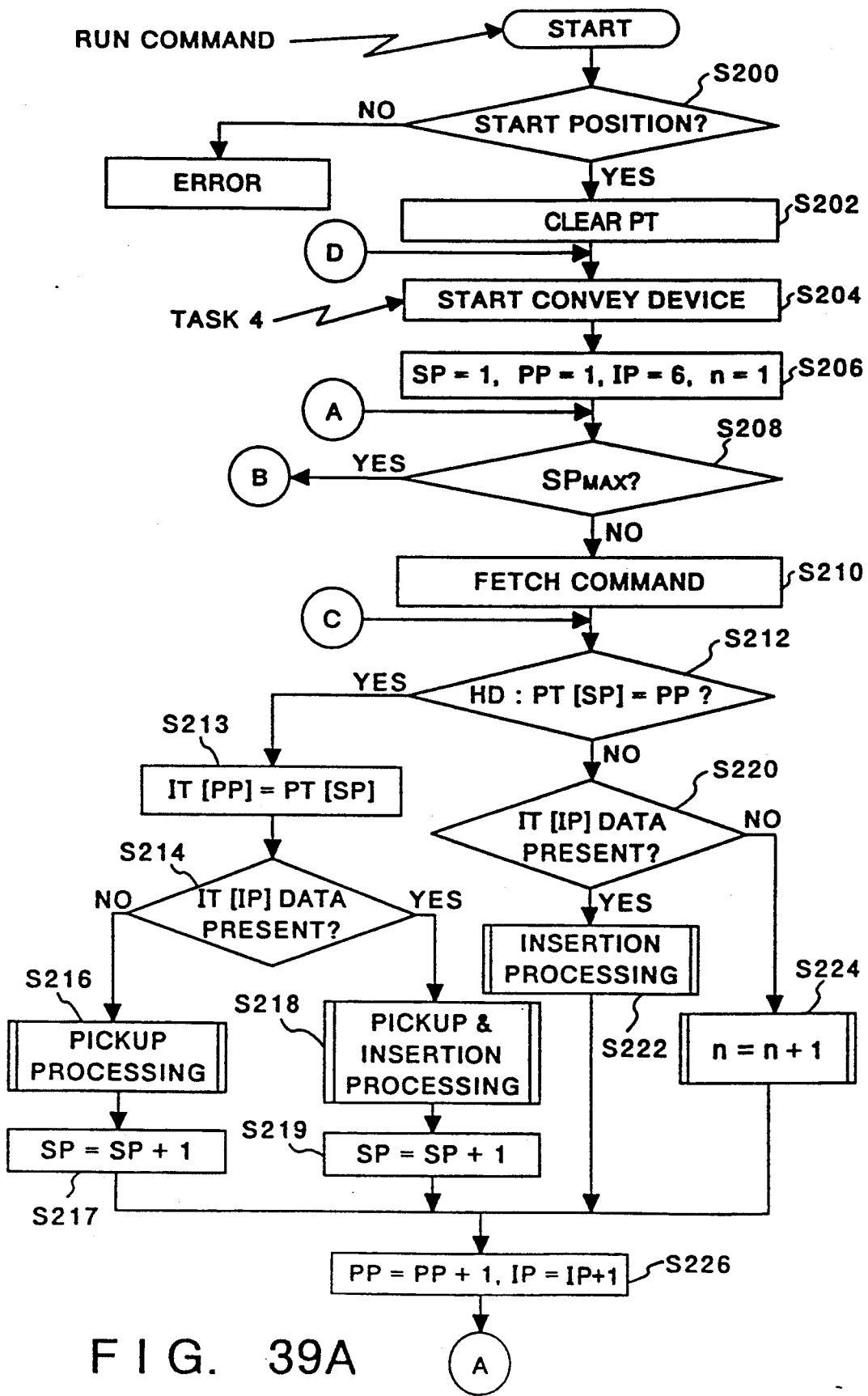
F I G. 39A

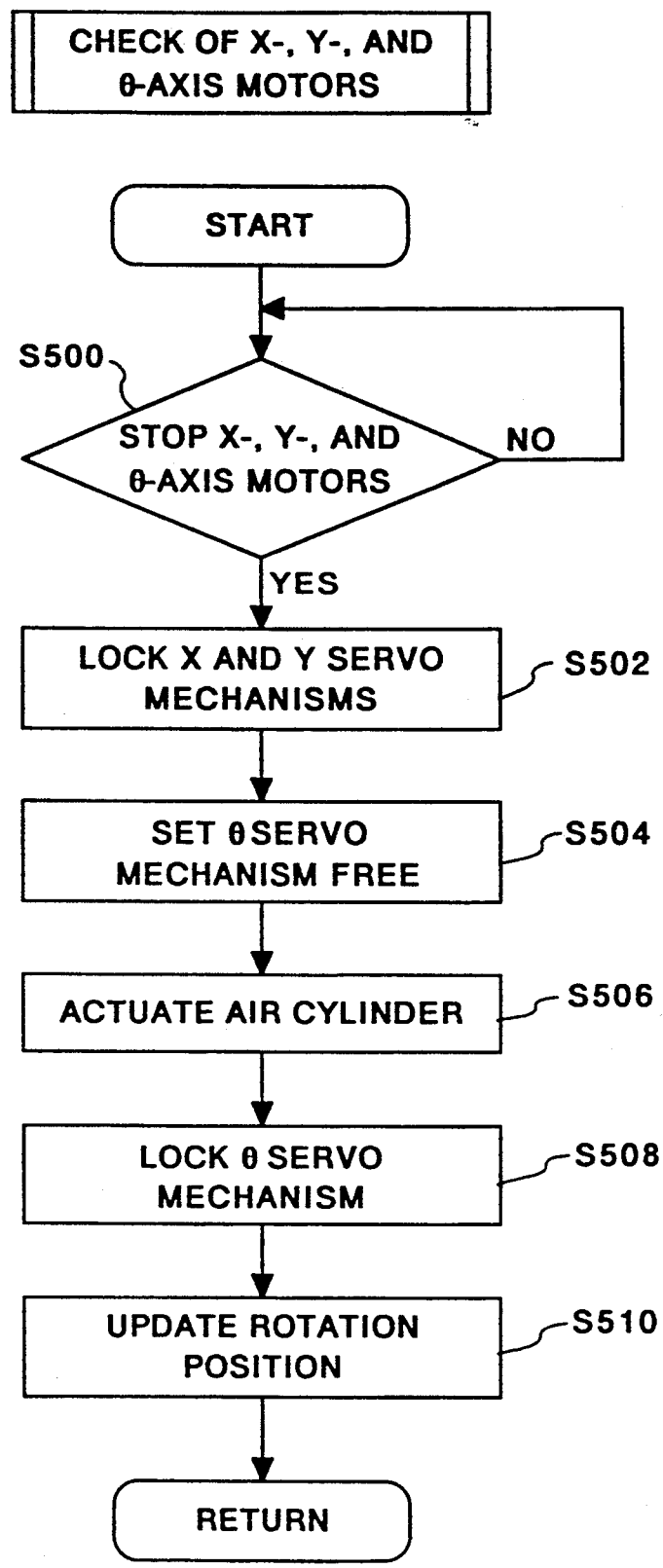
F I G. 45

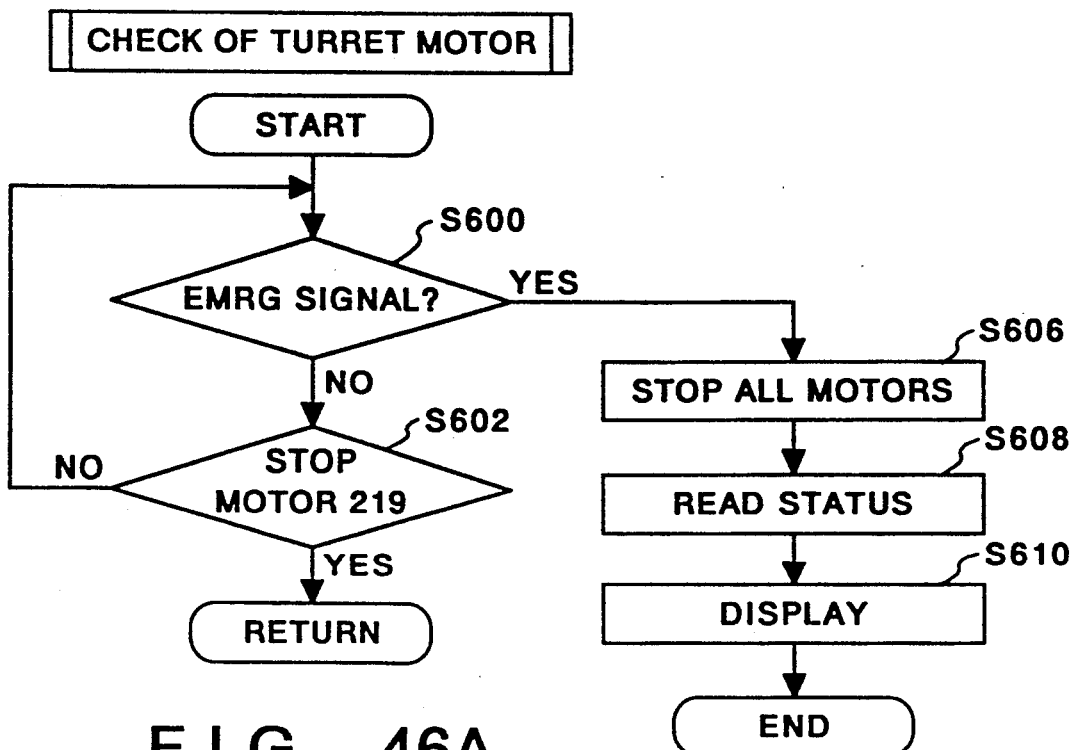
F I G. 46A
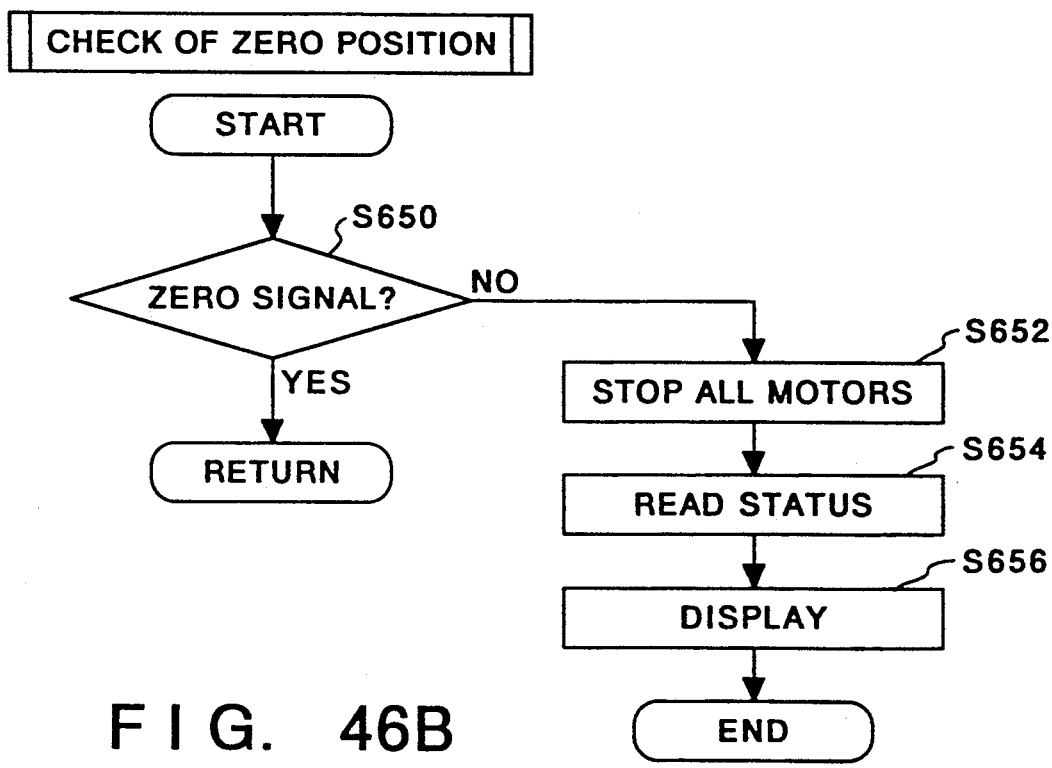
F I G. 46B

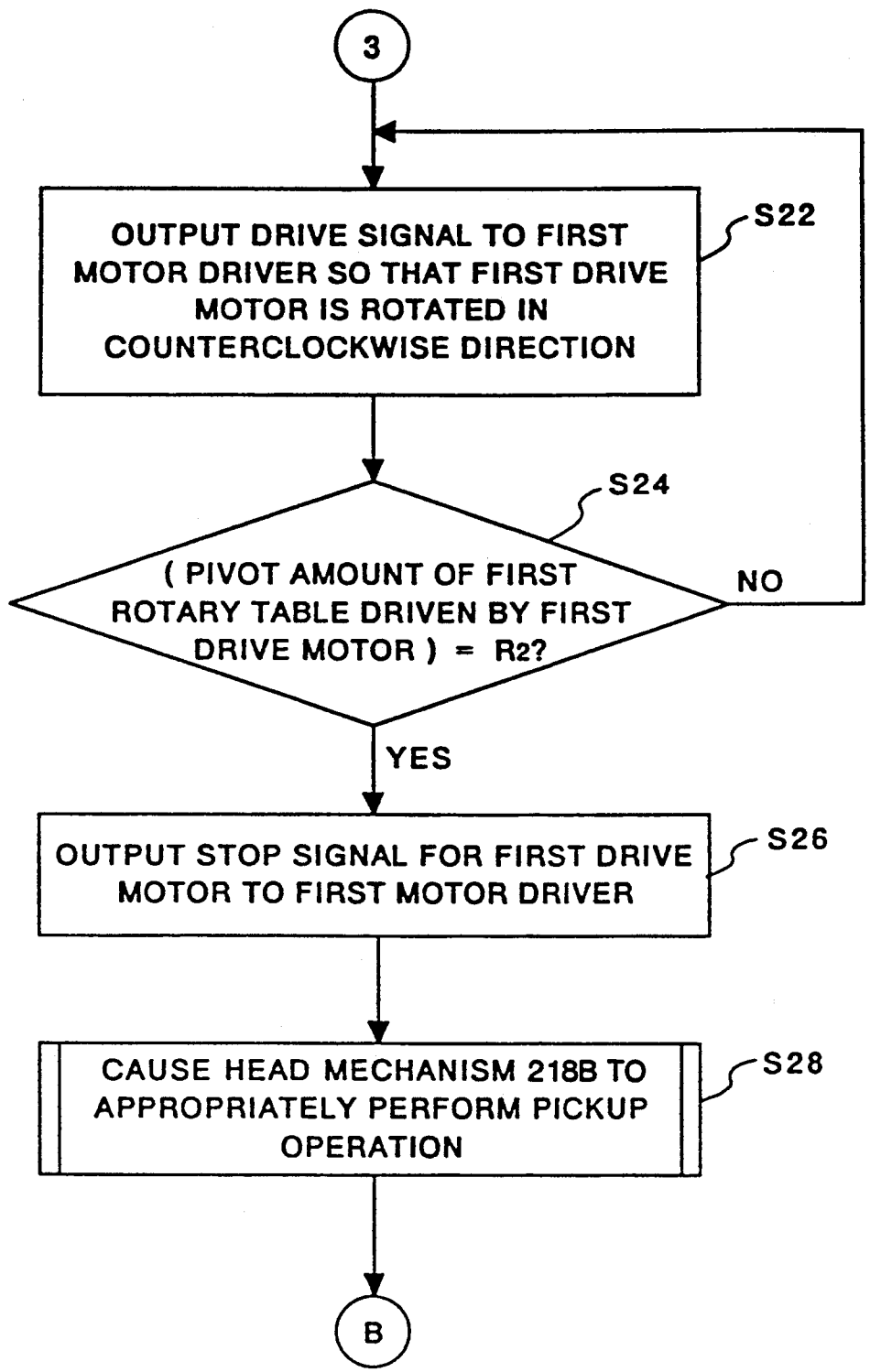
F I G. 47AB

MOUNTING SYSTEM INCLUDING A PLURALITY OF HAND MECHANISMS FOR PICKING UP, MOVING AND MOUNTING WORKS ON AN OBJECT BOARD

BACKGROUND OF THE INVENTION

The present invention relates to a turret type mounting table having a turret table with a plurality of work holding mechanisms and, more particularly, to a turret type mounting system having a mechanism for causing one holding mechanism to pick up a work such as an IC device from an external work feed device or the like at a fixed feed position on a rotational track and for causing one holding mechanism which holds the work to release the work at a fixed release position on the rotational track so as to mount the work.

More specifically, the present invention relates to a control device for a turret type mounting system which is essentially autonomous, is not adversely affected by a mounting order, types of works, the number of work holding mechanisms, and the like, and can sufficiently cope with changes in these factors.

A most advanced mounting system is indispensable to produce high-quality electronic/electric products in a large quantity. In order to insert standard parts such as ICs and resistors on a printed circuit board for electronic/electric products at normal positions, there are required an external feed device for feeding parts to this mounter and an external device for moving a printed circuit board since the mounter itself cannot feed parts or convey the printed circuit board. The device for moving the printed circuit board comprises, e.g., an X-Y table.

For example, Japanese Patent Laid-Open No. 61-136298 discloses a technique for performing vacuum suction and mounting of a work by arranging a plurality of suction heads in the edge of a rotary table and by rotating the rotary table. More specifically, Japanese Patent Laid-Open No. 61-136298 discloses an "automatic electronic parts mounting apparatus comprising an X-Y table for positioning a printed circuit board, a parts shelf disposed near the X-Y table and movable in a lateral direction, a rotatable turntable arranged between the parts shelf and the X-Y table, rotatable mounting heads mounted along the edge of the turntable at equal angular intervals, a plurality of mounting chuck mechanisms having different shapes and mounted at the distal ends of the mounting heads, and a plurality of cams arranged around the turntable, wherein, of the plurality of mounting chuck mechanisms, one mounting chuck selected by driving the corresponding mounting head with a mounting chuck selection cam (of the plurality of cams) driven by electronic part type data is operated to cause a polarity selection cam driven by electronic part polarity direction data to change the direction of the selected mounting chute, an electronic part is chucked from the parts shelf; during rotation of the turntable, the mounting direction of the mounting head is selected by a mounting direction selection cam driven by the electronic part type data; and the electronic part is mounted on the printed circuit board on the X-Y table".

In the conventional example, however, since each head mechanism is fed by one pitch and then stopped, the following problems are presented.

For example, when 20 types of parts having ten shapes are to be mounted by 10 head mechanisms, the shapes of parts mounted in units of head mechanisms are generally different from each other. For this reason, a head mechanism which has completed parts mounting need not be stopped at pickup and insertion positions.

In a turret table which performs intermittent feeding in units of pitches, each head mechanism must be temporarily stopped at the pickup and insertion positions, and the number of unnecessary stops is increased. In a conventional turret type mounter, a tact period is prolonged, and workability is degraded.

In such a conventional turret type mounting system, a plurality of work holding mechanisms are rotated, and a position where a part is received from an external parts feed device is fixed. In addition, a position at which a part held by the turret table of the mounter is transferred to a printed circuit position, i.e., an insertion position (or release position), is also fixed due to the following reason. Since many types of parts are transferred from the parts feed device to the mounter, a large waiting space is inevitably required for the parts. In addition, the space above a printed circuit board subjected to parts insertion is large. For these reasons, a feed position for transferring parts from the parts feed device to the turret mounter and a release position at which the parts are inserted from the turret mounter to the printed circuit board are fixed to obtain higher efficiency. Therefore, transfer of necessary parts to the fixed feed position on the turret table is controlled by the parts feed device, and a shift of the insertion position on the printed circuit board to the fixed release position on the turret table is controlled by the X-Y table.

The parts feed device can move necessary parts to the fixed feed position at high speed since this movement is monotonous linear or rotational motion. No problem is posed even if the parts are fed at high speed because a large number of parts prior to mounting are properly held. Each part can be firmly gripped in the mounter prior to mounting, and the turret table is subjected to simple rotational motion. Therefore, high-speed rotational motion is suitable even in the mounter.

When the parts are continuously inserted from the mounter to the printed circuit board, it is difficult to move the X-Y table at high speed because although each part is simply inserted, the part must be clinched. For this reason, since the X-Y table must be moved at low speed, it is very important to find an order of movement of the X-Y table, i.e., an order of insertion of parts on the printed circuit board so as to move the table to all insertion positions of the parts within the shortest period of time at this low speed.

It is possible to find an optimal mounting order on each printed circuit beforehand.

The following problems are posed in this case.

(1) This optimal mounting order, i.e., the insertion order, must be maintained since it is optimal. When this order is maintained, the order of parts transferred from the mounter to the X-Y table must be the same as the insertion order.

(2) This optimal mounting order varies in products.

(3) In order to maintain optimal mounting orders for all products, an operation of the parts feed device, rotation of the turret table during transfer of parts from the parts feed device to the mounter, a pickup operation at a feed position on each holding mechanism, a release operation of the holding mechanism at the release position (insertion position), and the like must be taught in each optimal mounting order of each product type. It is, however, impossible to realize this control when the type of product varies.

When many types of products must be assembled, rotation of the turret table during transfer of parts from the parts feed device to the mounter, the pickup operation of each holding mechanism at the feed position, and the release operation of each holding mechanism at the release position (insertion position) are simple detailed operations in a conventional system.

The detailed operations are defined such that the turret table is stopped every rotation by a unit rotation amount and picks up a part, if any, at the feed position by a gripping operation of a holding mechanism, and the turret table sequentially releases parts at the release position (insertion position) so that the released parts are sequentially inserted. Assume that the next part to be transferred to the mounter in a given mounting order is a part A which cannot be gripped by a holding mechanism located at the pickup position. A dummy pickup operation (non-pickup operation) is performed by this holding mechanism, and the part A is picked up by the next holding mechanism.

That is, in order to maintain an optimal mounting order for all products, the following additional problems are posed by the conventional system:

(4) the turret table is stopped every time a holding mechanism (gripper head) comes to the feed position, and (5) if a holding mechanism which comes to the feed position cannot grip a part located at the pickup position, this holding mechanism must perform a dummy pickup operation.

The operations (4) and (5) are obstacles which degrade total mounting efficiency in the conventional system.

SUMMARY OF THE INVENTION

The present invention has been made in consideration of the above situation, and has as its object to provide a control device for a turret mounting system capable of maintaining any mounting order without any disturbance regardless of preset mounting orders, flexibly coping with any preset mounting order, and preventing degradation of mounting efficiency.

It is another object of the present invention to provide a mounting system for efficiently mounting a work such as an IC on a printed circuit board or the like.

It is still another object of the present invention to provide a work mounting system for feeding a work such as an IC from an external device and efficiently mounting the work on a printed circuit board or the like.

In order to solve the conventional problems described above and achieve the above objects, according to the present invention, there is provided a control device for a turret type mounting system having a turret table with a plurality of work holding mechanisms and having fixed feed position for holding an externally fed work and a fixed release position for releasing a held work so as to mount the held work. The device comprises:

a memory for storing a process program table which describes a work mounting order and a holding status table representing whether each of the holding mechanisms holds a work or not;

determining means for accessing the process program table and the holding status table to determine whether a process for feeding a work by one holding mechanism supposed to reach the feed position is present in the process program table, and to determine whether another holding mechanism reaching the release position simultaneously with arrival of the one holding mechanism at the feed position holds a work; and command means for instructing, when at least one of two determination results is affirmative, to rotate and stop the turret table and allow a work holding operation and a work release operation of an affirmatively determined one of the one and another holding mechanisms respectively reaching the feed and release positions.

In order to achieve the above objects of the present invention, there is provided a mounting system comprising:

a table for holding a printed circuit board on which a work is to be mounted, and for positioning the printed circuit board in X, Y, and rotational directions;

a finger head mechanism having a plurality of finger heads which are located vertically above the table while holding works to be mounted on the printed circuit board, and are vertically moved to mount the works on the printed circuit board; and a clinch head mechanism having a plurality of clinch heads, located below the table, for upwardly clinching a work mounted by the finger head on the printed circuit board.

In order to achieve the above objects of the present invention, there is provided a work mounting system comprising:

a work feed mechanism which stores a plurality of works, the work feed mechanism being arranged to separate a target work from other works upon the dropping of one work from a standby position by a weight of this one work and locating a separated work to a gripping position where a finger head can grip the separated work;

a positioning table for holding a printed circuit board on which a plurality of works are to be mounted, and for positioning the printed circuit board in X, Y, and rotational directions; and a finger head rotation mechanism, rotatably having a turret table with the plurality of finger heads, for rotating an arbitrary finger head to the gripping position or rotating the arbitrary finger head to a release position at which the work is released from the arbitrary finger head, each finger head being mounted on the turret table so that an operation direction of the finger head is perpendicular to the positioning table at the release position and the operation direction is inclined at a gripping position by an angle $2\alpha$ from a vertical direction, the turret table having an axis of rotation inclined by an angle $\alpha$ from the vertical direction.

A control apparatus for the turret type mounter having the above arrangement according to the present invention determines whether the process for feeding a work by one holding mechanism supposed to reach the feed position is present in the process program table. At the same time, the control apparatus determines whether another holding mechanism reaching the release position simultaneously with arrival of the one holding mechanism at the feed position holds a work.

If at least one of the two determination results is affirmative, the turret table is rotated and stopped. A command is output to perform the work holding and release operations of one of the two holding mechanisms respectively reaching the feed and release positions, which is determined to be affirmative. It is properly determined whether only the feed or release operation is performed, or whether both the operations can be performed. When none of the operations are required, the stop of the turret table which is inevitably performed in a conventional system can be eliminated in the present invention, thereby improving efficiency.

In particular, when the process program table is accessed in accordance with a mounting order, the preset mounting order is not disturbed.

In the mounting apparatus having the arrangement described above, positioning of the printed circuit board or the like in the X, Y, and rotational directions is performed by the positioning table. For this reason, the finger head mechanism need perform only simple vertical and repeated operations, i.e., the rotational and gripping operations. Since the clinch head for clinching the work mounted on the printed circuit board is located below the printed circuit board, the operation for releasing the work from the finger head can be performed in synchronism with the operation of clinching the work by the clinch head, thus further improving efficiency.

In the mounting system having the above arrangement, each finger head is located at the release position so that its operation direction is perpendicular to the positioning table. At the gripping position, each finger head is arranged so that its operation direction is inclined from the vertical direction by the angle $2\alpha$, and the direction of the axis of rotation of the turret table is inclined from the vertical direction by the angle $\alpha$. The finger head rotation mechanism need perform only a vertical operation in a direction angularly shifted from the vertical direction at the gripping position of each finger head by $2\alpha$ and a vertical operation parallel to the vertical direction at the release position. In other words, the operations of the finger head rotation mechanism can be simplified, and freedom which allows complicated operational control can be increased.

It is still another object of the present invention to provide a mounting system having a plurality of head mechanisms corresponding to types of works on a rotary member, for intermittently moving each head mechanism between a work pickup position and a work insertion position to perform work pickup and insertion operations so as to mount a work such as an IC, a transistor, or a resistor at a predetermined position of a printed circuit board, wherein a pickup operation of a new work or an insertion operation of the picked work is selected in the next step while some of the other head mechanisms pick up works, thereby increasing the number of works mounted per unit time and shortening an actual mounting time in the mounting system.

It is still another object of the present invention to provide a mounting system wherein a plurality of head mechanisms for performing pickup and insertion operations are mounted on a rotary member, and a pickup operation and/or an insertion operation are/is performed so that a specific head mechanism is not intermittently driven and, instead, the head mechanisms are continuously driven to the pickup or insertion position.

According to the present invention, the head mechanism comprises a gripper member for gripping a work located at the pickup position, and a descending member for rotating and moving the gripper member, which has gripped a work, to the insertion position and for moving the gripper member downward to insert the work at a predetermined mounting position of the printed circuit board. In the mounting system of the present invention, pickup driving means for picking up the gripper member reaching the pickup position and downward driving means for descending the descending member reaching the insertion position are arranged near the head mechanism. By movement of the works to the pickup and insertion positions upon rotation of the head mechanism, the gripper member and the pickup driving means must be smoothly coupled, and the descending member and the downward driving means must be smoothly coupled. According to the present invention, in order to allow these smooth coupling operations, there is provided means for detecting that the head mechanism is located at a coupling enable state. If the above coupling operations are not allowed during intermittent rotation of the head mechanism upon rotation of the rotary member, the mounting system can guarantee a fail-safe operation of the system.

It is still another object of the present invention to provide a mounting system for mounting works such as an electronic part (i.e., an integrated circuit, a capacitor, or a resistor on a printed circuit board) and a mounting part (e.g., a connector terminal) on the printed circuit board, comprising a head mechanism having a novel structure for performing work pickup and insertion operations and an operation of conveying a work from the pickup position to the insertion position upon reception of the work from the feed means.

According to the present invention, in particular, in a mounting system having a plurality of head mechanisms mounted on the rotary member, for driving each head mechanism between the pickup and insertion positions upon rotation of the rotary member, when a larger number of works than that of the head mechanisms mounted on the rotary member are to be mounted, the head mechanisms corresponding to the types of parts can be detachably mounted on the rotary member, thereby providing a mounting system capable of coping with mounting works having different types and shapes.

It is still another object of the present invention to provide a new method of changing the head mechanisms.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 10 is a partial sectional view showing a head device included in the turret table device shown in FIG. 9;

FIG. 15 is a side view showing a positional relationship between a printed circuit board, the turret table device, and a clinch device, the latter two of which are included in the mounting system in FIG. 1;

FIGS. 27A to 27E are front views showing the steps of sequentially clinching works by the head and clinch mechanisms in correspondence with states (A) to (E) in FIG. 26A;

FIG. 32 is a chart showing a relationship between control targets (motors) included in the respective devices in the mounting system of this embodiment;

FIG. 34 is a chart for explaining a structure of a process table PT for storing a mounting command program;

FIG. 35 is a chart for explaining a structure of an insertion table IT for storing head information of each head device;

FIGS. 37A to 37C are charts for briefly explaining pickup and insertion operations in accordance with changes in data stored in the insertion table IT;

FIG. 38 is a chart for explaining a relationship between tasks;

FIGS. 39A and 39B are flow charts showing a control sequence of TASK 1;

FIG. 45 is a flow chart showing a control sequence for checking an end of operation in a positioning device 400;

FIG. 46A is a flow chart showing a control sequence for checking an end of operation in a turret table device 200;

FIG. 46B is a flow chart showing a control sequence for checking zero cam position in TASK 2 and TASK 3;

DETAILED DESCRIPTION OF THE PREFERRED EMBODIMENTS

An electronic parts mounting system according to the present invention will be described in detail with reference to the accompanying drawings.

Description of System Configuration

Figure 1:
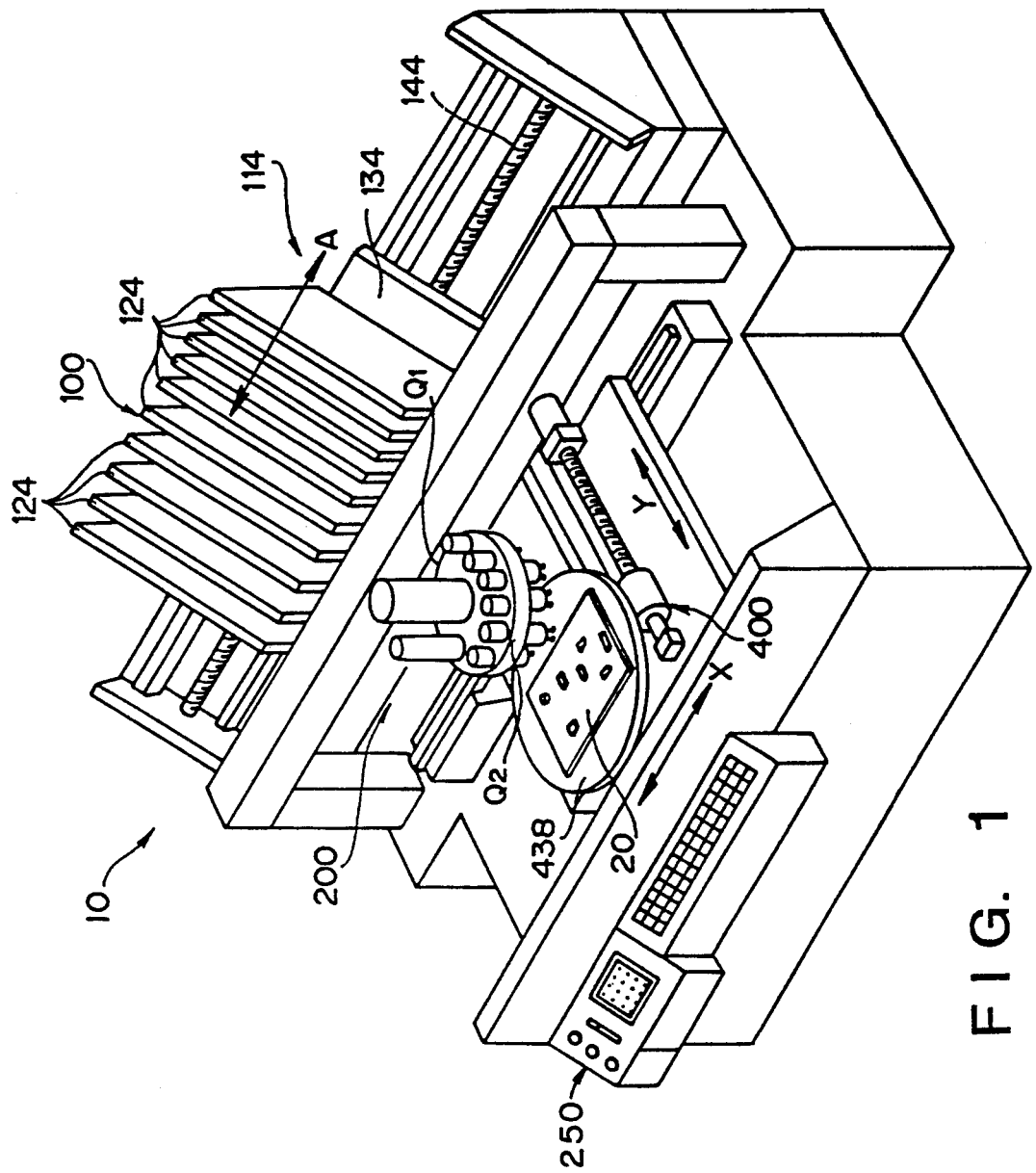
FIG. 1 is a perspective view schematically showing an outer appearance of a mounting system as a whole according to the present invention.
Figure 2:
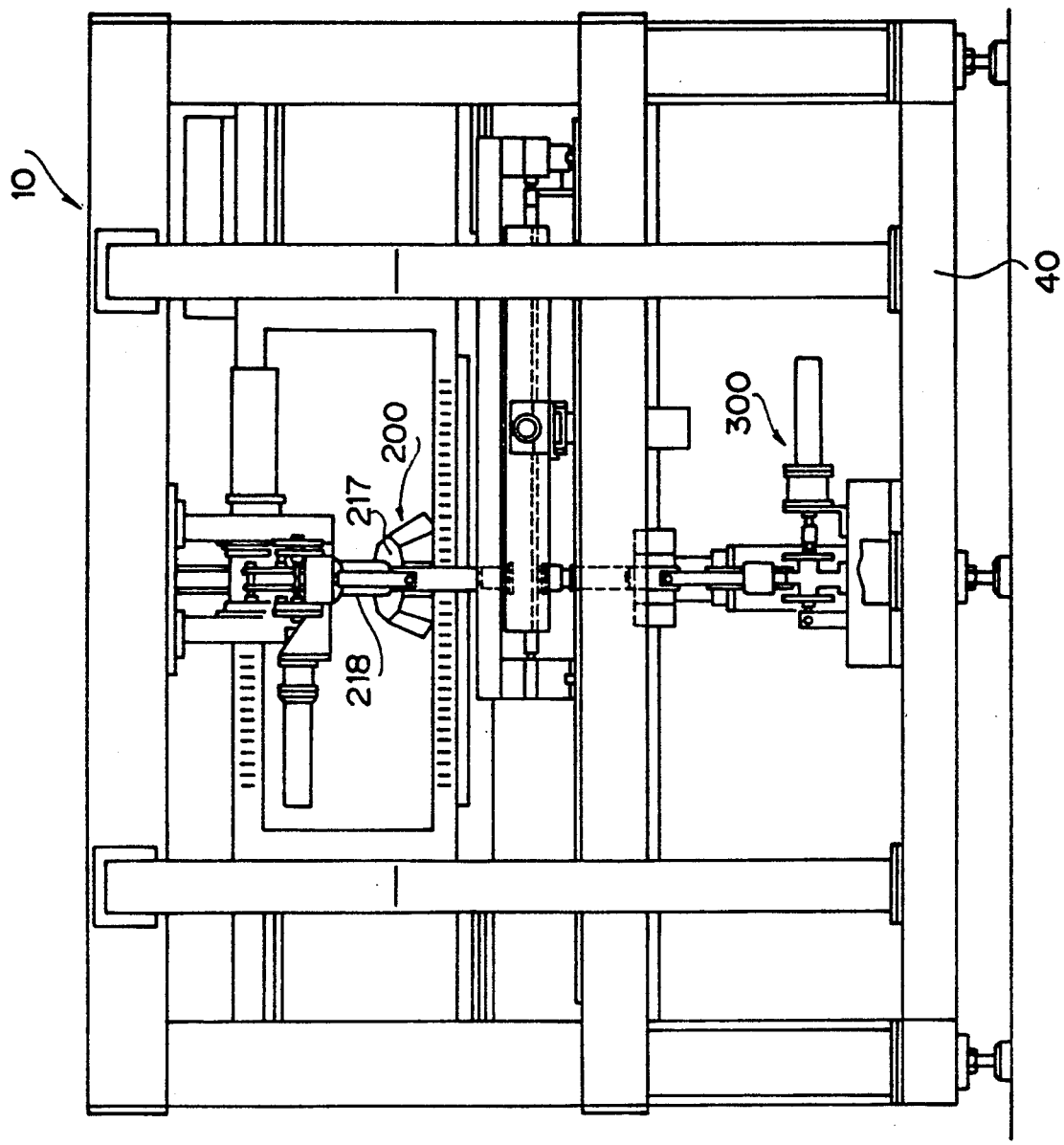
FIG. 2 is a front view showing a front outline of the mounting system shown in FIG. 1.
Figure 3:
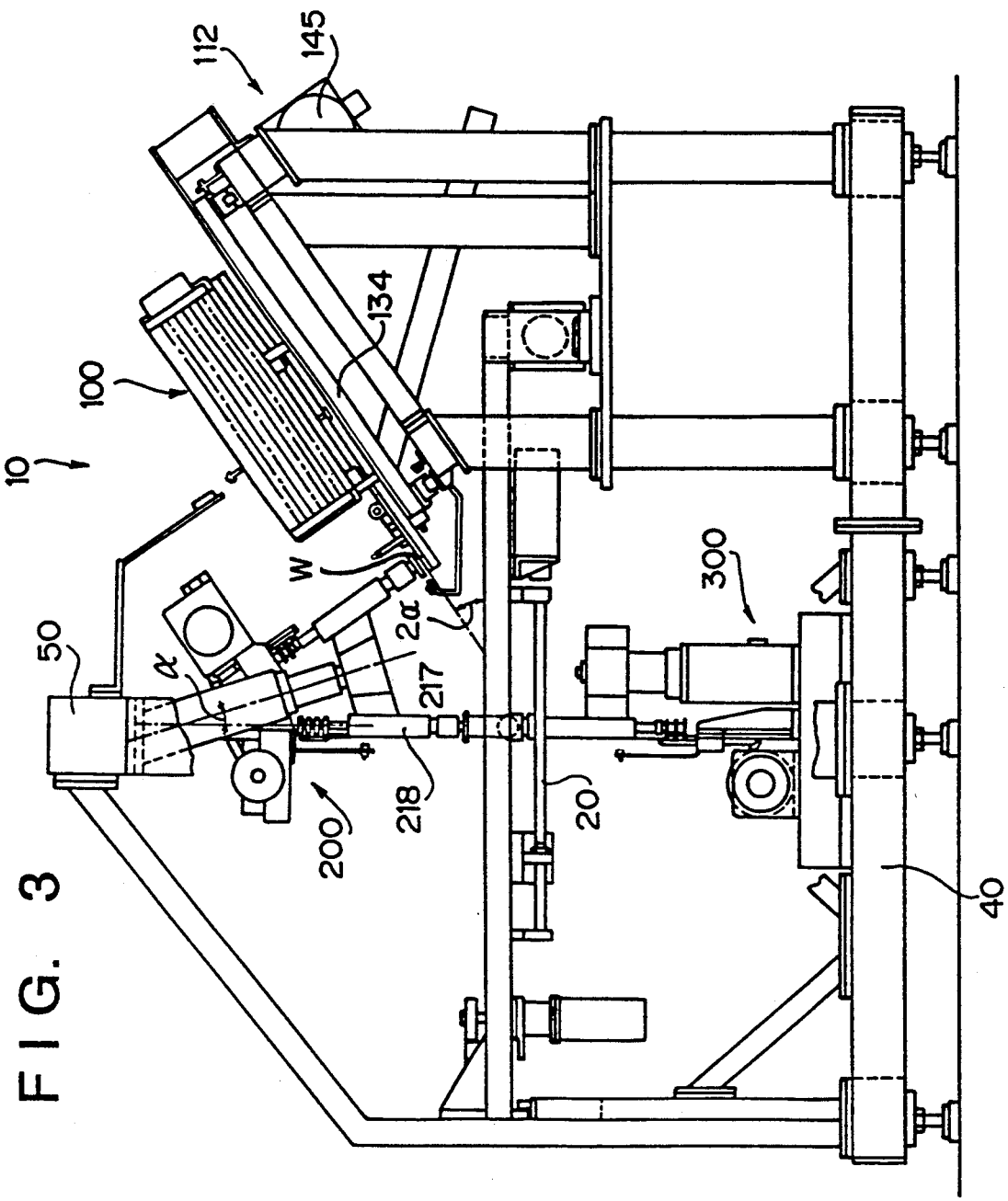
FIG. 3 is a side view showing a side outline of the mounting system shown in FIG. 1.

According to an embodiment, as shown in FIGS. 1 to 3, a mounting system 10 mainly comprises a parts feed device 100 for selectively picking up one part W from electronic parts W having 10 shapes and 20 types, a turret table device 200 for picking up the part W fed to a pickup position by the parts feed device 100, conveying the part W to an insertion position, and inserting the part W into a printed circuit board 20 at the insertion position, a clinch device 300 for clinching the electronic part W inserted into the printed circuit board 20 by the turret table device 200, and a printed circuit board positioning device 400 for linearly moving the printed circuit board 20 along the X- and Y-axes to arbitrarily set an angular position and a rotational posture of the part W at the insertion position with respect to the printed circuit board 20 and for rotating and driving the part W about a vertical axis. In this embodiment, the electronic part W is, e.g., a package type IC.

Description of Parts Feed Device

As shown in FIG. 1, the parts feed device 100 comprises work feed units 124 aligned in directions indicated by a double-headed arrow A. Each work feed unit 124 has sticks which contain a predetermined number and type of works W. The works W comprise 20 types of works having ten different shapes. The parts feed device 100 has a moving mechanism 114 for reciprocating each work feed unit 124 through a pickup position $Q_1$ on a line along the A direction. In the parts feed device 100, a desired type of work W is selectively brought into the pickup position $Q_1$ by the moving mechanism 114.

Figure 4:
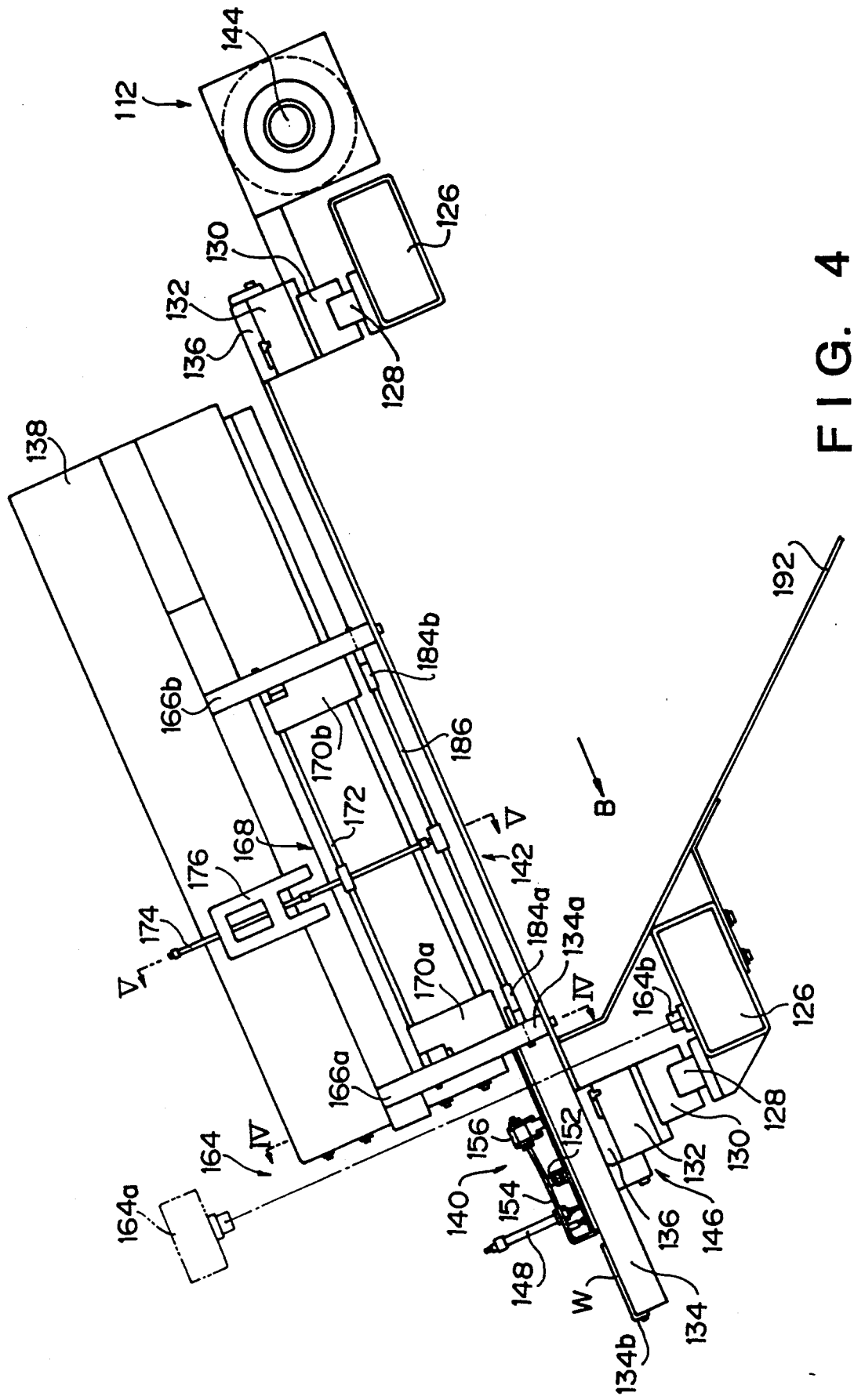
FIG. 4 is a detailed side view showing an arrangement of a parts feed device included in the mounting system shown in FIG. 1.

As shown in FIG. 4, the parts feed device 100 in the mounting system 10 comprises support tables 126 fixed on a base (not shown) and inclined from a horizontal plane by a predetermined angle such that the lower front end is lower than the lower rear end. Each support table 126 extends in the directions of the arrow A. Each guide rail 128 is fixed on the corresponding support table 126 and extends in the directions of arrow A. A slidable member 130 is fitted on the corresponding guide rail 128 to be slidable along the directions of the arrow A and to extend in the directions of arrow A. Reception tables 132 are formed on each slidable member 130 at predetermined intervals along the directions of the arrow A.

Each work feed unit comprises a chute table 134 extending in a direction of an arrow B to be inclined at the predetermined angle, and a pair of front and rear mounting tables 136 detachably locked on the corresponding reception tables 132.

Each work feed unit comprises a cassette 138 located almost at the center of the chute table 134 and having the corresponding sticks stacked on each other, a work separation mechanism 140 for separating works W one by one (the target work is separated from the next target work) after a work is dropped from the lowermost stick S in the cassette 138 in the direction of the arrow B and is dispensed on the chute table 134, and an empty stick discharge mechanism 142 for discharging an empty stick.

With the above arrangement, in each work feed unit, the mounting table 136 is detachably mounted on the reception table 132 and is detached therefrom or attached thereto independently of the support table 126 serving as a fixing portion.

An opening 134a having a size large enough to receive one stick S is formed in an intermediate portion of the chute table 134. The cassette 138 is mounted above the opening 134a.

Figure 5:
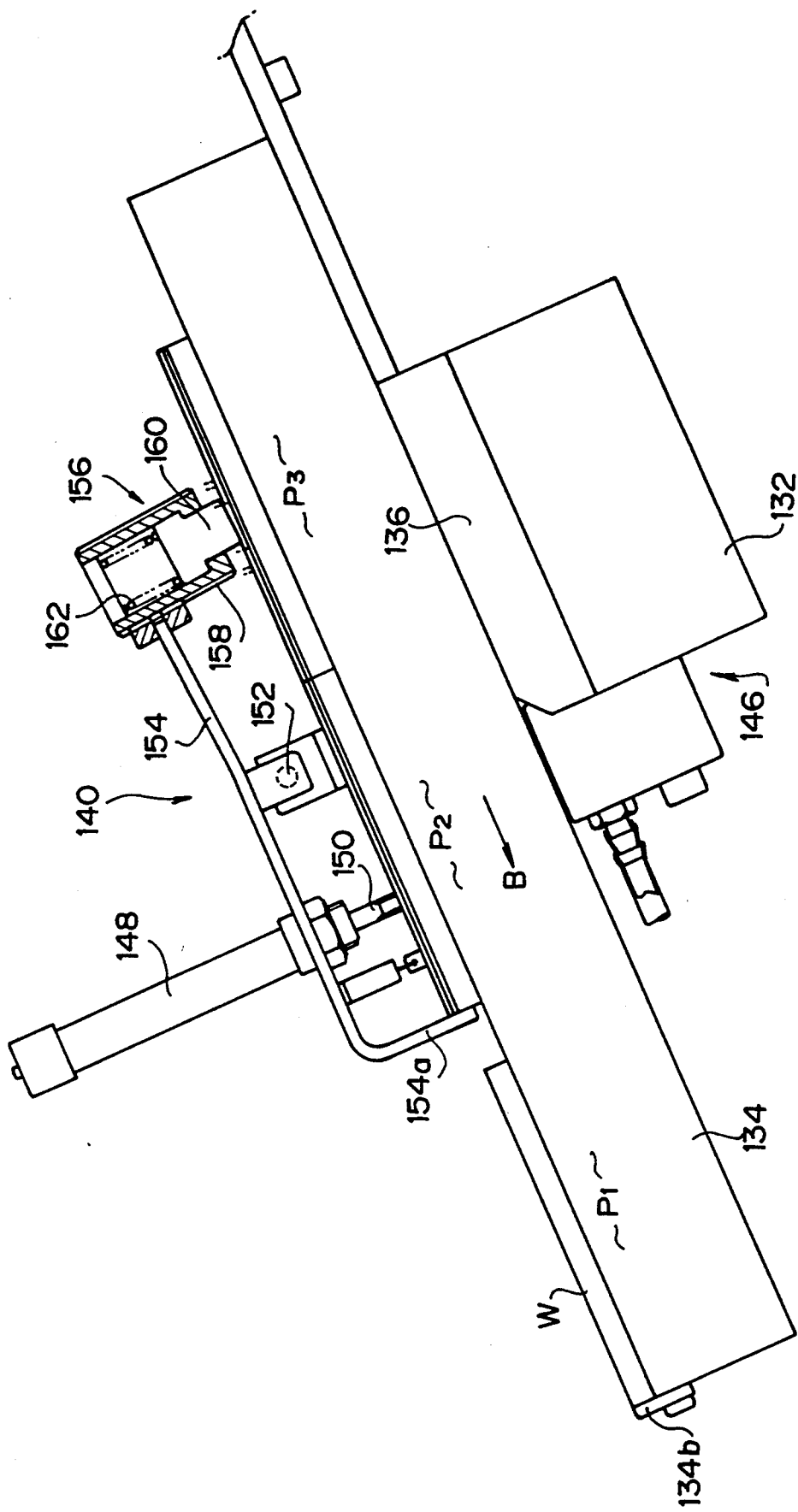
FIG. 5 is a side view showing an arrangement of a separation mechanism included in the parts feed device shown in FIG. 4, FIGS. 6 and 7 are front sectional views of a stick support mechanism and an empty stick discharge mechanism which are arranged in the parts feed mechanism shown in FIG. 4 along the lines IV—IV and V—V in FIG. 4.

The work is dropped and dispensed from the lowermost stick in each work feed cassette 138 along an inclination direction of the chute table 134, as indicated by the arrow B. As shown in FIG. 5, the work then abuts against a stopper 134b formed at the front end portion of the chute table 134 and is stopped and kept at this position. The position where the work abuts against the stopper 134b is defined as a separation position $P_1$ of the work W.

A ball screw 144 constituting the moving mechanism 114 extends along the directions of the arrow A behind the rear slidable members 130 of the pairs of front and rear slidable members 130. The rear slidable members 130 are threadably engaged with the ball screw 144. Upon rotation of the ball screw 144 by a drive motor 145 (FIG. 3), the slidable members 130 threadably engaged with the ball screw 144 (the work feed units being mounted to the slidable members 130 through engagement between the reception tables 132 and the mounting tables 136) are moved along the guide rails 128 in the directions of the arrow A.

The work separation mechanism 140 is arranged on the chute table 134 at a position offset from the cassette 138 in the direction of the arrow B. The work separation mechanism 140 is actuated by air pressure from a pneumatic actuating means and comprises a pneumatic cylinder 148 connected to a solenoid switching valve (not shown) through an air supply mechanism 146.

The pneumatic cylinder 148 comprises a piston rod 150 which extends downward upon supply of air from a pneumatic source (not shown) through a solenoid switching valve to the upper portion of the pneumatic cylinder 148 and which is retracted upward upon supply of the compressed air to the lower portion of the cylinder 148.

The work separation mechanism 140 comprises a swingable stay 154, the central portion of which is rotatably supported about a support shaft 152 with respect to the chute table 134. The lower end of the pneumatic cylinder 148 is mounted at a portion of the swingable stay 154 which extends in the direction of the arrow B while the piston rod extends downward. One end of the swingable stay 154 on the side of the arrow B is bent at a right angle and can be brought into almost contact with the upper surface of the chute table 134 while the piston rod 150 extends downward. A press mechanism 156 for pressing the upper surface of the work W dropping along the chute table 134 and locking the work is mounted at the other end of the swingable stay 154.

As shown in FIG. 5 in detail, the press mechanism 156 comprises a substantially cylindrical housing 158 having a lower open surface and fixed to the other end of the swingable stay 154, a vertically movable press member 160 retractable from the housing 158, and a coil spring 162 for always biasing the press member 160 downward.

The work separation mechanism 140 is arranged as described above. When air is supplied to the pneumatic cylinder 148 and the piston rod 150 is moved downward, the swingable stay 154 is pivoted clockwise about the support shaft 152, as shown in FIG. 5. A lock portion 154a defined at the bent end portion (one end) of the swingable stay 154 is brought into a position spaced apart from the upper surface of the chute table 134. As a result, the work W located at a lock position $P_2$ is released from a state locked by the lock portion and passes below the lock portion 154a. The work W is slipped down to the separation position $P_1$.

In the lock released state, the other end of the swingable stay 154 mounted with the press mechanism 156 is shifted downward to hold the work W slipped down to the standby position P₃ defined immediately behind the lock position P₂, so that the work W is kept stopped.

In this state, when air supply to the pneumatic cylinder 148 is stopped in the work separation mechanisms 140, the piston rod 150 is retracted upward by a biasing force of a return spring (not shown). The swingable stay 154 is pivoted about the support shaft 154 counterclockwise on the basis of the weight of the pneumatic cylinder 148. As a result, the press mechanism 156 does not press the work W located at a standby position $P_3$. Therefore, the work W located at the standby position $P_3$ is slipped down toward the lock position $P_2$.

Upon counterclockwise pivotal movement of the swingable stay 154, the lock portion 154a is shifted downward. As a result, a locked state of the work W by the lock portion 154a is achieved, and the work W slipped down from the standby position $P_3$ is locked at the lock position $P_2$.

Since the work W is slipped down from the standby position $P_3$ to the lock position $P_2$, the next work W located at a work feed position is slipped down from the stick S by its weight and abuts against the trailing end of the work W locked at the lock position $P_2$, so that this next work is held at the standby position $P_3$.

In this manner, only one work W is separated at the separation position $P_1$.

In this manner, a series of separation operations are performed to complete feed of the next work W to the separation position $P_1$.

In each work feed unit, the parts feed device 100 is moved in a direction indicated by the arrow A by the moving mechanism 114 while only one work W is separated and held at the separation position $P_1$. In the work feed unit which stores works W having a desired type, the work W held at the separation position $P_1$ is brought into a pickup position $Q_1$.

As shown in FIG. 4, a detection mechanism 164 is arranged to detect whether the work W is located at the standby position $P_3$ so as to just vertically cross the rear portion of the work W located at the standby position $P_3$. This detection mechanism 164 comprises a photocoupler which comprises a light-emitting element 164a located at an upper position and a light-receiving element 164b located below the light-emitting element to receive light from the light-emitting element 164a. That is, in a state wherein the light-receiving element 164b can receive light from the light-emitting element 164a, the detection mechanism 164 detects that the work W is not located at the standby position $P_3$. In a state wherein light cannot be received from the light-emitting element 164a, the detecting mechanism 164 detects that the work W is present at the standby position $P_3$.

The support structure of the stick S in the cassette 138 and the arrangement of the empty stick discharge mechanism 142 in each work feed unit will be described in detail with reference to FIGS. 4, 6, and 7.

The opening 134a is formed in the range of the chute table 134 located below the cassette 138. Regulation plates 166a, 166b, 166c, and 166d stand upward at four corners of the opening 134a to maintain the vertically stacked sticks S, i.e., to regulate the front and rear sides of the sticks S. Each stick S has a trapezoidal shape when viewed from the front. The right and left ends of the bottom portion of each stick S can be locked from the lower side.

The cassette 138 comprises a stick lock mechanism 168 for releasably locking the sticks $S_2, S_3, \ldots$ except for the lowermost stick, and an empty stick discharge mechanism 142 for locking the lowermost stick $S_1$ and discharging an empty stick below when the lowermost stick $S_1$ becomes empty.

Figure 6:
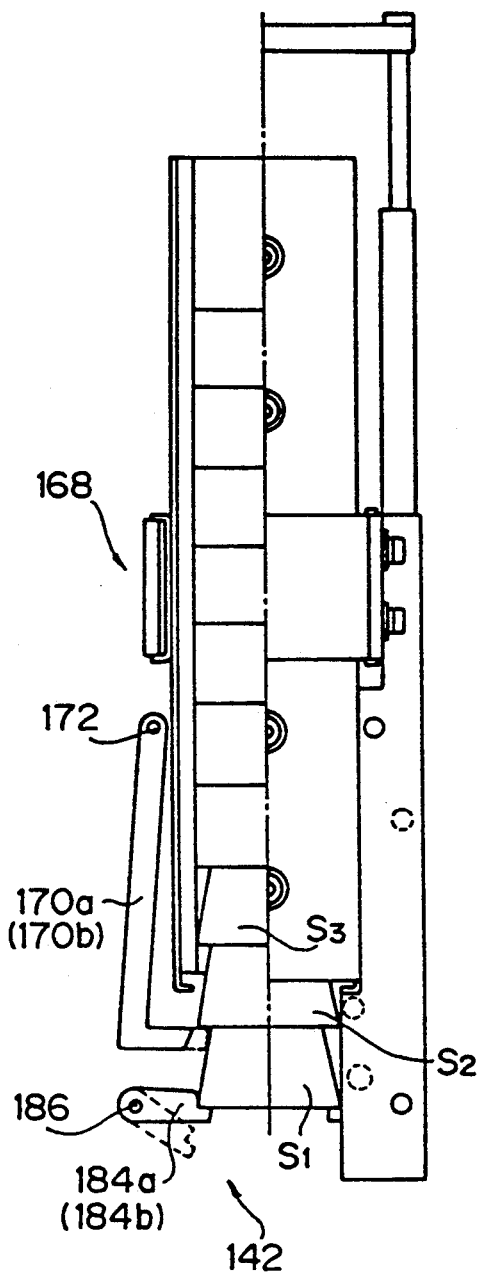
Figure 7:
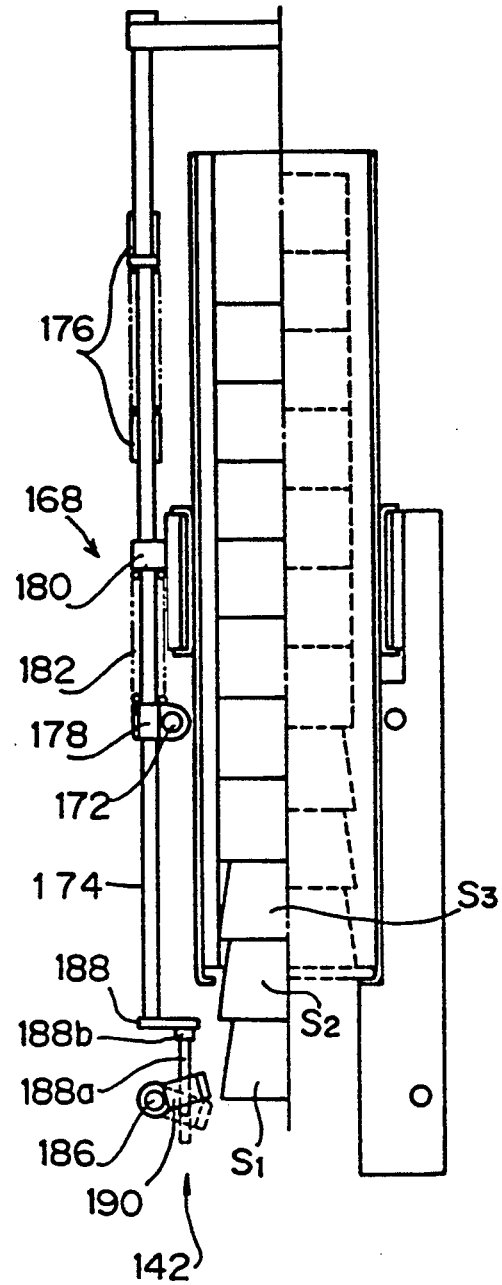

The stick lock mechanism 168 has a shape symmetrical in the right-and-left direction, as shown in FIGS. 6 and 7. In the following description, only the left portion (i.e., the front side in FIG. 4) will be described, and the arrangement of the right portion will be omitted.

The stick lock mechanism 168 comprises substantially L-shaped first lock pieces 170a and 170b to be pivotal about the upper end of the stick lock mechanism 168. The first lock pieces 170a and 170b lock the front and rear bottom portions of the second lowest stick $S_2$ of the sticks vertically stacked in the cassette. That is, as shown in FIG. 6, the front and rear bottom portions of the left side (front side in FIG. 6) of the second lowest stick $S_2$ are locked by the first and second lock pieces 170a and 170b, respectively.

The upper ends of the first lock pieces 170a and 170b are fixed to a common first transmission shaft 172 extending along the direction of the arrow B. Both ends of the first transmission shaft 172 are rotatably supported by the first and second regulation plates 166a and 166b located on the left side.

In order to pivot the first transmission shaft 172, a second transmission shaft 174 is located outside the central portion of the first transmission shaft 172 so as to extend in a direction perpendicular to the first transmission shaft 172. As shown in FIGS. 6 and 7, the second transmission shaft 174 is supported through a shaft guide 176 to be movable in the extension direction. A portion of the second transmission shaft 174 at a position crossing the first transmission shaft 172 is slidably fitted in a connecting member 178 in an axial direction thereof. The distal end of the connecting member 178 is fixed to the first transmission shaft 172. The upper end of the second transmission shaft 174 is connected to a piston rod of a drive cylinder (not shown) and can be vertically moved upon driving of this drive cylinder.

A stopper 180 is formed at a portion of the second transmission shaft 174 between the connecting member 178 and the shaft guide 176. A coil spring 182 is wound around a portion of the second transmission shaft 174 between the stopper 180 and the connecting member 178. That is, when the second transmission shaft 174 is driven to be moved downward, this downward drive force is transmitted to the connecting member 178 through the coil spring 182.

That is, in a state wherein the drive cylinder is not actuated, the second transmission shaft 174 is biased upward by a biasing means (not shown), and the first lock pieces 170a and 170b are set in a state wherein the second lowest stick $S_2$ is not supported. When the drive cylinder is actuated, the second transmission shaft 174 is moved downward, and this downward force is transmitted to the connecting member 178 and the first transmission shaft 172 through the coil spring 182. The first lock pieces 170a and 170b fixed to the first transmission shaft 172 are pivoted inward to support the second lowest stick $S_2$ from the lower side.

The empty stick discharge mechanism 142 pivotally supports second lock pieces 184a and 184b at the outer end of the mechanism 142. The second lock pieces 184a and 184b support the front and lower end portions of the lowermost stick $S_1$. The second lock pieces 184a and 184b are fixed to a common third transmission shaft 186 extending in the direction of the arrow B. Both ends of the third transmission shaft 186 are rotatably supported by the first and second regulation plates 166a and 166b located on the left side.

The lower end of the second transmission shaft 174 is terminated at a position spaced apart from the third transmission shaft 186 by a predetermined distance, while the drive cylinder is kept stopped, as shown in FIG. 7. A press member 188 extending inward is formed integrally with the lower end of the second transmission shaft 174. An outwardly extended driven member 190 for pivoting and driving the third transmission shaft 186 is fixed at a central portion of the third transmission shaft 186 at a position immediately below the second transmission shaft 174 since the drive member 190 is pressed downward by the press member 188. An elongated hole (not shown) extending in the back-and-forth direction is formed in the driven member 190.

A rod 188a which is inserted into the elongated hole from above is fixed on the lower surface of the press member 188. A large-diameter portion 188b having a diameter larger than that of the elongated hole is formed integrally with the upper end portion of the rod 188a.

The third transmission shaft 186 is biased to a position where the second lock pieces 184a and 184b support the lowermost stick $S_1$ by a torsion spring (not shown). As shown in FIG. 4, a discharge chute 192 is located below the opening 134a to guide the empty stick to a trash box (not shown).

The empty stick discharge mechanism 142 is arranged as described above. When the drive cylinder is started to press the second transmission shaft 174 so that the first lock pieces 170a and 170b support the second lowest stick $S_2$ from the lower side, and then to further press the second transmission shaft 174, the large-diameter portion 188b of the press member 188 fixed to the lower end of the second transmission shaft 174 abuts against the driven member 190 of the third transmission shaft 186. The large-diameter portion 188b pushes down the driven member 190 and is pivoted to release a locked state of the lowermost stick $S_1$ from the second lock pieces 184a and 184b. In this manner, the lowermost stick $S_1$ drops downward through the opening 134a as the empty stick and is guided to the trash box through the discharge chute 192.

The second transmission shaft 174 causes the first lock pieces 170a and 170b to pivot inward to lock the second lowest stick $S_2$ from the lower side and is then further pushed down. When a relationship between the second transmission shaft 174 and the connecting member 178 is taken into consideration, after the locking operation of the first lock pieces 170a and 170b is completed, the coil spring 182 simply contracts upon downward movement of the second transmission shaft 174. Movement of the second transmission shaft 174 does not adversely affect the locked state of the first lock pieces 170a and 170b.

After the empty stick S' is discharged as described above, the drive cylinder is operated to lift the second transmission shaft 174. As a result, the second lock pieces 184a and 184b return to a state wherein they can lock the lowermost stick $S_1$. At this time, the lowermost stick $S_1$ has been discharged as the empty stick S', the operation of the second lock pieces 184a and 184b becomes almost a dummy operation.

When the second transmission shaft 174 is further moved upward, the contracting coil spring 182 extends again, so that the connecting member 178 is biased upward. As a result, the first transmission shaft 172 causes the first lock pieces 170a and 170b to pivot outward. In this manner, the locked state of the second lowest stick $S_2$ by means of the first lock pieces 170a and 170b is released. The sticks $S_2$, $S_3$, . . . locked by the first lock pieces 170a and 170b drop and are locked by the second lock pieces 184a and 184b.

The sticks except for the lowermost stick now serve as sticks $S_1$, $S_2$, . . . . . The work W is slid and dispensed along the inclined surface by its own weight.

A series of discharge operations of the empty stick S' and supply of the stick $S_1$ to the lowermost stick are completed.

As described in detail above, in the mounting system 10 of this embodiment, one detection mechanism 164 is arranged to detect the presence/absence of the work W at the standby position $P_3$ to perform both empty detection of the work W in the stick S and discharge (absence) detection in the stick S. In this manner, as compared with a conventional unit wherein two detection mechanisms (sensors) are required, only one detection mechanism need be used to thus greatly reduce the number of detection mechanisms, simplify wirings, and reduce operations such as wiring operations in function switching.

The present invention is not limited to the particular embodiment described above, and various modifications may be made without departing from the spirit and scope of the invention.

For example, in the above embodiment, the discharge chute 192 is fixed to the support table 126 below the pickup position Q1 to discharge the empty stick S' while the work W is being picked up. The present invention, however, is not limited to this arrangement. The discharge chute 192 is fixed to the chute table 134 in each work feed unit to perform a discharge operation of the empty stick S' while the corresponding work feed unit is moved. In the embodiment described above, the empty stick S' must be discharged while the work is stopped at the pickup position $Q_1$. A tact time is undesirably prolonged due to the discharge operation. It is possible to shorten the tact time to discharge the empty stick while the work feed unit is being moved.

In this embodiment described above, the work position detected by the detection mechanism 164 is defined as the standby position $P_3$. However, the present invention is not limited to this arrangement. The detecting mechanism may detect the presence/absence of the work at the look position $P_2$.

Description of Turret Table Device

The arrangement of the turret table device 200 will be described in detail.

Figure 9:
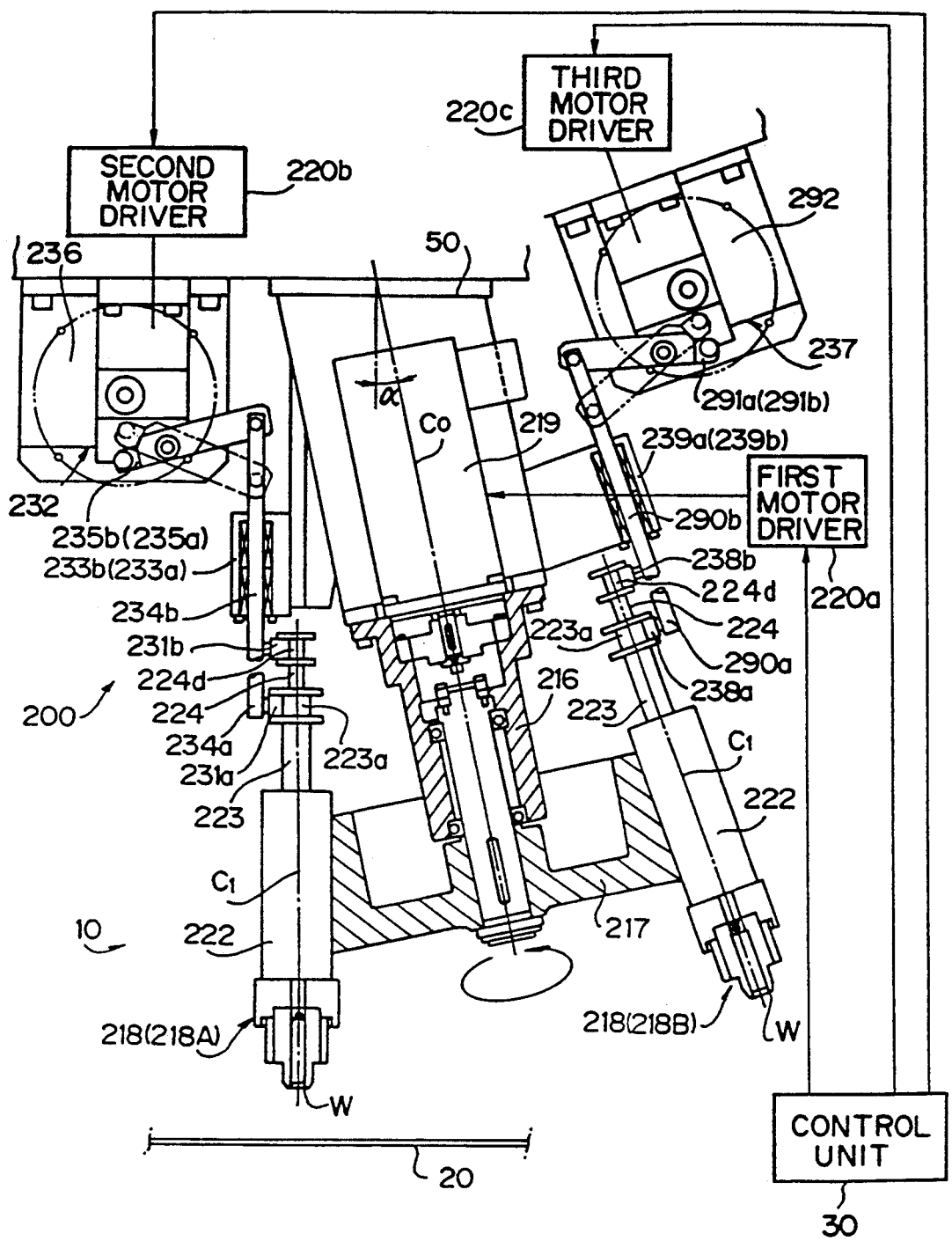
FIG. 9 is a detailed side view of a turret table device included in the mounting system shown in FIG. 1.
Figure 11:
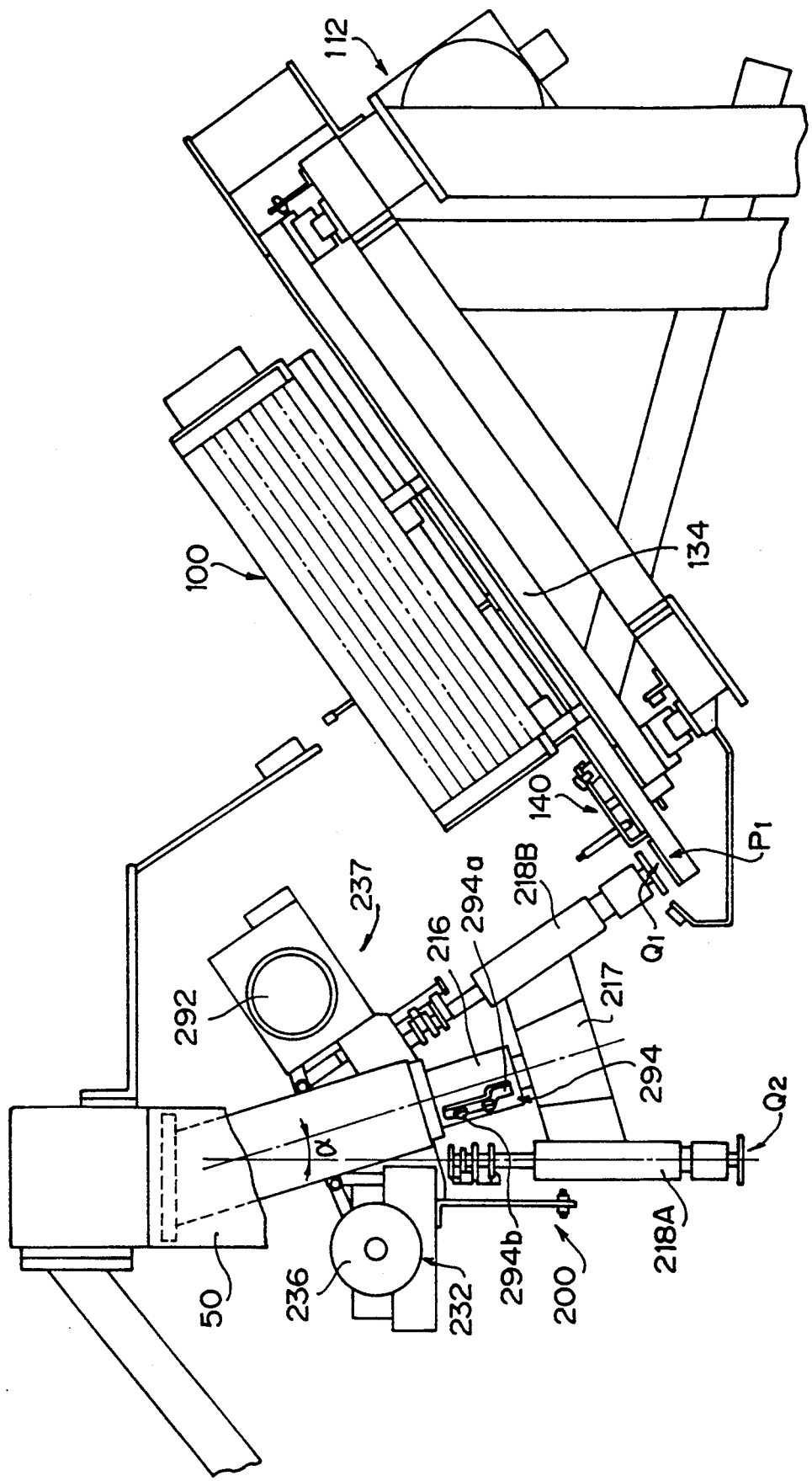
FIG. 11 is a side view showing a positional relationship between the parts feed device and the turret table device.

As shown in FIG. 9, the turret table device 200 comprises a rotation support member 216 mounted through a mounting stay 50 on the base 40 (FIG. 2) located above the printed circuit board 20 to be mounted with works W, a first rotary table (head turret table) 217 rotatably supported about an axis $C_0$ of rotation inclined from a vertical axis by an angle $\alpha$, a plurality of tables mounted on the edge of the first rotary table 217 at equal angular intervals, i.e., ten head units $218_1$ to $218_{10}$ (numbers are assigned to these units as first, second, . . . , tenth units in the clockwise direction) in this embodiment, and a head turret motor 219 for intermittently driving the first rotary table 217 in units of 36° in one rotational direction, e.g., the clockwise direction.

The head units $218_1$ to $218_{10}$ basically have the same structure. A common description is designated with the reference numeral (218) without suffixes. When the individual head units must be explained, the corresponding reference numerals ($218_1$ to $218_{10}$) are used for a description. Further, the suffixes "A" and "B", as shown in the drawings, refer to the insertion and pickup positions, respectively, of the head unit.

The head turret motor 219 is driven and controlled by a control unit 30 through a first motor driver 220a. When a pickup or insertion operation is not performed in a head unit 218 located next (upstream side in the rotational direction, that is, counterclockwise direction) to the insertion direction, the control unit 30 skips the next stop position and is continuously rotated until the head unit 218 subjected to a pickup or insertion operation reaches the pickup or insertion position.

The works W are 20 types of parts having ten different shapes. The work gripper portions of the respective head units $218_1$ to $218_{10}$ are set to correspond to ten different shapes of the works $W_1$ to $W_{10}$, respectively. For example, the work gripper portion of the first head unit $218_1$ can grip only the work $W_1$ having the first shape. The work gripper portion of the second head unit $218_2$ can grip only the work $W_2$ having the second shape. The work gripper portion of each head unit 218 is arbitrarily detachable, i.e., can be replaced with another one.

An axis $C_1$ of center of each head unit 218 is inclined from the axis $C_0$ of rotation of the turret table device 20 by the angle $\alpha$. The central axis $C_1$ of the head unit (denoted by 218A) located at the insertion position extends along the vertical axis. The head unit (denoted by 218B) located at a position opposite (180°) to the head unit 218A is brought into the pickup position in the parts feed device 100 at an inclination angle of $2\alpha$ with respect to the vertical axis.

That is, the pickup surface in the parts feed device 100 is inclined from the horizontal plane by $2\alpha$. The axis of the head unit 218B is perpendicular to the pickup surface at the pickup position. In other words, the head unit 218B performs vertical access with respect to the pickup surface.

As shown in FIG. 10, each head unit 218 comprises a mounting body 222 fixed to the corresponding side surface of the first rotary table 217. The mounting body 222 has a through hole 222a along the central axis, and a hollow cylindrical thick shaft 223 is inserted to be axially movable along the axial direction. A solid thin shaft 224 is movably inserted into the thick shaft 223 along the axial direction.

A hollow cylindrical head body 225 having a lower open end is detachably mounted at the lower end of the thick shaft 223. The lower end of the thin shaft 224 extends above the upper surface of the head body 225 while the thin shaft 224 extends through the head body 225. The thin shaft 224 integrally comprises a large-diameter portion 224a inserted into the thick shaft 223, a tapered portion which is connected to the lower end of the large-diameter portion 224a and the diameter of which is decreased downward, and a small-diameter portion 224c which is connected to the lower end of the tapered portion 224b and the diameter of which is smaller than that of the large-diameter portion 224a.

A detachable ring 226 is detachably threadably engaged with the lower portion of the head body 225. A pair of front and rear mounting pieces 226a and 226b spaced apart from each other in the back-and-forth direction are mounted on both side portions of the detachable ring 226 while the pair of mounting pieces 226a and 226b extend downward. Horizontally extending support shafts 227a and 227b are bridged between the lower ends of the pairs of mounting pieces 226a and 226b. Intermediate portions of gripper pieces 228a and 228b are pivotally supported by the support shafts 227a and 227b on the same vertical plane.

The lower ends of the gripper pieces 228a and 228b are defined as gripper elements $228a_1$ and $228b_1$ for gripping the corresponding work W from both sides. Bent portions $228a_2$ and $228b_2$ bent to oppose each other and extending to the upper portions of the opposing gripper pieces 228a and 228b through the sides of the thin shaft 224 are formed integrally with the upper ends of the gripper pieces 228a and 228b. A coil spring 229 is hooked between the gripper pieces 228a and 228b to bias and separate both upper ends. Rollers 230a and 230b brought into rolling contact with the outer surface portions of the thin shaft 224 are mounted at the distal ends of the bent portions $228a_2$ and $228b_2$ to be pivotal about their axes.

In a pickup or insertion operation to be described later and, especially, in a state in which the work W is to be gripped, the thin shaft 224 extends downward from the head body so that the small-diameter portion 224c thereof is clamped between the rollers 230a and 230b. In a state wherein the work W is released, the thin shaft 224 further extends downward from the head body 225 such that the large-diameter portion 224a is clamped between the rollers 230a and 230b.

In a state wherein the rollers 230a and 230b clamp the small-diameter portion 224c of the thin shaft 224, the gripper elements $228a_1$ and $228b_1$ come close to each other by a distance enough to clamp the corresponding work W from its both sides by the biasing force of the coil spring 229. In the state wherein the thin shaft 224 further extends downward so that the large-diameter portion 224a is clamped between the rollers 230a and 230b, the gripper elements $228a_1$ and $228b_1$ of the gripper pieces 228a and 228b are separated from the work W against the biasing force of the coil spring 229, thereby releasing the gripped state.

In this embodiment, the lower portion of the detachable ring 226 in each head unit 218 is set as a gripper portion having size and shape which conform with those of the corresponding work W. When this detachable ring 226 is removed from the lower end of the corresponding head body 225, the gripper portion can be replaced with another one with respect to the head body 225 so as to cope with a work W having another shape.

Figure 12:
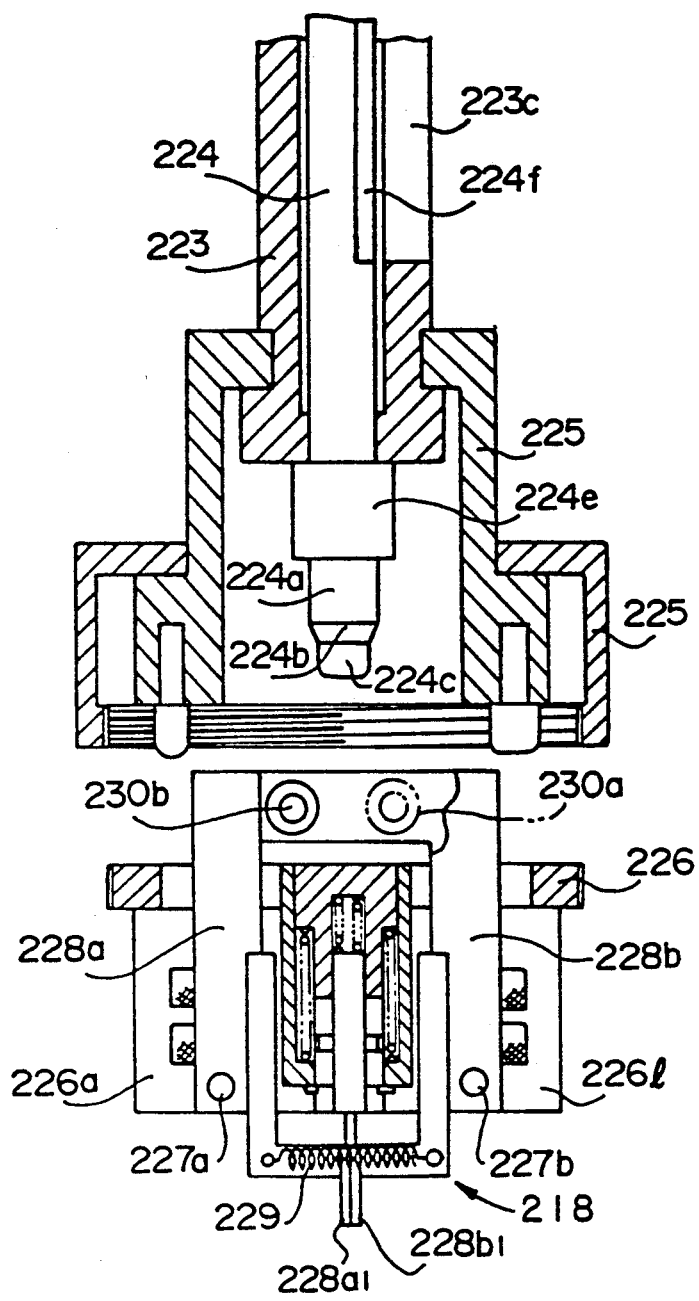
FIG. 12 is a longitudinal sectional view showing a disassembled state of a head body and a gripper portion in the head device shown in FIG. 10.

More specifically, when works W have different shapes, they have different gripper widths, i.e., open widths between the gripper pieces 228a and 228b. In this embodiment, when contact positions of the rollers 230a and 230b on the thin shaft 224 and the length of each of the gripper pieces 228a and 228b are kept unchanged, positions of the support shafts 227a and 227b are arbitrarily changed to change the open widths. In this embodiment, when the work gripper portion constituted by a portion of the head unit 218 of FIG. 10, which is located below the detachable ring 226, is designed to optimally grip a work having a predetermined shape and the first type, although not shown, a head unit 218 shown in FIG. 12 is set to optimally grip a work having a second type and a shape different from that of the work having the first type.

In this embodiment, each head unit 218 comprises the work gripper portion arranged in correspondence with the corresponding work. The mounting position of the work gripper portion is solely determined by the mounting position of the detachable ring 226 on the head body 225. The mounting positions of the detachable rings 226 on the head bodies 225 are the same throughout the head units 218. As a result, according to this embodiment, even if a work gripper portion is replaced with another one, the replaced work gripper portion is automatically positioned by mounting the detachable ring 226 to the head body 225.

Figure 13:
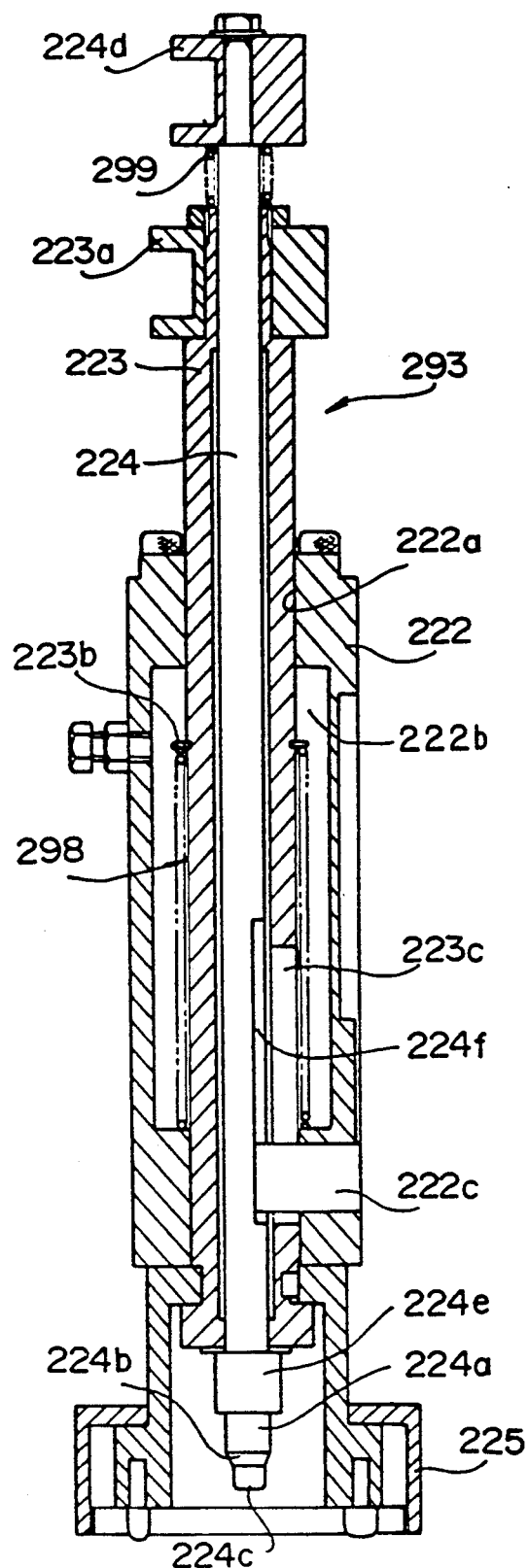
FIG. 13 is a longitudinal sectional view showing an arrangement of an upward biasing mechanism included in the head device shown in FIG. 10.

On the other hand, as shown in FIGS. 9 and 13, a driven portion 223a which is selectively engaged with a thick shaft drive roller 231a or 238a (to be described in detail later) is formed at the upper end of the thick shaft 223 to move the thick shaft 223 downward. The upper end of the thin shaft 224 is terminated at a position above the upper end of the thick shaft 223. A driven portion 224d which is selectively engaged with a thin shaft drive roller 231b or 238b (to be described in detail later) is formed at the upper end of the thin shaft 224 to move the upper end of the thin shaft 224 downward.

As shown in FIG. 9, the insert drive mechanism 232 for executing the insertion operation is arranged adjacent to the head unit 218A pivoted to the insertion portion.

The insertion drive mechanism 232 comprises the thick shaft drive roller 231a and the thin shaft drive roller 231b which are respectively engaged with the driven portions 223a and 224d formed on the thick and thin shafts 223 and 224 of the head unit 218A located at the insertion position, and connecting rods 234a and 234b respectively mounted on the lower ends of the thick shaft drive roller 231a and the thin shaft drive roller 231b and vertically movably supported through support members 233a and 233b.

Insertion drive cam mechanisms 235a and 235b are respectively connected to the two connecting rods 234a and 234b. These drive cam mechanisms 235a and 235b are arranged as follows. Upon one revolution (360°) of a cam member (not shown), the gripper portion of the head unit 218A with the work W being gripped is moved downward along the vertical axis (i.e., without changing a relative distance between the connecting rods 234a and 234b). After the work W is inserted into the printed circuit board 20, only the thin shaft 224 is moved downward to release a gripped state. Thereafter, the head unit 218 is slightly moved upward as a whole, and only the thin shaft 224 is moved upward to restore the gripped state, thereby moving the entire structure to the upper standby position.

The drive cam mechanisms 235a and 235b are synchronously driven by a common insertion head insertion motor 236. The head insertion motor 236 comprises a reversible motor. Upon counterclockwise rotation of the motor 236, the insertion operation is performed. Upon clockwise rotation of the motor 236, the drive cam mechanisms 235a and 235b restore the standby state. The head insertion motor 236 is driven and controlled by the control unit 30 through a second motor driver 220b. The control unit 30 performs one insertion cycle upon simultaneous rotation of the drive cam mechanisms 235a and 235b by one revolution each, and this operation will be described in detail later.

Since the insertion drive mechanism 232 is arranged as described above, the head unit 218A rotated to the insertion position can insert the gripped work W into the printed circuit board 20.

A pickup drive mechanism 237 for performing the pickup operation is arranged adjacent to the head unit 218B only in the head unit 218 rotated to the pickup position.

The pickup drive mechanism 237 comprises the thick shaft drive roller 238a and the thin shaft drive roller 238b respectively engaged with the driven portions 223a and 224d formed on the thick and thin shafts 223 and 224 of the head unit 218B located at the pickup position, and connecting rods 290a and 290b respectively mounted at the lower ends of the thick shaft drive roller 238a and the thin shaft drive roller 238b and vertically supported through the support members 239a and 239b.

Cam mechanisms 291a and 291b are respectively connected to the connecting rods 290a and 290b. The drive cam mechanisms 291a and 291b are arranged as follows. Upon one revolution (360°) of a cam member (not shown), the gripper portion of the head unit 218B which releases the work is moved downward through the connecting rods 290a and 209b along an axis inclined from the vertical axis by the angle 2α (i.e., without changing a relative distance between the connecting rods 290a and 290b). The drive cam mechanisms 291a and 291b assist in causing the work W from the parts feed device 100 to be gripped and picked up and moved upward to the upper standby position as a whole while the gripped state is kept maintained.

The drive cam mechanisms 291a and 291b are synchronously driven by a common pickup head pickup motor 292. The head pickup motor 292 comprises a reversible motor. Upon clockwise rotation of the motor 292, the pickup operation is performed. However, upon counterclockwise rotation of the motor 292, the drive cam mechanisms 291a and 291b restore the standby state. The head pickup motor 292 is driven and controlled by the control unit 30 through a third motor driver 220c. Although the control unit 30 will be described in detail later, it performs one pickup cycle upon simultaneous rotation of the drive cam mechanisms 291a and 291b by one revolution each.

Since the pickup drive mechanism 238 is arranged as described above, the head unit 218B rotated to the pickup position can cause this pickup drive mechanism 237 to pickup the work W from the parts feed device 100.

The thick shaft 223 and the thin shaft 224 in each head unit 218 can be elastically biased to the upper standby position by an upward biasing mechanism 293, as shown in FIG. 13.

The arrangement of the upward biasing mechanism 293 will be described with reference to FIG. 13.

As shown in FIG. 13, a recess 222b is formed in an inner circumferential surface defining the through hole 222a of the mounting body 222 along the entire axial direction except for the lower portion. A stopper ring 223b is mounted on the outer circumferential surface of portion of the thick shaft 223 located within the recess 222b. A first coil spring 298 is hooked between the bottom surface of the recess 222b and the lower surface of the stopper ring 223b. The first coil spring 298 biases the thick shaft 223 upward through he stopper ring 223b. The thick shaft 223 is biased upward by the biasing force of the first coil spring 298. The upper limit position of the thick shaft is defined by a state wherein the upper surface of the head body 225 connected to the lower surface of the mounting body 222 abuts against the lower surface of the mounting body 222. At this upper limit position, the upper standby position of the thick shaft 223 is defined.

On the other hand, a second coil spring 299 is inserted between the lower surface of the driven portion 224d formed on the upper surface of the thin shaft 224 and the upper surface of the driven portion 223a formed on the upper surface of the thick shaft 223. The second coil spring 299 biases the thin shaft 224 upward. The thin shaft 224 is further biased upward from the thick shaft 223 by the second coil spring 229. The upper limit position of the thin shaft 224 is defined by a state wherein the upper surface of a stepped portion 224e defined at the lower portion of the thin shaft 224 abuts against the lower end face of the thick shaft 223. That is, at this upper limit position, the upper standby position of the thin shaft 224 elastically held is defined.

A rotation preventive through groove 223c is formed around the outer circumferential surface of the thick shaft 223 to extend in the direction of thickness of the thick shaft 223 and extending along the axial direction. A rotation preventive blind groove 224f is formed around the outer surface of the thin shaft so as to extend in the axial direction. The lock pin 222c is mounted on the mounting body 222 while the lock pin 222c is inserted into the through groove 223c and the blind groove 224f. Upon such fitting of the lock pin 222c, the circumferential movement of the thick and thin shafts 223 and 224 with respect to the mounting body 222 is inhibited, i.e., the rotation preventive state can be maintained.

Since the thick and thin shafts 223 and 224 are always biased upward by the upward biasing mechanism 293, all the head units 218 in the turret table device 200 are rotated by the head turret motor 219 while the thick and thin shafts 223 and 224 are held at the upper standby positions. Upon rotation of the head turret motor 219, the head units 218A and 218B brought into the insertion and the pickup positions are engaged with the corresponding insertion drive mechanisms 232 and the corresponding pickup drive mechanisms 237 to perform the insertion and pickup operations.

In the head unit 218 brought into the insertion or pickup position upon rotation (36°) of the head turret motor 219, the detection mechanisms 294 and 295 are arranged to detect whether the thick and thin shafts 223 and 224 are located at the upper standby positions, respectively.

Figure 14:
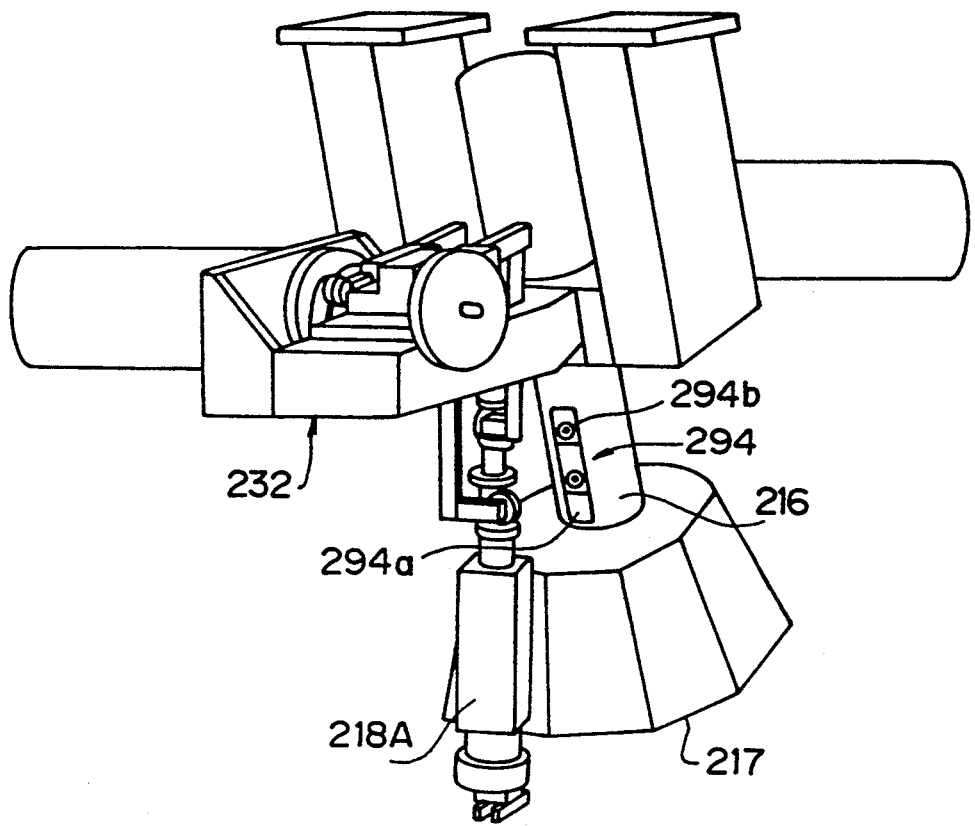
FIG. 14 is a perspective view showing an arrangement of a detection mechanism included in the turret table device shown in FIG. 10.

As shown in FIG. 14, the detection mechanisms 294 and 295 respectively comprise a pair of support stays 294a and 295a arranged on the side surface of the rotation support member 216 fixed on the mounting stay 50 at positions angularly shifted from the insertion and pickup positions by 36° in the rotational direction of the first rotary table 217, and proximity sensors 294b and 295b, mounted on the support stays 294a and 295a, for detecting the drive portion 223a of the thick shaft 223 connected to the head unit 225 located at the upper standby position.

Figure 8:
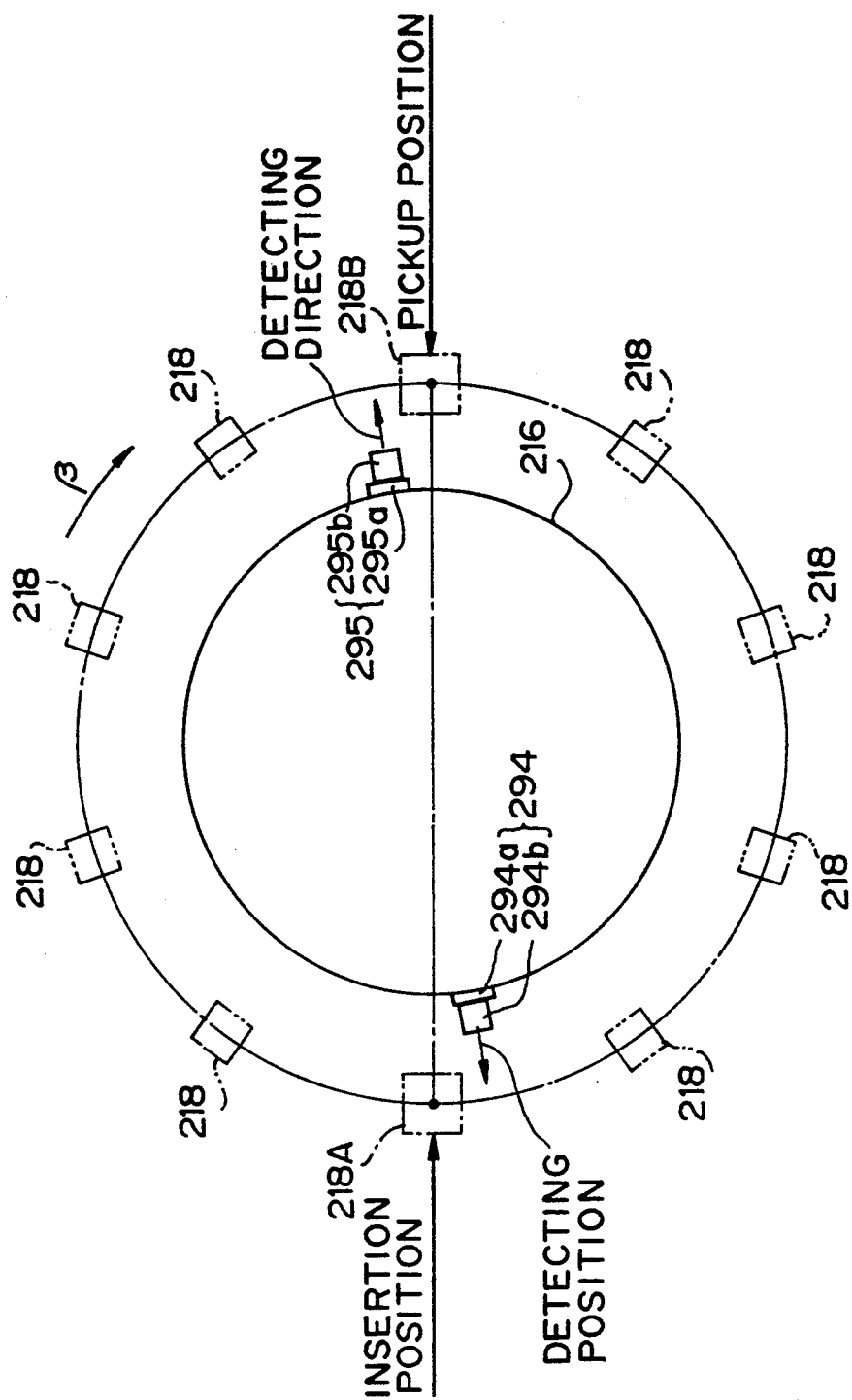
FIG. 8 is a view for explaining positions of sensors for detecting abnormality in the pickup and insertion operations of the head device in a turret table device included in the mounting system shown in FIG. 1.

For illustrative convenience, the detection mechanism 295 located on the side surface of the first rotary table 217 at a position shifted by 36° toward the upstream side of the head unit 218B located at the pickup position along the rotational direction of the first rotary table 217 is not illustrated in FIG. 14. The detection mechanism 295 is schematically illustrated in FIG. 8.

In the standby state of the drive cam mechanisms 235a and 235b in the insertion drive mechanism 232, an insertion cam detection mechanism 296 detects that a corresponding cam member (not shown) returns to the zero position, in other words, that the connecting rods 234a and 234b vertically driven by this cam member are located at the uppermost positions. Similarly, in a standby state of the drive cam mechanisms 291a and 291b in the pickup drive mechanism 237, an insertion cam detection mechanism 297 detects that a corresponding cam member (not shown) returns to the zero position, in other words, that the connecting rods 290a and 290b vertically driven by this cam member are located at the uppermost positions.

In this case, although the cam members in the insertion and pickup drive mechanisms 232 and 237 are not illustrated, they are constructed in the same manner as in cam members 381a and 381b in a clinch drive mechanism 371 (to be described in detail later). A description will be made by using the arrangement of the clinch drive mechanism 371 shown in FIG. 23. The detection mechanisms 296 and 297 respectively comprise detection dogs 296a and 297a extending on outer surfaces of the cam members (381a and 381b), and proximity sensors 296a and 296b (FIG. 26A) for detecting presence of the corresponding dogs when the cam members are located at the zero positions. In this case, the insertion drive mechanism 232 includes two proximity sensors 296b. The insertion detection mechanism 296 detects that the insertion drive rollers 231a and 231b are located at the uppermost positions only when both the sensors 296b detect the corresponding dog 296a. Only when both the drive rollers 231a and 231b are located at the uppermost positions does the detection mechanism 296 detect that the insertion drive mechanism 232 is located at the uppermost position. This can also be true in the pickup detection mechanism 297.

This embodiment includes the detection mechanisms 294, 295, 296, and 297. When the head unit 218 is rotated immediately before the insertion or pickup position, the detection mechanisms 294 and 295 properly detect if the thick and thin shafts 223 and 224 are located at the upper standby positions, respectively. At the same time, the detection mechanisms 296 and 297 properly detect if the insertion drive rollers 231a and 231b or the pickup drive rollers 238a and 238b are located at the uppermost positions. When it is detected that the thick-and thin shafts 223 and 224 are located at the upper standby positions and that all the drive rollers 231a, 231b, 238a, and 238b are located at the uppermost positions, the head turret motor 219 is driven. The head unit 218 is pivoted to the insertion or pickup position only when the thick and thin shafts 223 and 224 are detected to be located at the upper standby positions.

Suppose the coil spring of the upward biasing mechanism 293 has failed due to some reason, and the thick and thin shafts 223 and 224 cannot return to the upper standby positions. In such a case, in the head unit 218 located at an angular position except for the insertion or pickup position, when the thick and thin shafts 223 and 224 are located at positions slightly lower than the upper standby positions, and the head unit 218 having the thick and thin shafts 223 and 224 moved downward to the positions except for the upper standby positions is rotated immediately before the insertion or pickup position, the detection mechanisms 294 and 295 detect that the thick and thin shafts 223 and 224 are not located at the upper standby positions. The control unit 30 stops driving the head turret motor 219, and at the same time an abnormal operation state is signaled to an operator.

In this embodiment, since the detection mechanisms 294, 295, 296, and 297 are provided, even if the thick and thin shafts 223 and 224 are not located at the upper standby positions, i.e., they are lowered from the upper standby positions, or the insertion drive rollers 231a and 231b or the pickup drive rollers 238a and 238b are not located at the uppermost positions, an operation failure can be properly prevented. Pivotal movement of the head unit 218 to the insertion or pickup position can be prevented while the thick and thin shafts 223 and 224 are lowered from the upper standby positions or the insertion drive rollers 231a and 231b or the pickup drive rollers 238a and 238b are lowered from the lower positions.

In other words, when the head unit 218 is pivoted to the insertion or pickup position while the thick and thin shafts 223 and 224 are lowered from the upper standby positions or the insertion drive rollers 231a and 231b or the pickup drive rollers 238a and 238b are lowered from the uppermost positions, e.g., when the thick and thin shafts 223 and 224 are lowered to the lowermost positions, the gripper pieces 228a and 228b located at the lower end of the thick shaft 223 collide with the printed circuit board 20 or the parts feed surface of the parts feed device 100, thereby damaging the head unit 218. Even if a descending amount is small, the drive portion 223a of the thick shaft 223 and the drive portion 224d of the thin shaft 224 of the head unit 218 do not engage with the thick and thin shaft drive rollers 231a and 231b of the insertion drive mechanism 232, or the thick shaft drive roller 231a of the pickup drive mechanism 237 does not engage with the thin shaft drive roller 231b.

In this embodiment, however, since the detection mechanisms 294, 295, 296, and 297 described above are provided, when the thick and thin shafts 223 and 224 are not located at the upper standby positions, or the insertion drive rollers 231a and 231b or the pickup drive rollers 238a and 238b are not located at the uppermost positions, an abnormal state is immediately discriminated regardless of the magnitude of the descending amount. All the drive motors are immediately stopped, and an alarm operation is executed. In this manner, damage to the head units 218 and the dummy insertion and pickup operations can be accurately prevented.

Description of Clinch Device

An arrangement of the clinch device 300 will be described in detail with reference to FIGS. 15 to 27E.

As shown in FIG. 15, the clinch device 300 comprises a second rotation support member 341 mounted through a second mounting stay 340 on a second base (not shown) located below the printed circuit board 20 to be mounted with works W, a second rotary table (clinch turret table) 342 rotatably supported on the second rotation support member 341 about an axis $C_2$ of rotation extending along the vertical axis, a plurality of tables mounted on the edge of the second rotary table 342 at equal angular intervals, i.e., ten clinch units $343_1$ to $343_m$ (the numbers are assigned from the first, second, ..., tenth units clockwise like the head units 218), and a clinch turret motor 344, synchronized with the first drive motor 219, for intermittently driving the second rotary table 342 in units of 36° in one direction, i.e., the counterclockwise direction.

The clinch units $343_1$ to $343_{10}$ basically have the same construction. A description associated with the common parts is designated by a reference numeral without any suffix, and a description associated with the individual clinch units is designated by reference numerals with suffixes. The first to tenth clinch units $343_1$ to $343_{10}$ correspond to the first head units $218_1$ to $218_{10}$, and are arranged to clinch the works $W_1$ to $W_{10}$ having the first to tenth types, respectively. A clinch unit located at the clinch position is denoted by reference numeral 343A.

Each work W comprises a work body Wa and a plurality of lead wires Wb extending sideways from both side surfaces of the work body Wa and bent downward. Of these lead wires Wb, lead wires located at the four corners are designated as $Wb_1$, $Wb_2$, $Wb_3$, and $Wb_4$ to be clinched b the clinch device 300.

The clinch turret motor 344 is driven and controlled by the control unit 30 through a fourth motor driver 220d. The control unit 30 drives and controls the clinch turret motor 344 through a fourth motor driver 220d so that the corresponding clinch unit 343 is always located at a clinch position vertically aligned with the insertion position.

An arrangement of each clinch unit 343 will be described in detail with reference to FIGS. 16A to 27E.

Figure 16A:
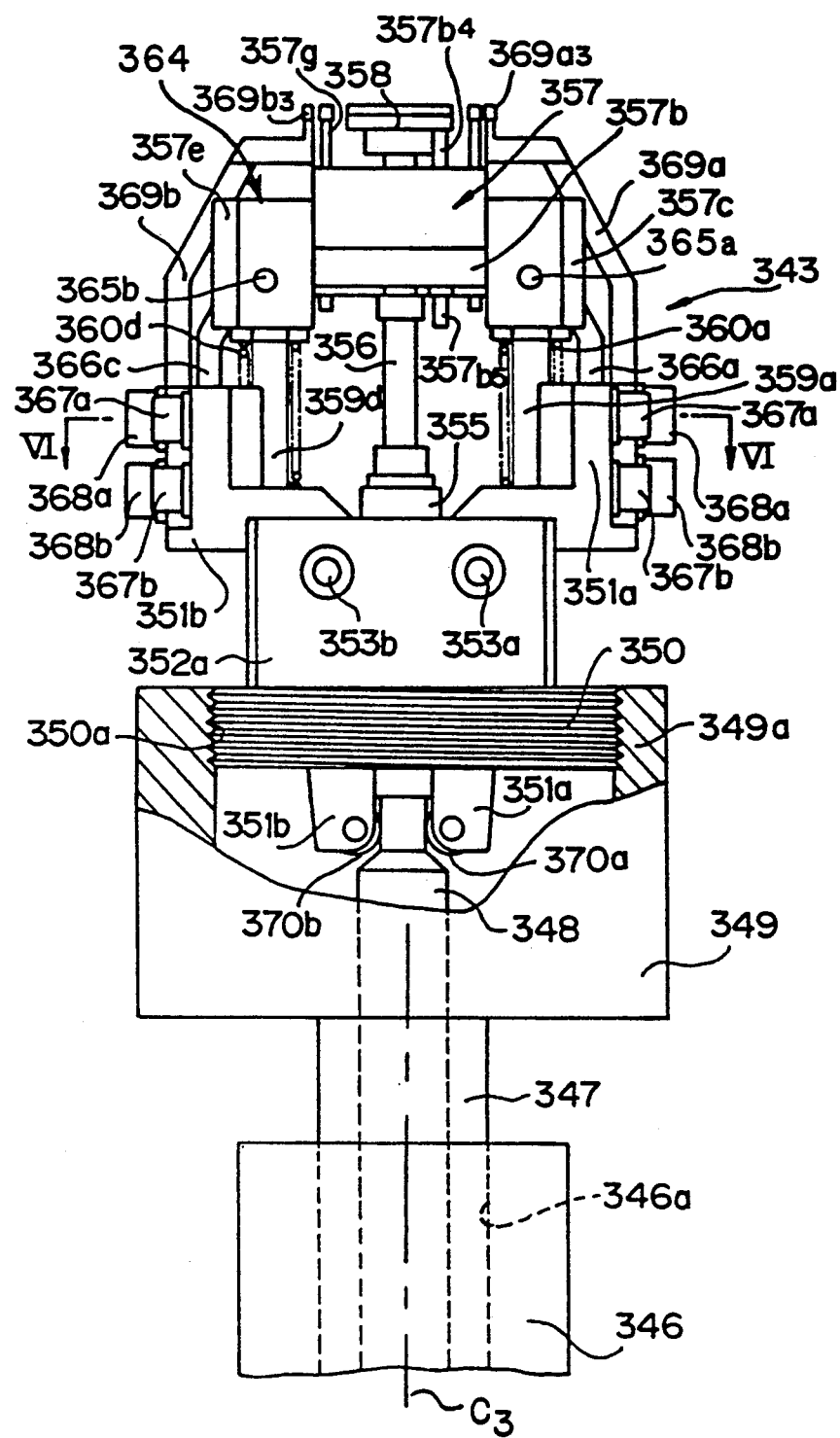
FIGS. 16A, 16B, and 16C are a front view, a plan view, and a side view, respectively, showing an outer appearance of a clinch mechanism.
Figure 16B:
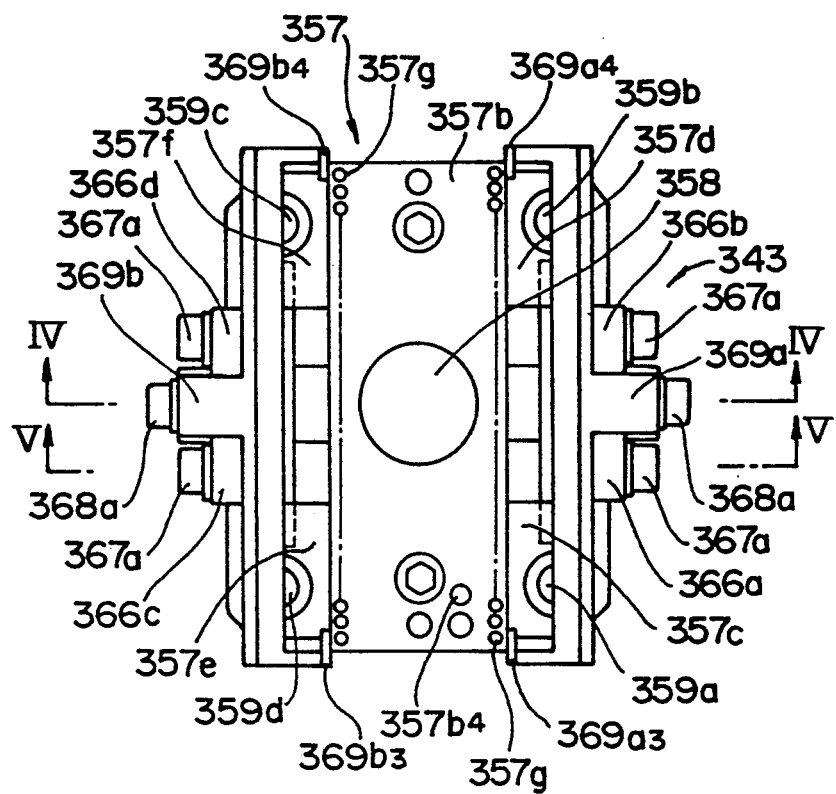

The clinch unit 343 has a second mounting body 346 fixed at the corresponding side surface of the second rotary table 342. As shown in FIG. 16A, a through hole 346a is formed in the second mounting body 346 along an axis $C_3$ of movement parallel to the vertical axis. A hollow cylindrical third thick shaft 347 is movably inserted into the through hole 346a along the axis $C_3$. A solid third thin shaft 348 is movably inserted into the third thick shaft 347 along the axis $C_3$.

As shown in FIG. 16A, a hollow cylindrical clinch body 349 having both ends open is fixed at the upper portion of the third thick shaft 347. An internal thread 349a is formed on the inner circumferential surface of an open portion of the upper end face of the clinch body 349. An annular detachable base 350 is detachably mounted in the upper end opening of the clinch body 349. That is, the detachable base 350 has an external thread 350a threadably engaged with the internal thread 349a of the clinch body 349. A through third thin shaft 348 and the lower ends of a pair of press member mounting members 351a and 351b (to be described later) are inserted is formed at the central portion of the annular detachable base 350.

Figure 17:
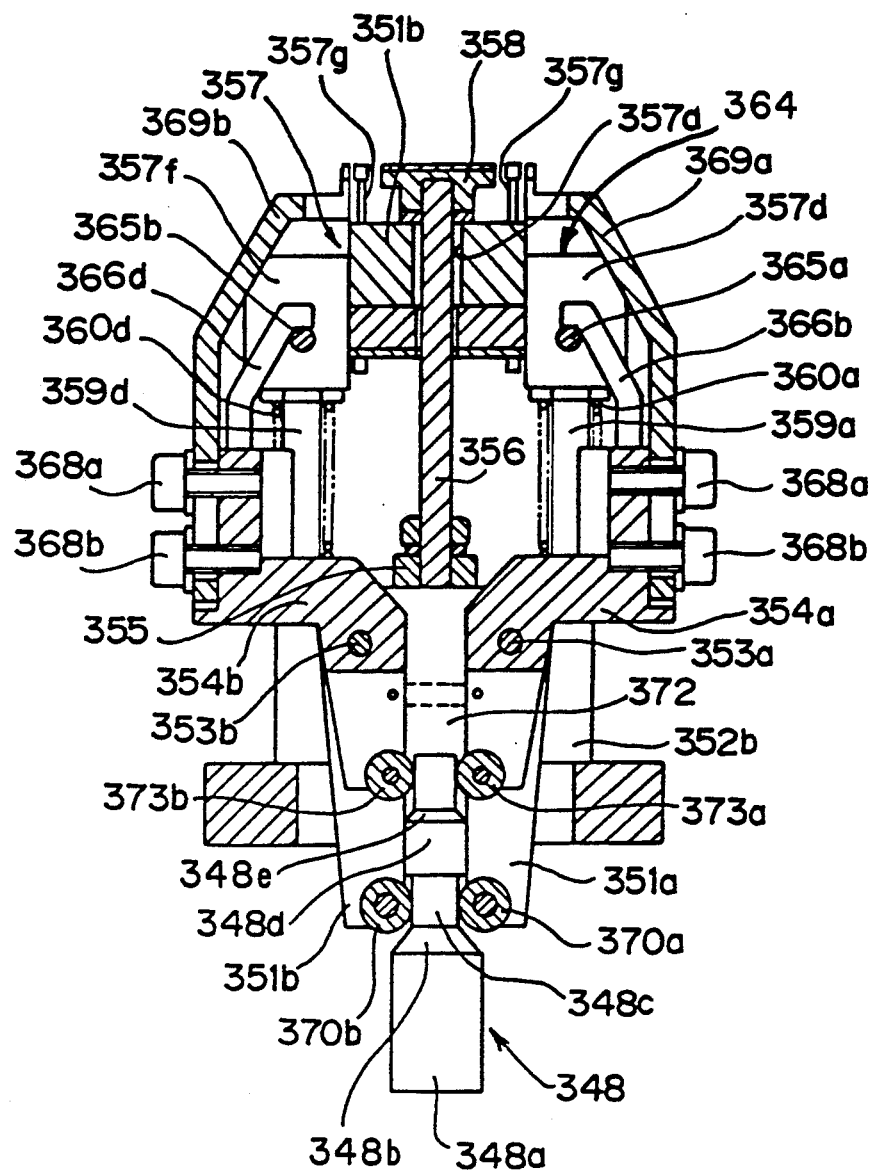
FIG. 17 is a longitudinal sectional view showing the clinch mechanism along the line IV—IV shown in FIG. 16B.
Figure 18:
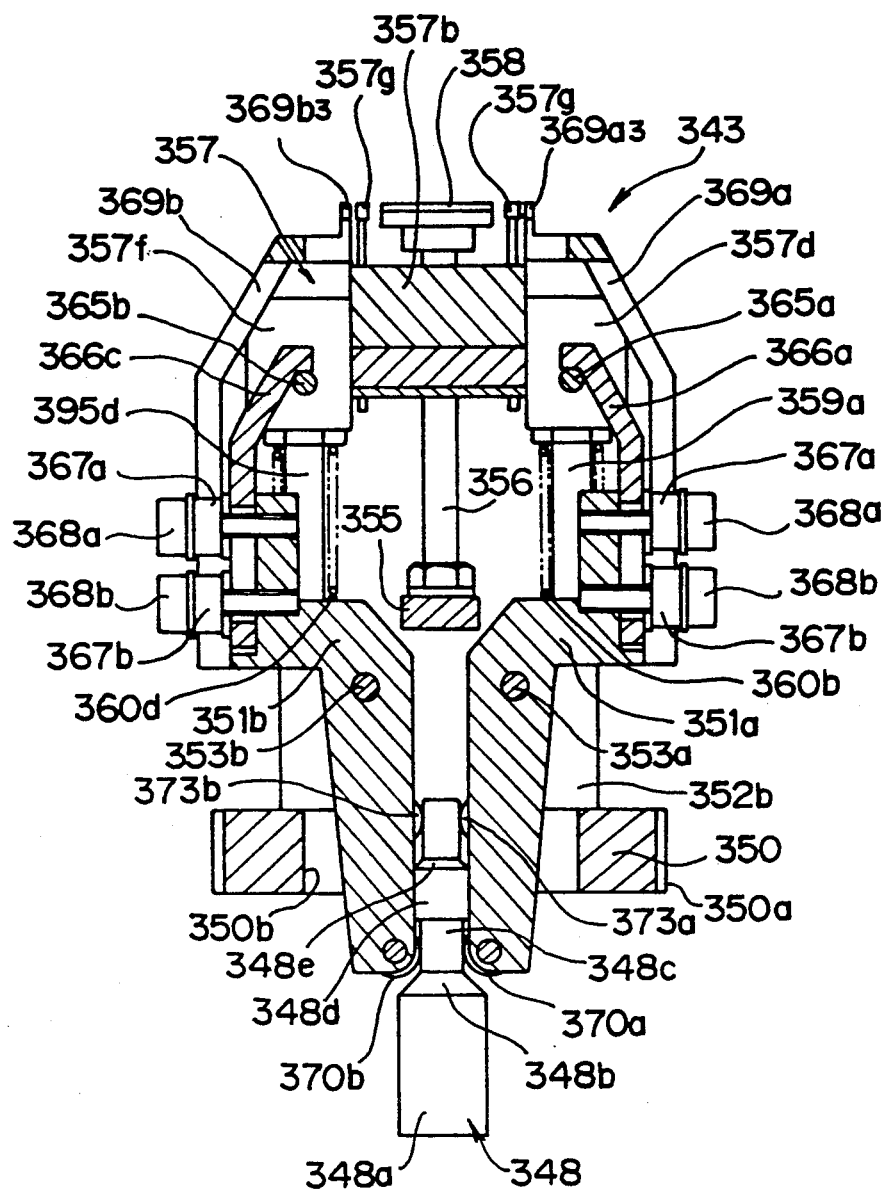
FIG. 18 is a longitudinal sectional view of the clinch mechanism along the line V—V shown in FIG. 16B.

The upper end of the third thin shaft 348 extends upward from the detachable base 350 through the through hole 350b. As shown in FIGS. 17 and 18, the third thin shaft 348 comprises a large-diameter portion 348a extending through the third thick shaft 347, a first tapered portion 348b connected to the upper end of the large-diameter portion 348a and having a first tapered surface whose diameter is reduced in an upward direction, a first small-diameter portion 348c connected to the upper end of the first tapered portion 348b and having a diameter smaller than that of the large-diameter portion 348a, a second small-diameter portion 348d formed at an intermediate portion of the first small-diameter portion 348c and having a diameter larger than that of the first small-diameter portion and smaller than that of the large-diameter portion 348a, and a second tapered portion 348e formed at the upper end of the second small-diameter portion 348d and having a second tapered surface which has the same state as that of the first tapered portion.

Figure 16C:
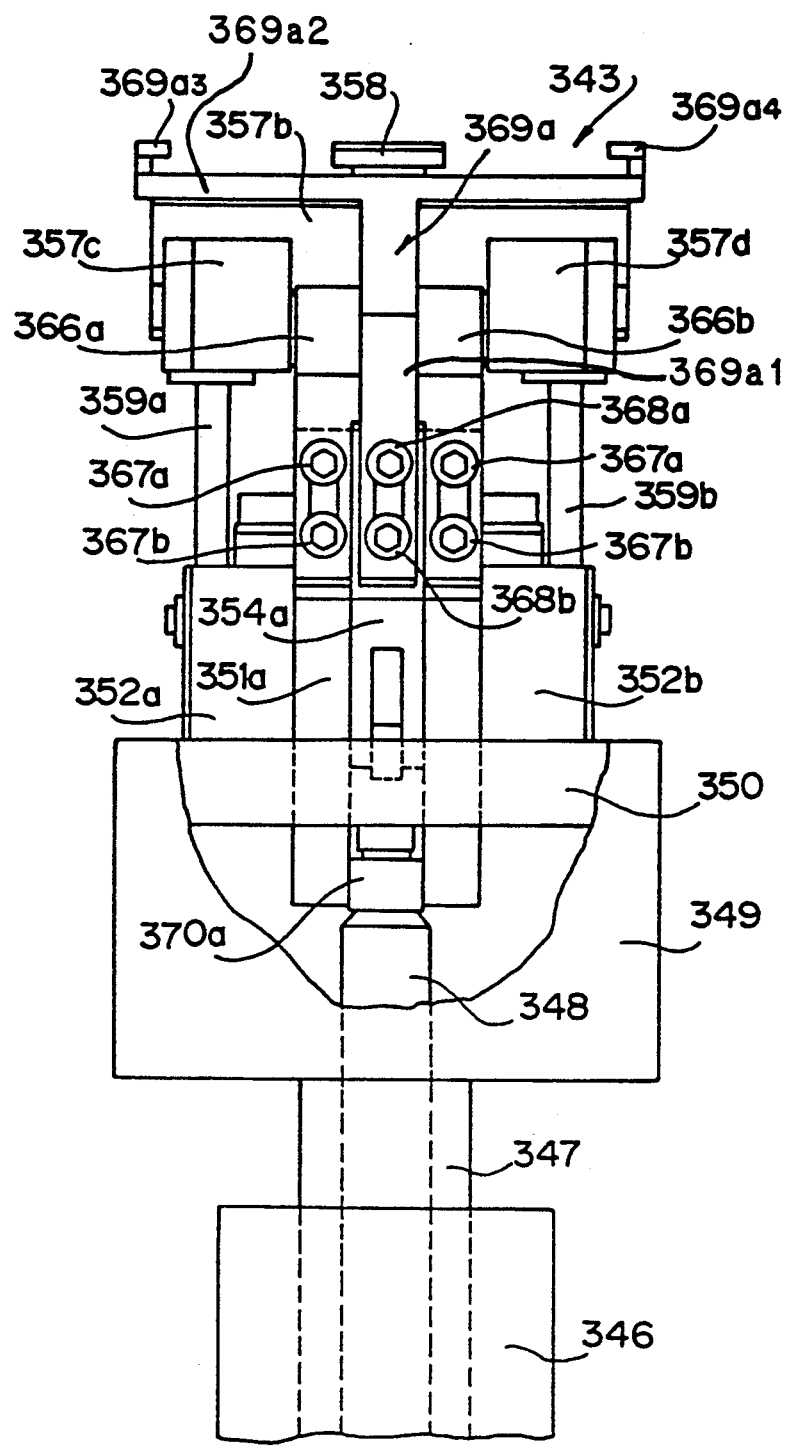

As shown in FIG. 16C, a pair of support blocks 352a and 352b extend upward on the upper surface of the detachable base 350 so as to interpose the through hole 350b therebetween. A pair of parallel rotation support shafts 353a and 353b are bridged on the support blocks 352a and 352b so as to have the same level.

The intermediate portions of the press member mounting members 351a and 351b are pivotally supported about the rotation support shafts 353a and 353b, as shown in FIG. 18. At the same time, the intermediate portions of clinch member mounting members 354a and 354b are pivotally supported about the rotation support shafts 353a and 353b, as shown in FIG. 17. That is, in this embodiment, the rotation support shafts 353a and 353b serve as common support shafts for the press member mounting members 351a and 351b and the clinch member mounting members 354a and 354b.

Figure 19:
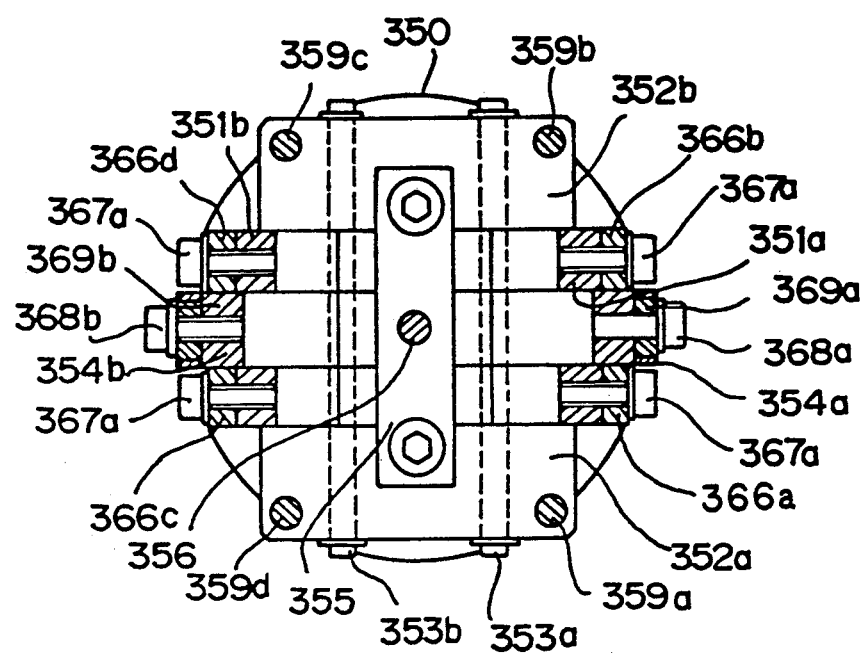
FIG. 19 is a cross-sectional view showing the clinch mechanism along the line VI—VI in FIG. 16A.

As shown in FIG. 19, a connecting member 355 is bridged across the pair of support blocks 352a and 352b and extends along the horizontally central lines of the support blocks 352a and 352b. A first guide rod 356 is fixed at the center of the connecting member 355 to extend upward along the vertical axis, i.e., the axis $S_3$ of movement. The upper portion of the first guide rod 356 is extracted upward through a through hole 357a (FIG. 17) vertically extending at the center of a detection unit 357. A support member 358 having a substantially circular planar shape is integrally formed with the upper end of the first guide rod 356 to support the lower surface of a portion of the printed circuit board 20 at a position where the work W is inserted from above.

The detection unit 357 is guided and supported to be vertically movable through four secondary guide rods 359a to 359d. The detection unit 357 comprises a substantially rectangular parallelepiped detection body 357b located at the central portion and guided by the first guide rod, and guide blocks 357c to 357f integrally formed with the detection body 357b at four positions on both sides near both the ends of the detection body 357b.

The second guide rods 359a to 359d are fixed to extend upward from both ends of the pair of support blocks 352a and 352b. The upper ends of the second guide rods 359a to 359d extend through holes (not shown) formed in the guide blocks 357c to 357f, respectively. As described above, the detection unit 357 is vertically guided and supported by the second guide rods 359a to 359d.

Coil springs 360a to 360d are arranged between the support blocks 352a and 352b and the corresponding guide blocks 357c to 357f of the second guide rods 359a and 359b. The detection unit 357 is always biased upward by the coil springs 360a to 360d. As shown in FIG. 17, press members 366a and 366b and press members 366c and 366d are brought into contact with the lower ends of lock rods 365a and 365b, thereby regulating the upper positions of the press members.

Figure 20:
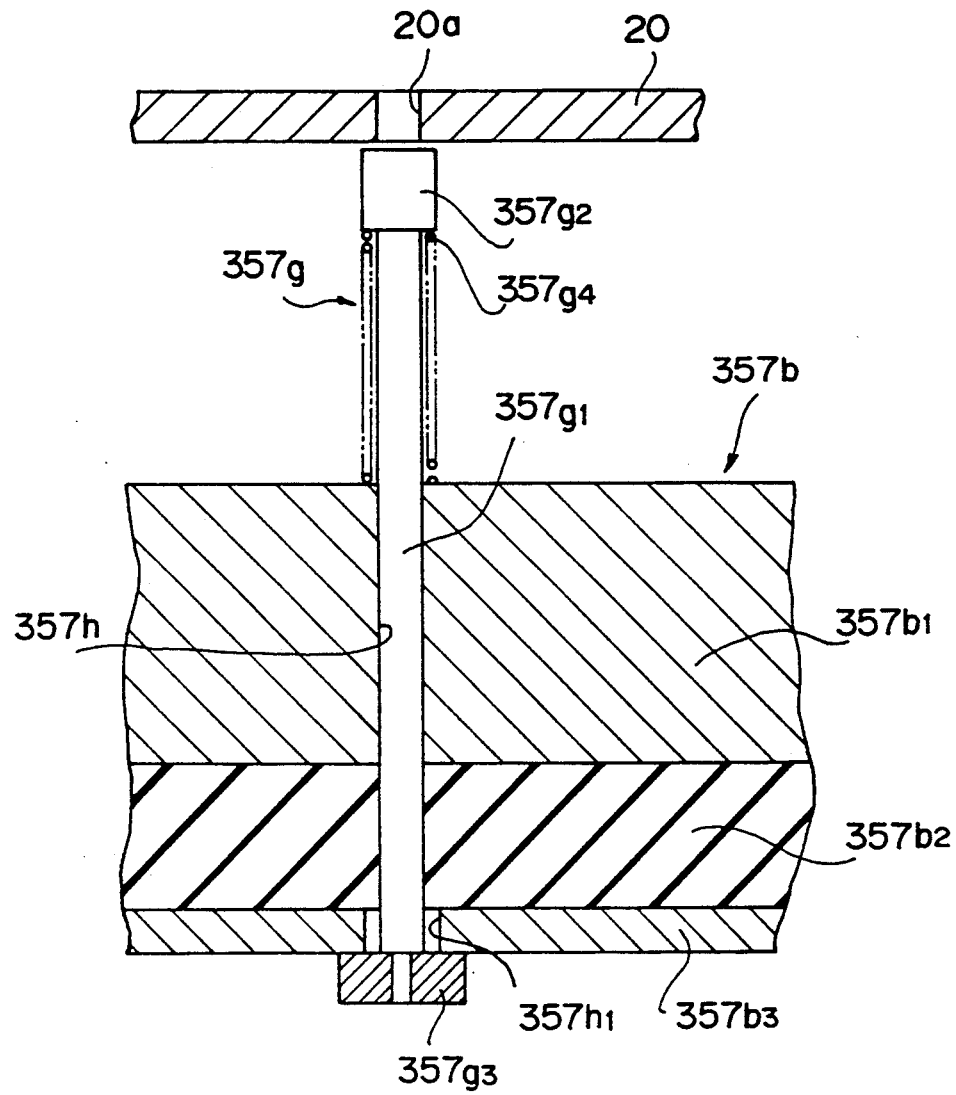
FIG. 20 is a longitudinal sectional view showing a detection pin mounting state in a detection device when work connecting pins are defectively inserted.

As shown in FIG. 20, the detection body 357b has a structure of three horizontal layers stacked on each other, i.e., a first conductive block $357b_1$ as an upper layer, an insulating block $357b_2$ as an interlayer, and a second conductive block $357b_3$ as a lower layer. As a result, the first conductive block $357b_1$ is electrically insulated from the second conductive block $357b_3$ through the insulating block $357b_2$.

A plurality of detection pins 357g constituting two lateral arrays are arranged in the detection unit 357 to respectively correspond to all lead wires Wb of the corresponding work W. That is, these detection pins 357g are located immediately below the corresponding lead wires Wb of the work W inserted into the printed circuit board 20. These detection pins 357g are vertically inserted into through holes 357h through the detection body 357b, as shown in FIG. 20, so that the pins 357g are supported to be vertically movable through the through holes 357h.

As shown in FIG. 20, each detection pin 357g integrally comprises a pin body $357g_1$ inserted into the through hole 357h, and head and bottom portions $357g_2$ and $357g_3$ located at the upper and lower ends of the pin body $357g_1$ and each having a diameter larger than that of the pin body $357g_1$. Each detection pin 357g is made of a conductive material. A coil spring $357g_4$ is inserted between the lower surface of the head portion $357g_2$ of each pin body $357g_1$ and the upper surface of the detection body 357b.

The through hole 357h in the second conductive block $357b_3$ serving as the lower layer has a diameter larger than that of the pin body $357g_1$. That is, the outer surface of the pin body $357g_1$ of the detection pin 357g is separated from the second conductive block $357b_3$, i.e., is not electrically connected to the second conductive block $357b_3$.

As shown in FIG. 20, when the detection pins 357g are not pushed down by the corresponding lead wires Wb, the outer surfaces of the pin bodies $357g_1$ of the detection pins 357g are not brought into contact with the second conductive block $357b_3$. The upper surfaces of the bottom portions $357g_3$ are brought into contact with the lower surface of the second conductive block $357b_3$. The first and second conductive blocks $357b_1$ and $357b_3$ are electrically connected to each other (i.e., rendered conductive).

Figure 21:
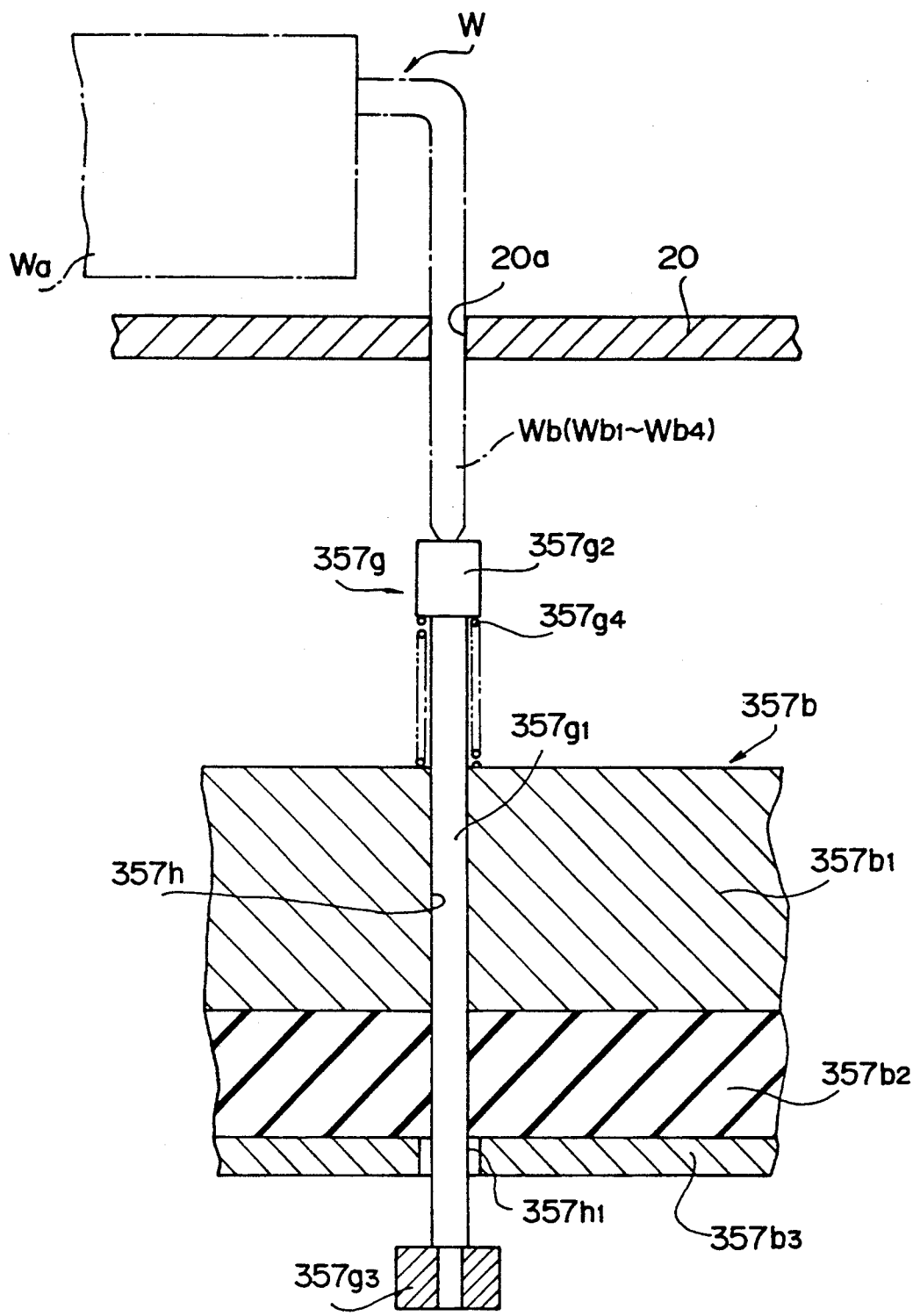
FIG. 21 is a longitudinal sectional view showing a detection pin mounting state in the detection device when work connecting pins are satisfactorily inserted.

On the other hand, as shown in FIG. 21, when the detection pins 357g are kept pushed down by the corresponding lead wires Wb from above, the upper surface of the bottom portion $357g_3$ is separated from the lower surface of the second conductive block $357b_3$. The first and second conductive blocks $357b_1$ and $357b_3$ are not electrically connected to each other through the detection pins 357g (i.e., rendered nonconductive).

At the time of insertion of the work W into the printed circuit board 20, whether the lead wires Wb of the work W extend through the printed circuit board is electrically detected on the basis of a conductive/nonconductive state of the first and second conductive blocks $357b_1$ and $357b_3$ of the detection unit 357. More particularly, if at least one lead wire Wb is inserted through the printed circuit board 20 and the corresponding detection pin 357g is not pushed down, the state shown in FIG. 21 cannot be achieved. In this case, the first and second conductive blocks $357b_1$ and $357b_3$ are kept conductive.

When all the lead wires Wb extend through the printed circuit board 20 and all the detection pins 357g are pushed down, the state shown in FIG. 21 can be achieved. The first and second conductive blocks $357b_1$ and $357b_3$ are rendered nonconductive.

The detection pins 357g of the detection unit 357 serve as a detection switch DS which is turned on/off by the lead wires Wb. The detection switch DS is turned on by an insertion failure of at least one lead wire Wb and is turned off by satisfactory insertion of all the lead wires Wb. Both terminals $DS_1$ and $DS_2$ of the detection switch DS are constituted by connecting terminals $357b_4$ and $357b_5$ extending on the first and second conductive blocks $357b_1$ and $357b_3$, respectively, as shown in FIG. 16A.

Figure 22A:
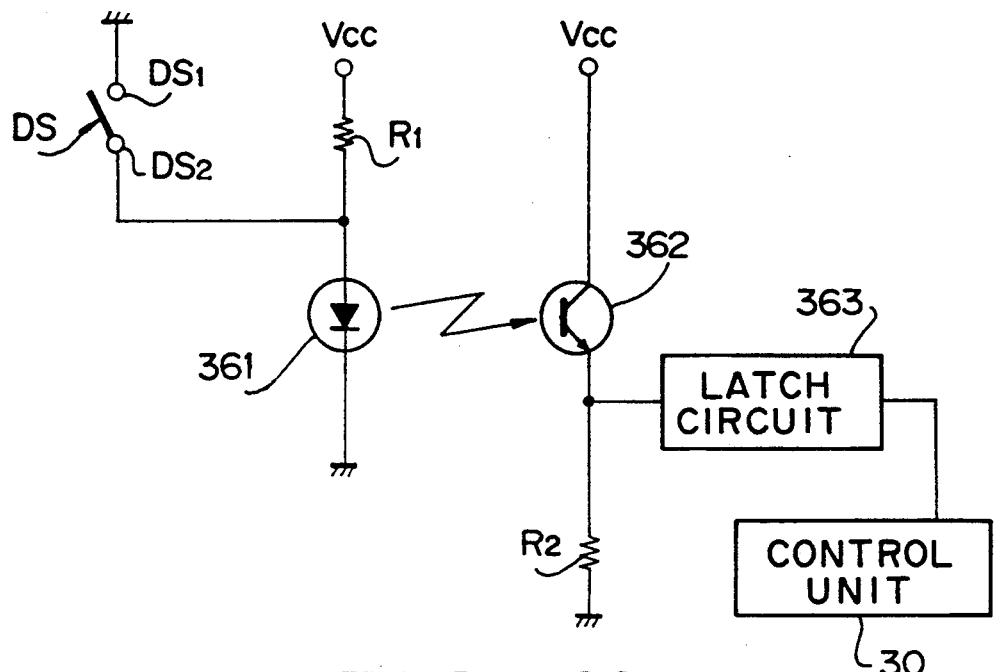
FIG. 22A is a circuit diagram showing electrical connections in a detection switch.

As shown in FIG. 15, a light-emitting element such as an LED 361 is exposed outside on the outer surface of each second mounting body 346. One light-receiving element such as a phototransistor 362 is arranged to oppose only the LED 361 of the clinch unit 343 located at the clinch position. As shown in FIG. 22A, one terminal of the LED 361 is grounded through the detection switch DS and is connected to a power source Vcc through a predetermined resistor $R_1$. The other terminal of the LED 361 is grounded. Upon satisfactory insertion of all the lead wires Wb, the detection switch DS is turned off, so that the LED 361 is turned on. However, when at least one lead wire Wb is not satisfactorily inserted, the switch DS is turned on, so that the LED 361 is turned off.

As shown in FIG. 22A, the base of the phototransistor 362 is arranged to oppose the LED 361, the emitter of the phototransistor 362 is connected to the power source Vcc, and the collector of the phototransistor 362 is connected to a latch circuit 363 and is grounded through a predetermined resistor $R_2$. When the LED 361 emits light, the phototransistor 362 is turned on upon reception of light from the LED 361. An input potential of the latch circuit 363 is increased. When an input potential exceeds a predetermined threshold value in the latch circuit 363, the input potential is latched. This latch signal is sent to the control unit 30 and serves as an enable signal (start signal) for a push-down operation of the detection unit 357 and a clinch operation started upon completion of the push-down operation. These operations will be described in detail later.

This latch state is released upon downward movement of the clinch body 349 of the clinch unit 343A after the clinch operation is completed.

In this manner, a detection result in the detection unit 357 is transmitted to the control unit 30 through the phototransistor 362 spaced apart from the LED 361 so as to oppose the LED 361. As a result, when the second rotary table 342 is rotated to sequentially locate the clinch units $343_1$ to $343_{10}$ to the clinch position, no connecting cable is entangled because the control unit 30 is not directly connected to the detection unit 357 through any connecting cable. The second rotary table 342 can be freely rotated, and wiring can be simplified.

In this embodiment, since the phototransistor 362 is arranged to oppose only the LED 361 in the clinch unit 343A located at the clinch position, only one phototransistor 362 is required per clinch device 300 although the LEDs 361 must be arranged in units of clinch units 343 of the clinch device 300. In this case, since the number of transmission lines between the phototransistor 362 and the control unit 30 is one, cost can be reduced.

An arrangement of a push-in mechanism 364 for performing a push-in operation to prevent the detection pin 357g from being bent by a clinch operation after the detection operation of the detection unit 357 is completed and before the clinch operation is started will be described below.

As shown in FIGS. 16A and 17, the push-in mechanism 364 comprises a pair of lock rods 365a and 365b which parallelly and horizontally bridge the pair of guide blocks 357c and 357f and the pair of guide blocks 357d and 357e located at both sides. As shown in FIG. 17, the press member mounting members 351a and 351b have a crank shape bent twice outwardly upward. The lower bent portions (substantially intermediate portions as far as the vertical lengths are concerned) of the mounting members 351a and 351b are rotatably supported through pivot support shafts 353a and 353b. As shown in FIG. 16C, the pair of press members 366a and 366b and the pair of press members 366c and 366d are fixed at both ends of the press members 351a and 351b through pairs of upper and lower bolts 367a and 367b.

As is apparent from FIG. 19, gaps are formed between the press members 366a and 366b and between the press members 366c and 366d, and clinch members 369a and 369b fixed to the clinch member mounting members 354a and 354b through pairs of upper and lower bolts 368a and 368b are fitted in these gaps.

As shown in FIG. 18, inner surfaces of the press members 366a, 366b, 366c, and 366d which engage with the corresponding lock rods 365a and 365b at both the right and left sides are defined as inclined surfaces. First rollers 370a and 370b brought into outer surface portions of the upper end portion of the third thin shaft 348 are rotatably mounted at the lower ends of the press member mounting members 351a and 351b mounted with the press members 366a and 366b and the press members 366c and 366d. Contact positions of the first rollers 370a and 370b on the third thin shaft 348 are defined as the lower end of the first small-diameter portion 348c, i.e., portions of the first small-diameter portion 348c located immediately above the first tapered portion 348b in a state wherein the third thin shaft 348 does not extend from the first thick shaft 347.

As a result, when a clinch drive mechanism 371 is started and the third thin shaft 348 extends from the third thick shaft 347 by a first extension amount, the contact positions of the first rollers 370a and 370b on the third thin shaft 348 are shifted from the first small-diameter portion 348c to the large-diameter portion 348a through the first tapered portion 348b. In this manner, the four press members 366a, 366b, 366c, and 366d are pivoted inward about the corresponding pivot support shafts 353a and 353b. The four guide blocks 357c to 357f, i.e., the detection unit 357 as a whole, are moved downward through the corresponding lock rods 365a and 365b against biasing forces of the coil springs 360a to 360d.

Upon downward movement of the detection unit 357, the detection pins 357g are also moved downward, and a push-down state of the work W on the printed circuit board 20 by the lead wires Wb can be relatively released. In this manner, the detection switch DS is turned off. However, since a detection potential (i.e., an input potential increased upon reception of light from the LED 361) at the phototransistor 362 is latched by the latch circuit 363, no problem is posed in the subsequent control operations.

Since the detection pins 357g are also moved downward upon downward movement of the detection unit 357, even if clinch elements $369a_3$ and $369a_4$ and clinch elements $369b_3$ and $369b_4$ of the clinch members 369a and 369b are pivoted inward, these clinch elements $369a_3$, $369a_4$, $369b_3$, and $369b_4$ are engaged with the detection pins 357g to prevent inward bending of these clinch elements.

In this embodiment, since the detection unit 357 is pushed down by the push-in mechanism 364 so that the clinch elements $369a_3$, $369a_4$, $369b_3$, and $369b_4$ are pushed down to the positions where they are not engaged with the detection pins 357g prior to the clinch operation, the detection operation in the detection unit 357 can always be performed stably, thus improving reliability.

As shown in FIG. 17, the clinch members 369a and 369b comprise body portions $369a_1$ and $369b_1$ which are mounted on the clinch member mounting members 354a and 354b and the upper portions of which extend immediately below the side portions of the support member 358. As shown in FIG. 16C, the central portions of horizontal portions $369a_2$ and $369b_2$ terminated at positions immediately outside the lead wires $Wb_1$, $Wb_2$, $Wb_3$, and $Wb_4$, each having both ends to be clinched, are connected to the upper ends of the body portions $369a_1$ and $369b_1$ horizontally along the side edges of the work W to be clinched. Clinch elements $369a_3$ and $369a_4$ and clinch elements $369b_3$ and $369b_4$ are formed at both ends of the horizontal portions $369a_4$ and $369b_2$ so as to engage with the corresponding lead wires $Wb_1$, $Wb_2$, $Wb_3$, and $Wb_4$ from the outer sides.

The clinch member mounting members 354a and 354b mounted with the clinch-members 369a and 369b having the arrangement described above have a crank shape as in the press member mounting members 351a and 351b. The lower ends of the clinch member mounting members 354a and 354b are terminated below the corresponding lower ends of the press member mounting members 351a and 351b. A coil spring 372 is hooked between the press member mounting members 351a and 351b( FIG. 17) to apply a biasing force to cause their lower portions to come close to each other. Second rollers 373a and 373b which are in rolling contact with the third thin shaft 348 from both sides are pivotally mounted on the lower ends of the clinch member mounting members 354a and 354b.

Contact positions of the second rollers 373a and 373b on the third thin shaft 348 are defined as the upper end of the first small-diameter portion 348c, i.e., portions of the first small-diameter portion 348c which are above the second tapered portion 348e by a predetermined distance when the third thin shaft 348 does not extend from the first thick shaft 347. The predetermined distance is set so that the contact positions of the second rollers 373a and 373b on the third thin shaft 348 can be sufficiently shifted from the upper end of the first small-diameter portion 348c to portions immediately above the second tapered portion 348e upon movement of the third thin shaft 348 by the first extension amount.

As a result, when a clinch drive mechanism 371 (to be described in detail later) is started and the third thin shaft 348 extends from the third thick shaft 347 from the first extension amount by the second extension amount, the contact positions of the second rollers 373a and 373b on the third thin shaft 348 are shifted to the second small-diameter portion 348d through the second tapered portion 348e. In this manner, the two clinch members 369a and 369b are pivoted inward about the corresponding rotation support shafts 353a and 353b against the biasing force of the coil spring 372. The four lead wires $Wb_1$, $Wb_2$, $Wb_3$, and $Wb_4$ located at four corners are bent inward, i.e., clinched through the corresponding clinch elements $369a_3$, $369a_4$, $369b_3$, and $369b_4$.

Figure 22B:
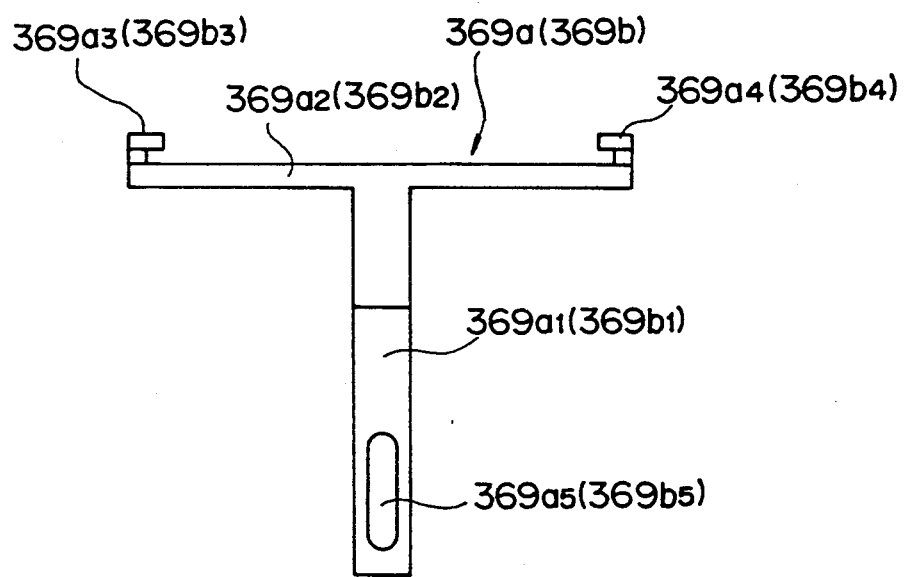
FIG. 22B is a front view showing an arrangement of a clinch member.

As shown in FIG. 22B, elongated holes $369a_5$ and $369b_5$ which receive the pair of upper and lower bolts 368a and 368b are longitudinally formed in the body portions $369a_1$ and $369b_1$ which are mounted with the clinch members mounting members 354a and 354b in the clinch members 369a and 369b with this arrangement when the pair of upper and lower bolts 368a and 368b are loosened, the corresponding clinch member mounting members 354a and 354b are vertically movable, so that the vertical positions of the clinch elements $369a_3$, $369a_4$, $369b_3$, and $369b_4$ can be accurately adjusted and defined.

An arrangement of the clinch drive mechanism 371 will be described in detail with reference to FIG. 15 and FIGS. 23 to 25.

As shown in FIG. 15, a driven portion 347a engaged with a thick shaft drive roller 347 (to be described later) is formed at the lower end of the third thick shaft 347 to move the thick shaft 347 upward. The lower end of the third thin shaft 348 is terminated below the lower end of the third thick shaft 347. A driven portion 348f engaged with a thin shaft drive roller 374b is formed at the lower end of the thin shaft 348.

To perform a clinch operation the clinch unit 343A is rotated to the clinch position and stopped and thus is arranged adjacent to the clinch drive mechanism 371. The clinch drive mechanism 371 comprises thick and thin shaft drive rollers 374a and 374b engaged with the drive portions 347a and 348f formed on the third thick and thin shafts 347 and 348 of the clinch unit 343A located at the clinch position, and connecting rods 376a and 376b mounted at the upper ends of the thick and thin shaft drive rollers 374a and 374b and vertically movably supported through support members 375a and 375b.

One end of each of the swingable levers 377a and 377b having pivotal intermediate portions is rotatably connected to a corresponding one of the lower ends of the two connecting rods 376a and 376b. The other end of each of the swingable levers 377a and 377b is connected to a corresponding one of drive cam mechanisms 378a and 378b. The drive cam mechanisms 378a and 378b cooperate to vertically move the clinch unit 343 as a whole. When the detection unit 357 is moved downward, a clinch operation is performed.

The other end of each of the swingable levers 377a and 377b is mounted with a corresponding one of cam followers 379a and 379b. The drive cam mechanisms 378a and 378b comprise cam members 381a and 381b having cam grooves engaged with the corresponding cam followers 379a and 379b. The cam grooves 380a and 380b constitute one annular groove. The cam members 381a and 381b are synchronously driven in a counterclockwise (forward) direction in FIG. 26A by a common clinch cam motor 382.

The clinch cam motor 382 comprises a reversible motor. The clinch cam motor 382 is driven and controlled by the control unit 30 through a fifth motor driver 220e. The control unit 30 performs one clinch cycle upon simultaneous rotation of the cam members 381a and 381b by one revolution each.

Figure 23:
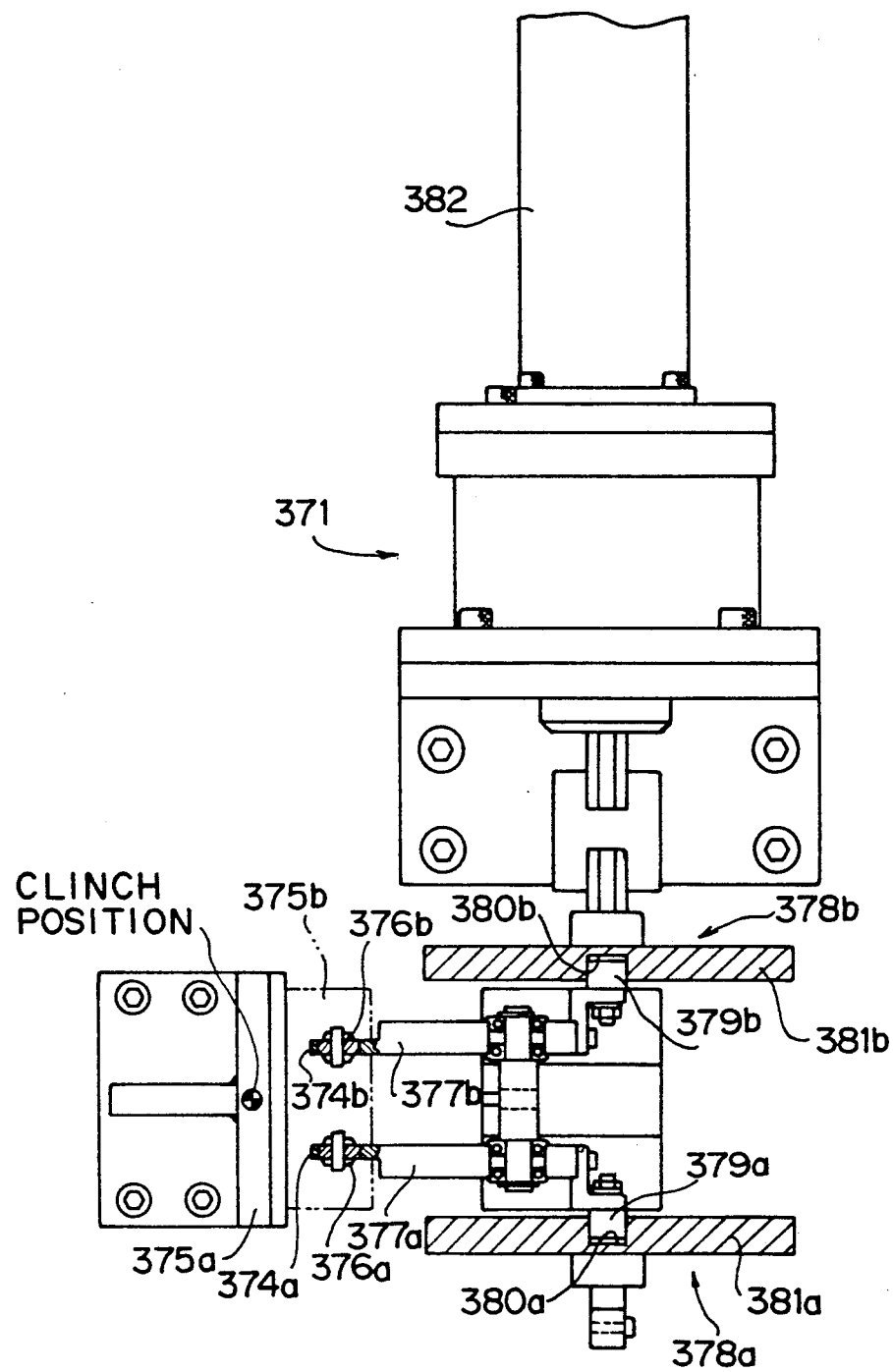
FIG. 23 is a plan view showing an arrangement of a clinch drive mechanism.
Figure 24:
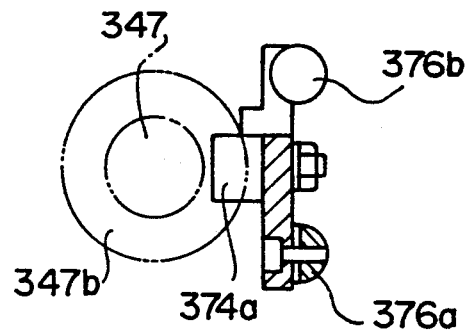
FIG. 24 is a sectional plan view of the clinch drive mechanism in a state when taken along the line XII—XII in FIG.

As shown in FIG. 23, the cam members 381a and 381b parallelly oppose each other on the same axis. The swingable levers 377a and 377b and the connecting rods 376a and 376b are adjacent to each other. The third thick shaft 347 is coaxially arranged with the third thin shaft 348. For this reason, the connecting rod 376a for connecting the swingable lever 377a and the third thick shaft 347 has a portion bent to the left (i.e., toward the center of the third thick shaft 347 along a tangent thereto). The thick shaft drive roller 374 is arranged at the distal end of this bent portion.

Figure 25:
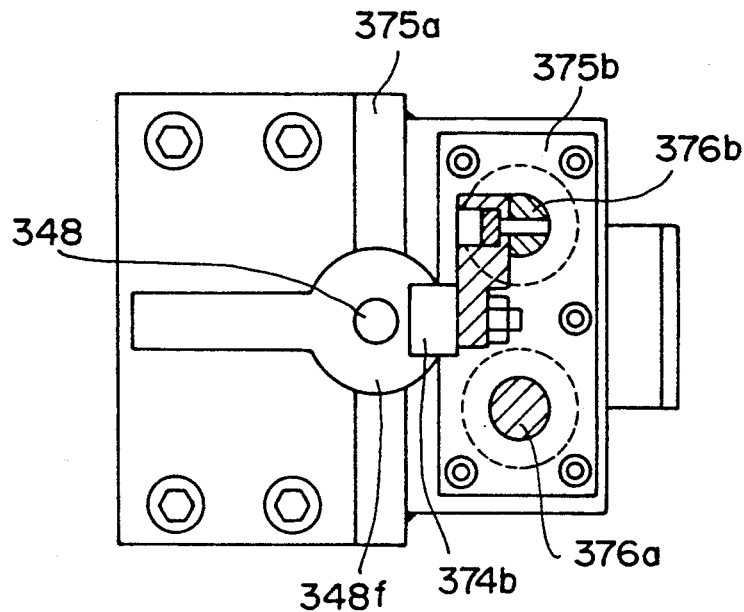
FIG. 25 is a sectional plan view of the clinch drive mechanism in a state when taken along the line XIII—XIII in FIG. 15.

The connecting rod 376b for connecting the swingable lever 377b and the third thin shaft 348 has a bent portion bent toward the right (i.e., toward the center of the third thin shaft 348 along a tangent thereto) at its upper end, as shown in FIG. 25. The thin shaft drive roller 374b is arranged at the distal end of the bent portion.

Figure 26A:
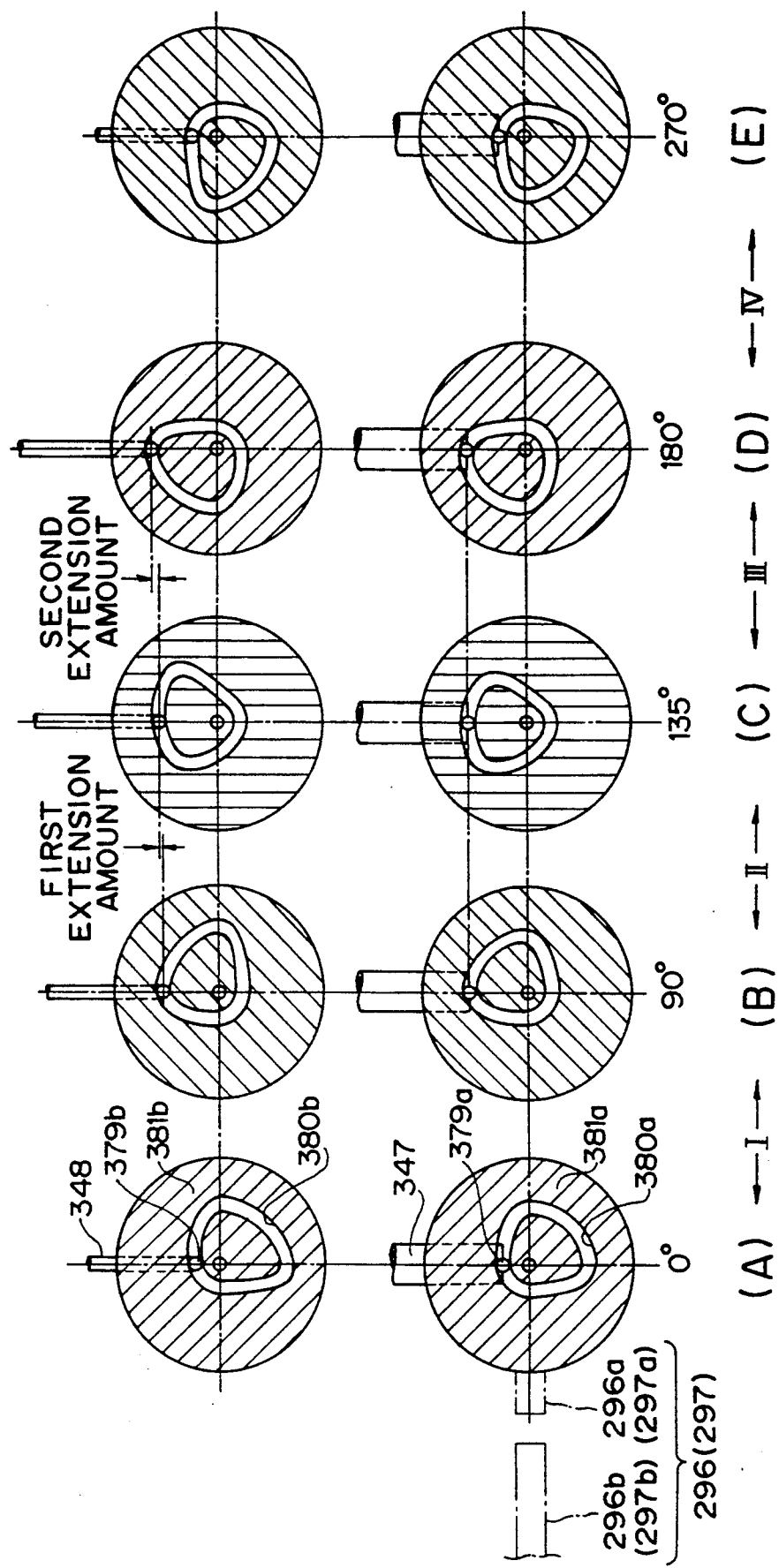
FIG. 26A is a view sequentially showing driving states in a drive cam mechanism.

The cam grooves 380a and 380b are formed to allow sequential operations, as shown in states (A) to (E) of FIG. 26A. The state (A) in FIG. 26A shows a lowermost standby position of the clinch unit 343; (B), an uppermost standby position rotated through 90° counterclockwise from the state (A); (C), a push-down position rotated through 45° counterclockwise from the state (B); (D), a clinch position rotated through 45° counterclockwise from the state (C); and (E), a lowest position rotated through 90° counterclockwise from the state (D).

FIGS. 27A to 27E show operating states in the head unit 218A and the clinch unit 343A in correspondence with the states (A) to (E) of FIG. 26A.

Figure 27A:
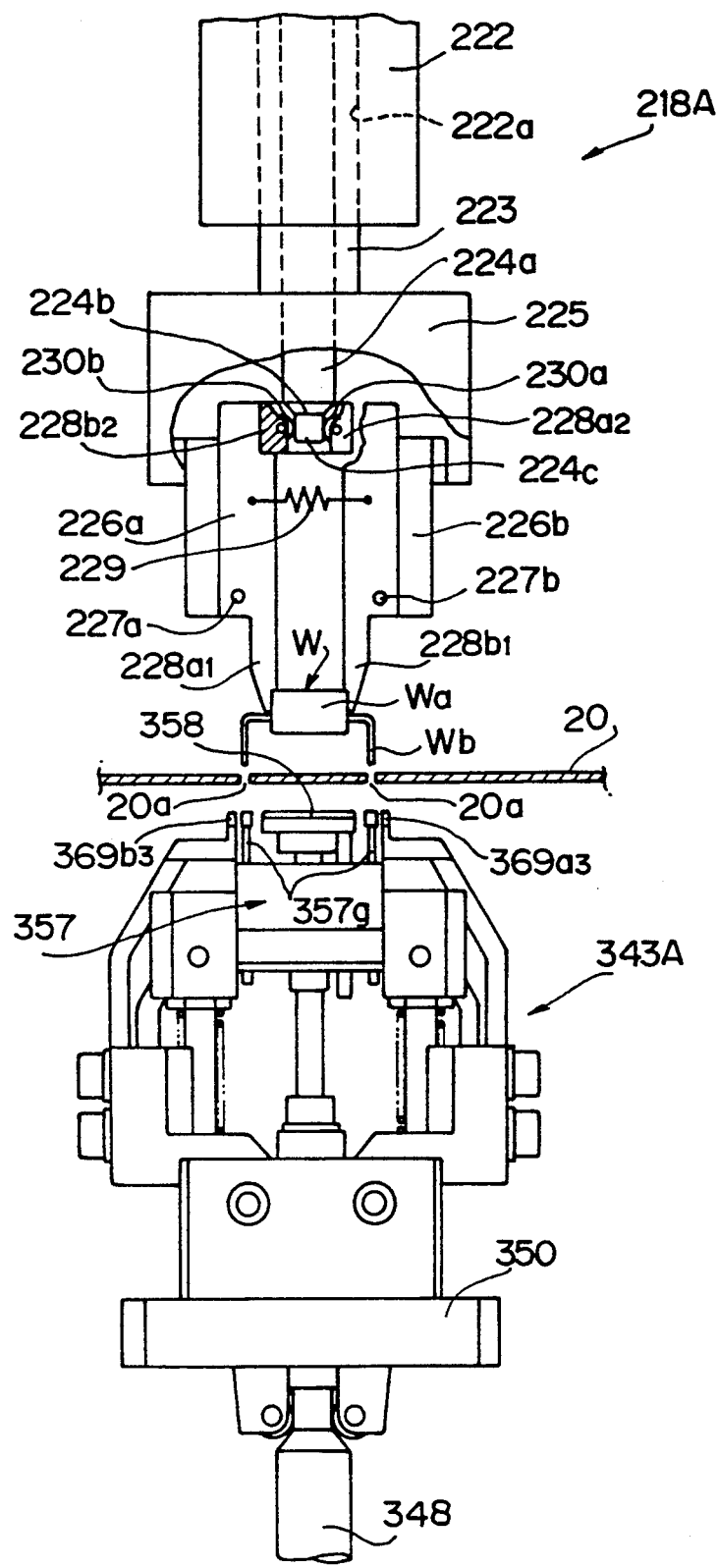

In an ascending step I (0° to 90°) from the state (A) to state (B) of FIG. 26A, the cam grooves 380a and 380b have identical cam shapes and are formed so that a distance from each center is increased to ascend the clinch body 349 of the clinch unit 343A located at the clinch position from the lowermost position of FIG. 27A, i.e., to ascend the clinch body 349 without changing a relative distance between the third thick shaft 347 and the third thin shaft 348, and that, at the uppermost position shown in FIG. 27B, the support member 358 is brought into contact with the lower surface of a portion of the circuit printed board 20 at a position where the work W is inserted.

After the support member 358 supports the lower surface of the printed circuit board 20, the gripper portion of the head unit 218A is moved down to the lowermost position so as to insert the work W gripped by the gripper portion into the printed circuit board 20, as shown in FIG. 27B. More specifically, the lead wires Wb are inserted from above into a plurality of through holes 20a formed in the printed circuit board 20.

In the push-down step II (90° to 135°) from the state (B) to the state (C) in FIG. 26A, the cam groove 380a defining the operation of the third thick shaft 347 is set so that the distance from its center of rotation is kept unchanged. On the other hand, the cam groove 380b defining the operation of the thin shaft 348 is set so that a distance from its center of rotation is kept unchanged up to 95°, but is gradually increased in the range of 95° or more. The cam lift amount (i.e., an ascending amount of the cam follower 379b from the state (B) to the state (C) in FIG. 26A) is defined as the first extension amount.

That is, the angular range from 90° to 95° is defined as a detection step. In this detection step, the work W is inserted in the printed circuit board 20 by the head unit 218A, and the detection pins 357g of the detection unit 357 are pushed down by the lead wires Wb of the inserted work W.

Figure 27C:
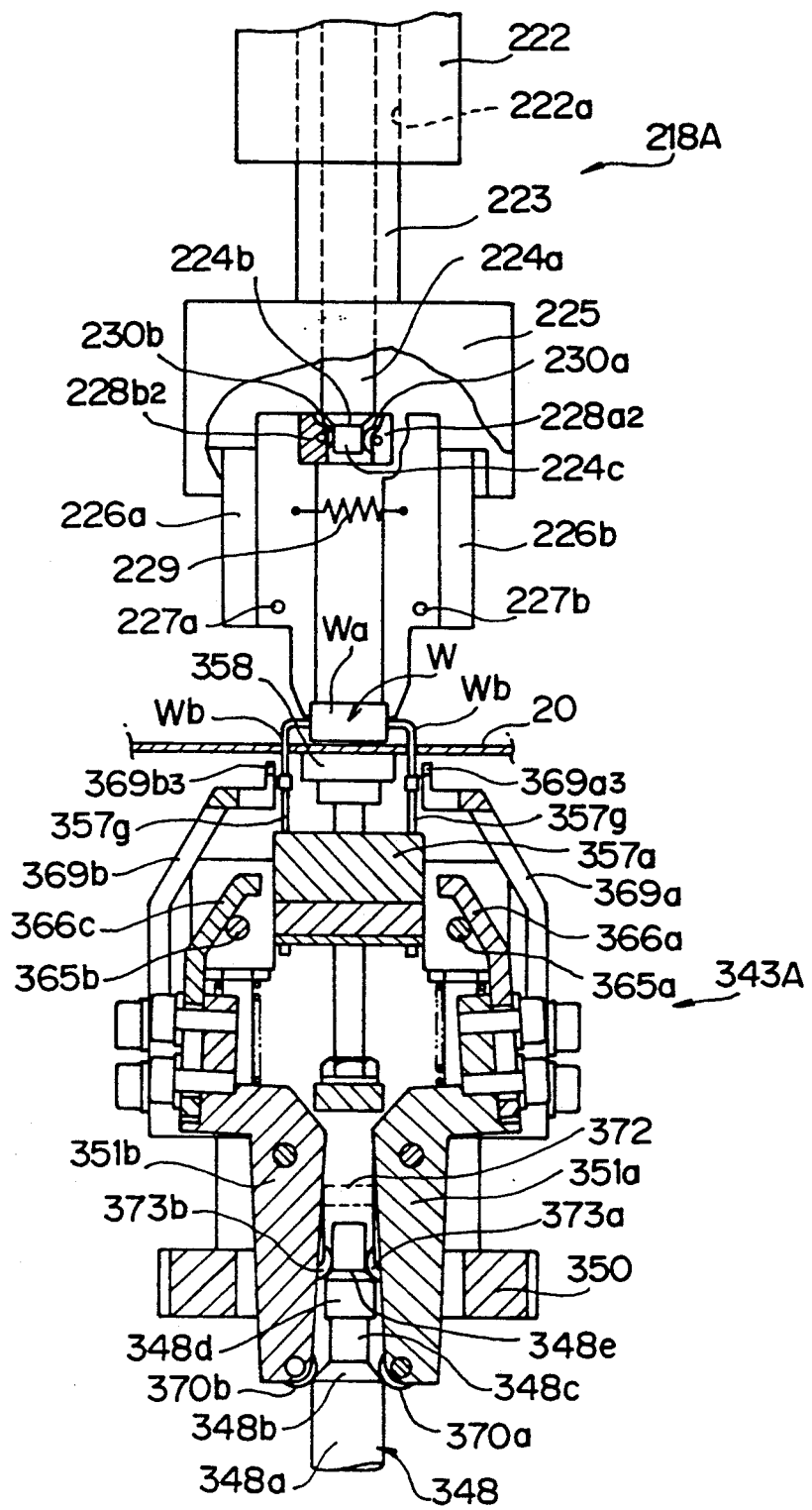

When the pivot angle reaches 135°, the third thin shaft 348 extends from the upper end of the third thick shaft 347 by the first extension amount, as shown in FIG. 27C. In this manner, the cam members 381a and 381b are pivoted to obtain the state (C) of FIG. 26A, thereby completing the push-down operation.

In a clinch step III (135° to 180°) from the state (C) to the state (D) in FIG. 26A, the cam groove 380a which defines the operation of the third thick shaft 347 is set to not change the distance from its center as in the push-in step II. On the other hand, the cam groove 380b which defines the operation of the third thin shaft 348 is set to gradually increase a distance from its center. A lift amount (i.e., an ascending distance of the cam follower 379b from the state (C) to the state (D) of FIG. 26A) of the cam is set to be the second extension amount.

Figure 27D:
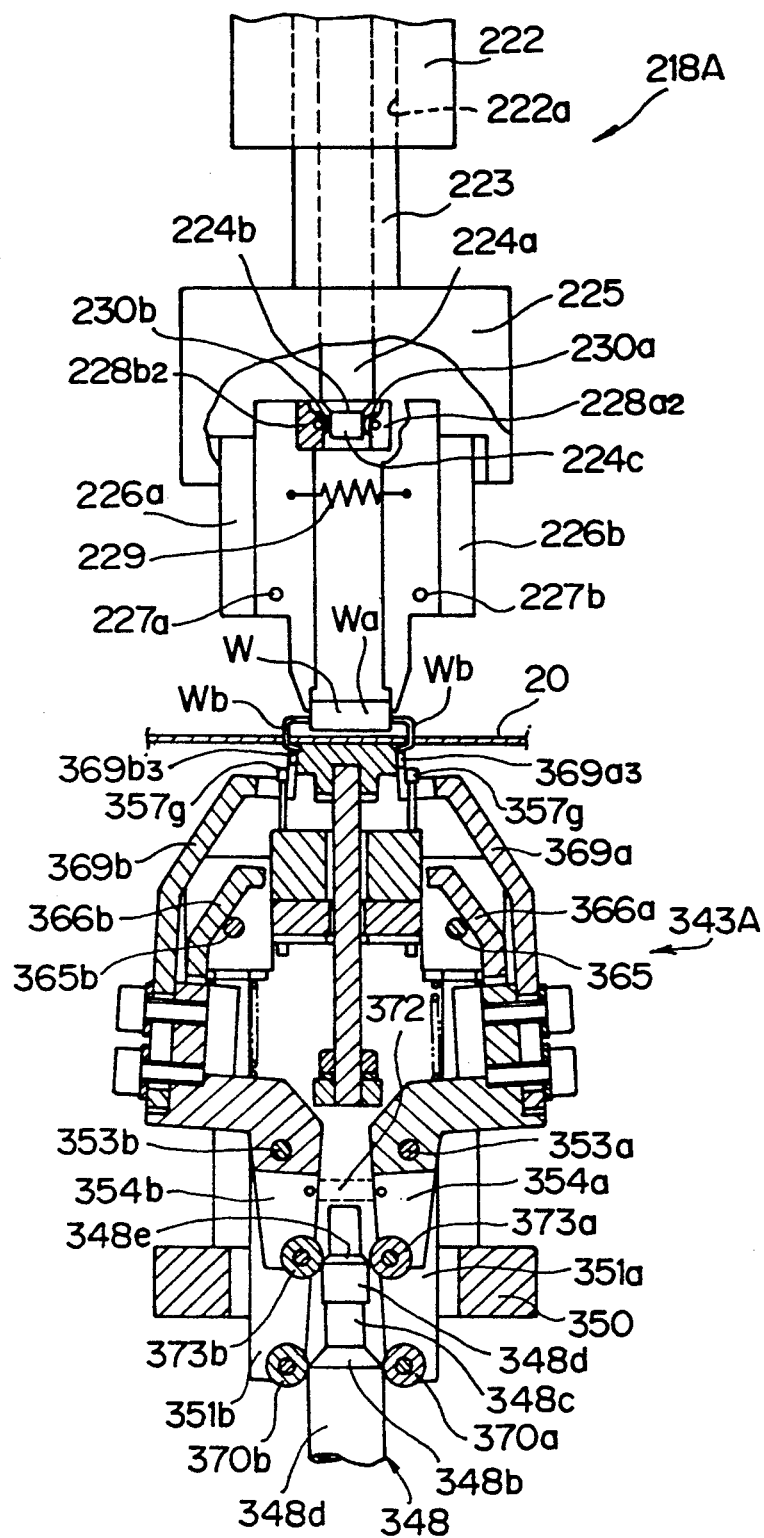
Figure 27E:
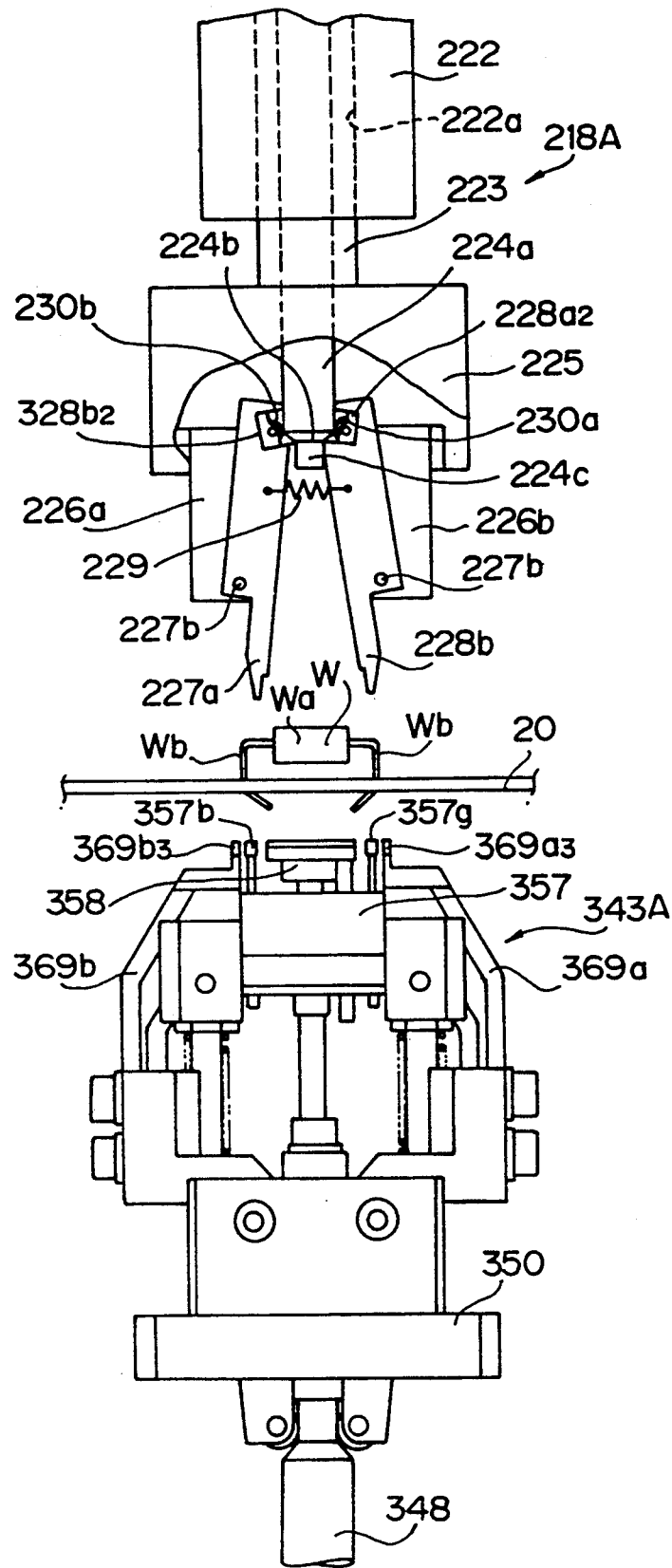

As a result, as shown in FIG. 27D, the third thin shaft 348 further extends upward from the upper end of the third thick shaft 347 by the second extension amount. In this manner, the cam members 381a and 381b are pivoted to the state (D) in FIG. 26A to complete the clinch operation. In this embodiment, the clinch operation is performed after the push-down operation is completed. The connecting pins $Wb_1$, $Wb_2$, $Wb_3$, and $Wb_4$ at the four corners are bent inward by the corresponding four clinch elements $369a_3$, $369a_3$, $369b_3$, and $369b_4$.

In a descending step IV (180° to 270°) from the state (D) to the step (E) in FIG. 26A, the cam grooves 380a and 380b have identical shapes and are formed so that a distance from each center of rotation is gradually decreased to descend the clinch unit 343 located at the upper position, i.e., descend the clinch unit 343 without changing the relative distance between the third thick shaft 347 and the third thin shaft 348, and that, at the lowest position, the clinch unit 343 is descended to have the same level as that of the state of FIG. 27A while the clinch posture is kept unchanged.

In a return step V (270° to 360° or 0°) from state (E) to the state (A) in FIG. 26A, the cam groove 380a defining the operation of the third thick shaft 347 is set so that the distance from its center of rotation is kept unchanged, while the cam groove 380b defining the operation of the third thin shaft 348 is set so that the distance from its center of rotation is gradually decreased. The cam descending amount (i.e., a descending distance of the cam follower 379b from the state (E) to the state (A) in FIG. 26A) is set to be a sum of the first and second extension amounts. As a result, as shown in FIG. 27A, the second thin shaft 348 extends from the upper end of the second thick shaft 347 by a predetermined amount. In this manner, the cam members 381a and 381b return to the state (A) in FIG. 26A.

Description of Clinch Control Sequence

Figure 26B:
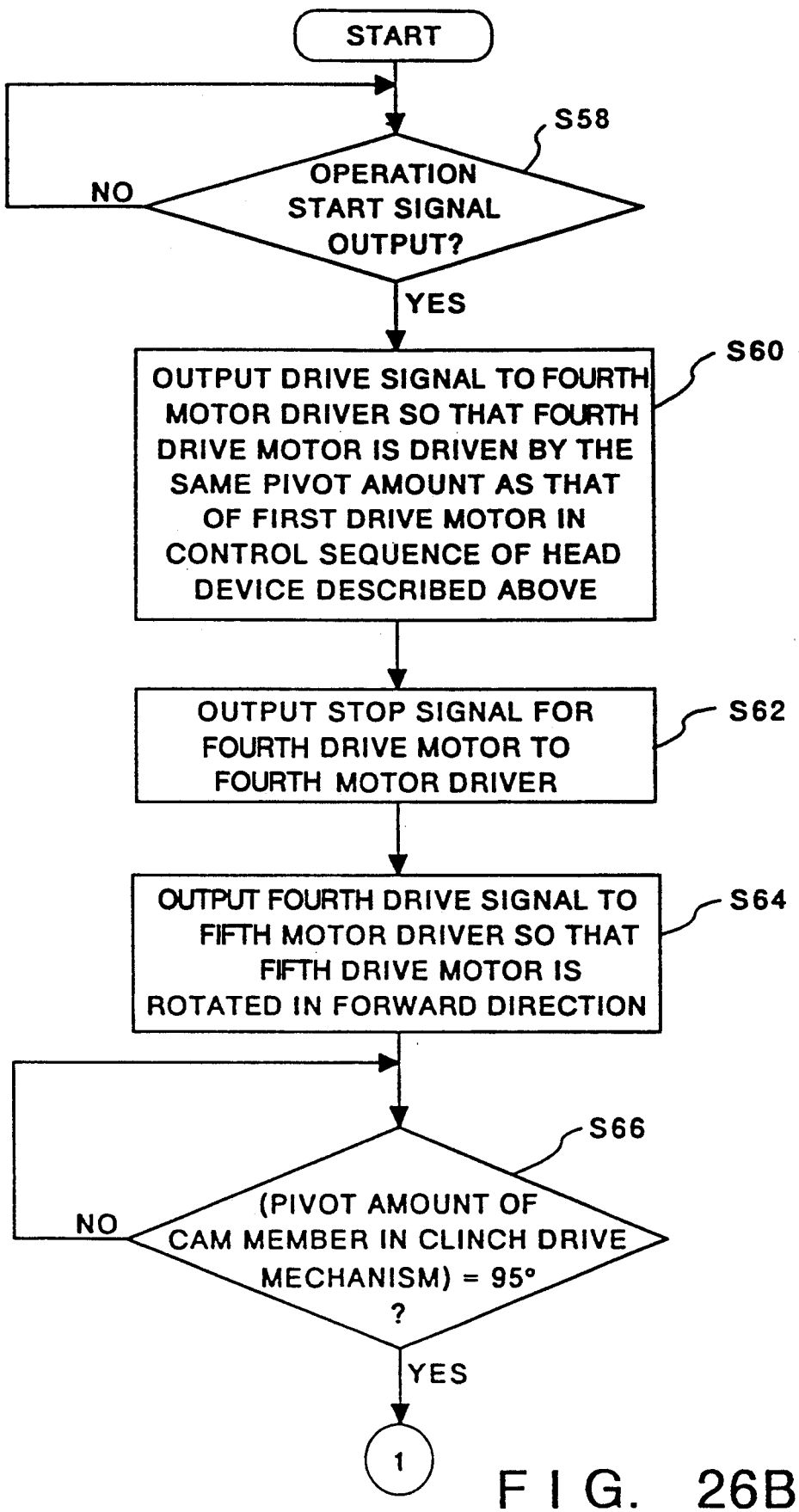
FIG. 26BA and 26BB are flow charts showing a control sequence of a clinch mechanism in a control device.
Figure 26B:
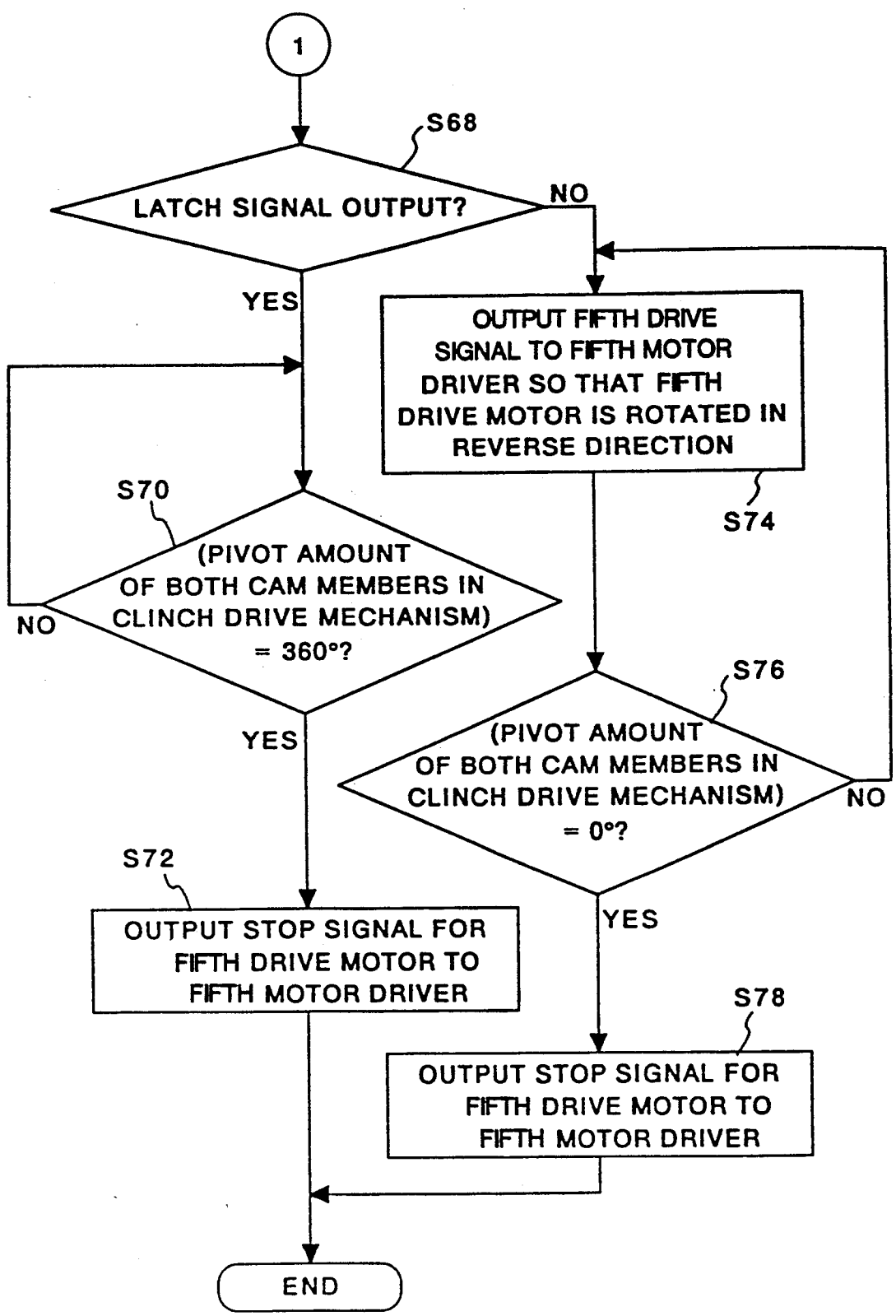

A clinch control sequence in the control unit 30 will be described with reference to FIG. 26B.

When an operation start signal is detected in step S58, a drive signal is output to the fourth motor driver 220d so that the clinch turret motor 344 pivots the second rotary table 342 in the control sequence in the turret table device 200 in step S60.

When the operation in step S60 is performed, the clinch unit 343 is rotated and driven in the clinch device 300 in synchronism with rotation and driving of the head unit 218 of the turret table device 200. When the head unit 218 which grips the work W to be inserted is pivoted to the insertion position, the clinch unit 343 corresponding to the work W to be inserted is pivoted in the clinch device 300. When this clinch unit 343 is pivoted to the clinch position, a drive stop signal for the clinch turret motor 344 is output to the fourth motor driver 220d in step S62.

In step S64, a clinch turret signal is output to the fifth motor driver 220e to rotate the clinch cam motor 382 in the forward direction (i.e., counterclockwise direction). The process described with reference to FIGS. 27A and 27B is performed on the basis of the clinch turret signal so that the ascending step and then the detection step are performed.

It is determined in step S66 whether the pivot amount of each of the cam members 381a and 381b in the clinch drive 371 reaches 95°. When the pivot amount of each of the cam members 381a and 381b is determined to be 95° in step S66, i.e., when it is determined that the detection step is completed, it is determined in step S68 whether a latch signal is output from the latch circuit 363 as in step S344 (discussed hereinafter).

If YES in step S68, i.e., when it is determined that the LED 361 is turned on and the latch signal is output from the latch circuit 363, the clinch turret signal output to the fifth motor driver 220e in step S64 is continues to be output. As a result, as described above, the step of clinching the lead wires Wb of the work W is executed after the push-down step of the detection unit 357. Finally, the clinch body 349 is moved downward to the initial position.

When it is detected in step S70 that a pivot amount of each of the cam members 381a and 381b in the clinch drive mechanism 371 reaches 360°, a drive stop signal is output to the fifth motor driver 220e to stop the clinch cam motor 382 in step S72. The clinch operation of the clinch unit 343A is completed and returns to the lowermost position. In this state, driving of the clinch drive mechanism 371 is stopped, and the second control sequence in the clinch device 300 in a normal state is completed.

If NO in step S68, i.e., when it is determined that the LED 361 is turned off and a latch signal is output from the latch circuit 363 even after the detection step is completed, it is determined that at least one lead wire Wb does not appear below the printed circuit board 20. In step S74, a clinch cam signal is output to the fifth motor driver 220e to rotate the clinch cam motor 382 in the reverse direction. As a result, the clinch body 349 in the clinch unit 343A is moved in a direction opposite to that described above. This reverse driving continues until it is determined in step S76 that the pivot amount of each of the cam members 381a and 381b in the clinch drive mechanism 371 returns to 0°.

When it is determined in step S76 that the pivot amount of each of the cam members 381a and 381b returns to 0°, a stop signal for the clinch cam motor 382 is output to the fifth motor driver 220e in step S78. Driving of the clinch drive mechanism 371 is stopped while the clinch unit 343A returns to the lowermost position before it executes a clinch operation. In this manner, the above operations are performed in an insertion failure, thereby completing the second control sequence.

In the second control sequence, the control unit 30 simultaneously drives both the cam members 381a and 381b by one revolution (forward rotation) to perform one clinch cycle. When an insertion failure of the work W is detected in the detection step performed prior to the clinch operation, both the cam members 381a and 381b are rotated in the reverse direction upon detection of the insertion failure. The work W which is determined to be failed in insertion is not clinched, and the clinch body 349 is moved downward to the initial position, i.e., 0° pivot positions of the cam members 381a and 381b.

According to this embodiment, as a result, even if an insertion failure occurs in the work W, the operations prior to the detection of the failed work are reversely performed to easily and automatically remove the work W by the head unit 218A because the lead wires Wb of the failed work W are not yet clinched.

Description of Printed Circuit Board Positioning Device

Figure 28:
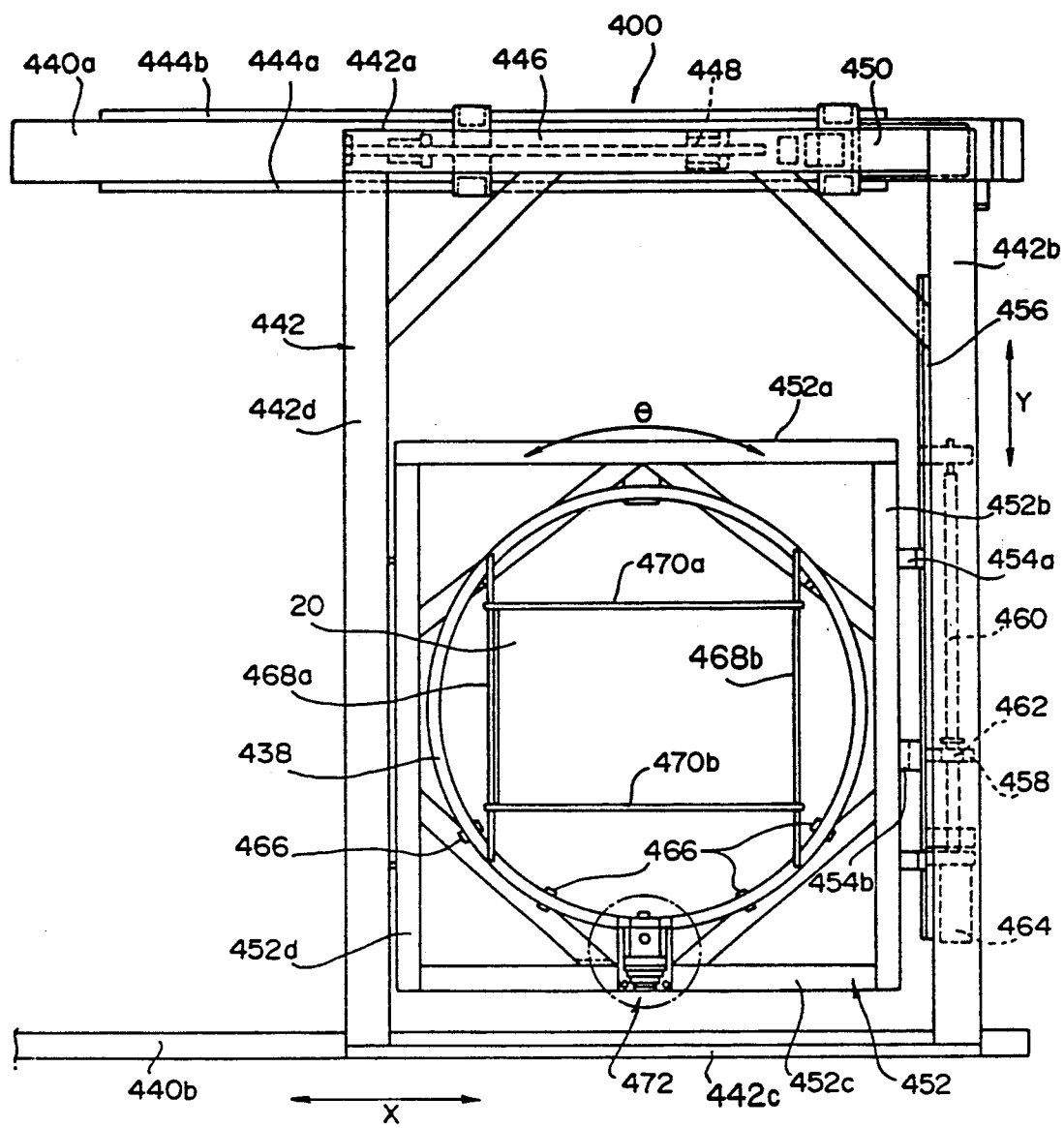
FIG. 28 is a detailed plan view showing an arrangement of a printed circuit board rotation device included in the mounting system shown in FIG. 1.

As described in detail above, the work W fed from the parts feed mechanism 100 is mounted at a predetermined position on the printed circuit board 20. An overall arrangement of the printed circuit board positioning device 400 for positioning the printed circuit board 20 will be described with reference to FIG. 28.

The printed circuit board rotation positioning device 400 comprises a rotary table 438 movable along the X- and Y-axes with respect to a base, i.e., rotatable about its axis. The printed circuit board 20 is directly placed on this rotary table 438. More specifically, the printed circuit board rotation positioning device 400 is fixed on the base and has a pair of parallel support tables 440a and 440b extending along the X-axis. An X-axis frame 442 elongated in the Y-axis direction is supported on one frame table 440a (i.e., the upper support table in FIG. 28) to be movable along the X-axis while a first side (i.e., the upper side) 442a of the X-axis frame 442 is guided by a pair of guide members 444a and 444b.

The X-axis frame 442 is hollow along the overall length of a substantially U-shaped portion except for a third side 442c opposing the first side 442a. A second ball screw 446 (first ball screw 144 is discussed above with reference to FIG. 4) extending along the X-axis is supported by the first side 442a so that both ends are pivotal. A second nut member 448 is threadably engaged with the second ball screw 446 and is fixed on one support table 440a. One end of the second ball screw 446 is connected to a drive shaft of an X-axis drive motor 450 stored in the first side 442a of the X-axis frame 442.

When the X-axis drive motor 450 is started, the X-axis frame 442 is moved in the X-axis direction through threadable engagement between the second ball screw 446 and the second nut member 448.

The third side 442a of the X-axis frame 442 is brought into slidable contact with the upper surface of the other support table 440b of the pair of support tables 440a and 440b through a cam follower (not shown).

A Y-axis frame 452 formed into a substantially square shape is stored in a space surrounded by the X-axis frame 442 to be movable along the Y-axis. A pair of connecting stays 454a and 454b extend to the right from a second side (right side) 452b of the Y-frame 452. A Y-axis guide member 456 extending along the Y-axis is connected integrally with the distal ends of the connecting stays 454a and 454b.

An engaging member 458 extending inward toward the second side 442b is integrally mounted with the Y-axis guide member 456. A third ball screw 460 extending along the Y-axis is supported on the second side 442b of the X-axis frame 442 so that both ends of the ball screw 460 are pivotal. A third nut member 462 is threadably engaged with the third ball screw 460 and is fixed to the engaging member 458. One end of the third ball screw 460 is connected to a drive shaft of a Y-axis drive motor 464 stored in the second side 442 of the X-axis frame 442.

When the Y-axis drive motor 464 is started, the Y-axis frame 452 is moved and driven along the Y-axis through threadable engagement between the third ball screw 460 and the third nut member 462.

A fourth side (left side) 452d of the Y-axis frame 452 is slidably supported by the fourth side 442d of the X-axis frame 442 through a cam follower (not shown).

The rotary table 438 is supported through a plurality of guide rollers 466 in a spacer surrounded by the Y-axis frame 452 so as to be rotatable about its own axis. The rotary table 438 has a circular frame-like shape. A pair of parallel guide rod mounting stays 468a and 468b are bridged over the rotary table 430 so as to extend in the Y-axis direction. A pair of parallel guide rods 470a and 470b extending in the X-axis direction are mounted on these guide rod mounting stays 468a and 468b.

The printed circuit board 20 is mounted on the rotary table 438 while it is clamped between the two guide rods 470a and 470b.

The pair of guide rods 470a and 470b are movable along the Y-axis and are moved in accordance with a size (particularly, a length along the Y-axis) of the printed circuit board 20 to be mounted thereon, and can clamp the printed circuit board 20 from both sides. These guide rods 470a and 470b are fixed to preset positions by set screws (not shown).

A frictional drive mechanism 472 for rotating and driving the rotary table 438 is disposed on the Y-axis frame 452 located on one side (lower side in FIG. 28) of the rotary table 438.

With the above arrangement, the printed circuit table 438 is moved independently along the X- and Y-axes and is rotated about the Θ-axis, thereby matching any point on the rotary table 438 to the insertion position of the work W in the turret table device 200.

Figure 29:
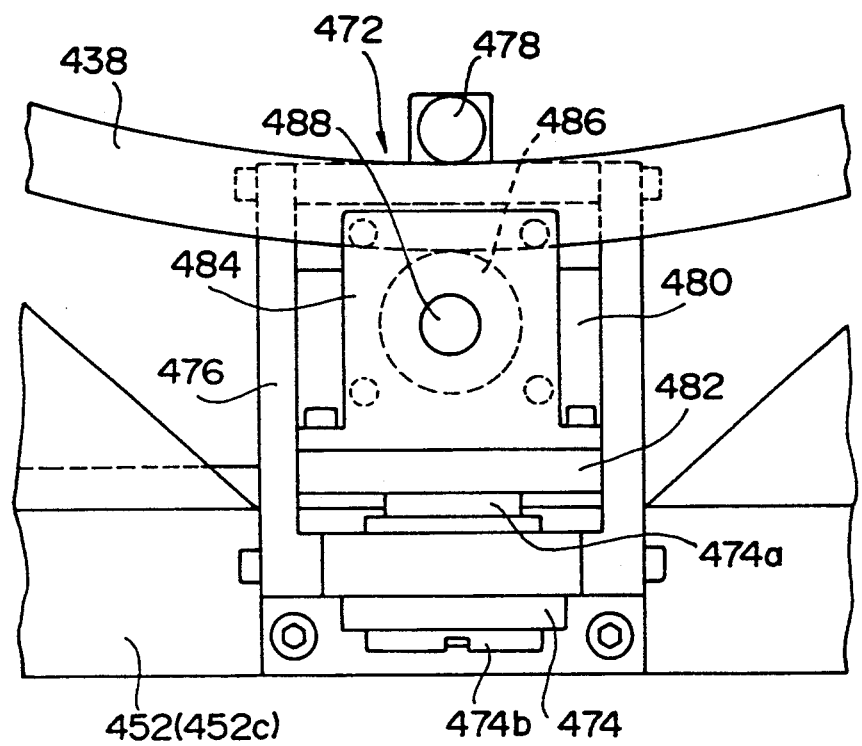
FIG. 29 is an enlarged plan view of a rotary friction drive section in the printed circuit board rotation device shown in FIG. 28.

Finally, an arrangement of the frictional drive mechanism 472 serving as a printed circuit board rotation mechanism for rotating and driving the rotary table 438 will be described in detail with reference to FIGS. 29 and 30.

The frictional drive mechanism 472 comprises a leaf spring mechanism 474 fixed on the Y-axis frame 452. The leaf spring mechanism 474 comprises a push lever 474a reciprocal along the radial direction of the rotary table 438. The push lever 474a is located outward from the rotary table 438 along the radial direction. Upon rotation of an adjusting screw 474b mounted radially outward, the push lever 474a can be radially reciprocated. That is, upon rotation of the adjusting screw 474b, an urging force can be adjusted. The leaf spring mechanism 474 is integrally mounted with both end portions of a press stay 476 having a substantially U-shaped planar section. A clamp roller 478 is axially rotatably supported inside the press stay 476 in the radial direction.

Both end portions of a guide stay 480 having a substantially U-shaped planar section are mounted integrally with the Y-axis frame 452. An intermediate portion of an upright support stay 482 is supported on the proximal end portion of the guide stay 480 to be slidable along the radial direction of the rotary table 438. That is, guide grooves 482a and 482b which respectively receive extended portions of the guide stay 480 are formed at the intermediate portions of both side edges of the support stay 482. Both the extended portions of the guide stay 480 are respectively fitted in the guide grooves 482a and 482b. Therefore, the support stay 482 can be slidably supported so as to be prevented from downward removal.

A mounting stay 484 is mounted at the upper end of the support stay 482 and extends radially inward. The upper end of a drive shaft 488 coaxially fixed with a drive roller 486 is rotatably supported on the mounting stay 484. Note that the height of the drive roller 486 is adjusted to have the same level as that of the clamp roller 478. That is, the drive roller 486 is brought into contact with the outer circumferential surface of the rotary table 438, and the clamp roller 478 is brought into rolling contact with the inner circumferential surface of the rotary table 438. The rotary table 438 is clamped between the drive roller 86 and the clamp roller 478, so that a frictional engaging force between the drive roller 486 and the rotary table 438 is defined.

A drive motor 490 for rotating and driving the drive shaft 488 is mounted at the lower end of the support stay 482. The drive motor 490 and the drive shaft 488 are connected to be matched with each other through a coupling mechanism 492. Note that the support stay 482 is urged against the rear surface (i.e., a radially outer surface) of the mounting stay 484, by the press lever 474a of the leaf spring 474.

Figure 30:
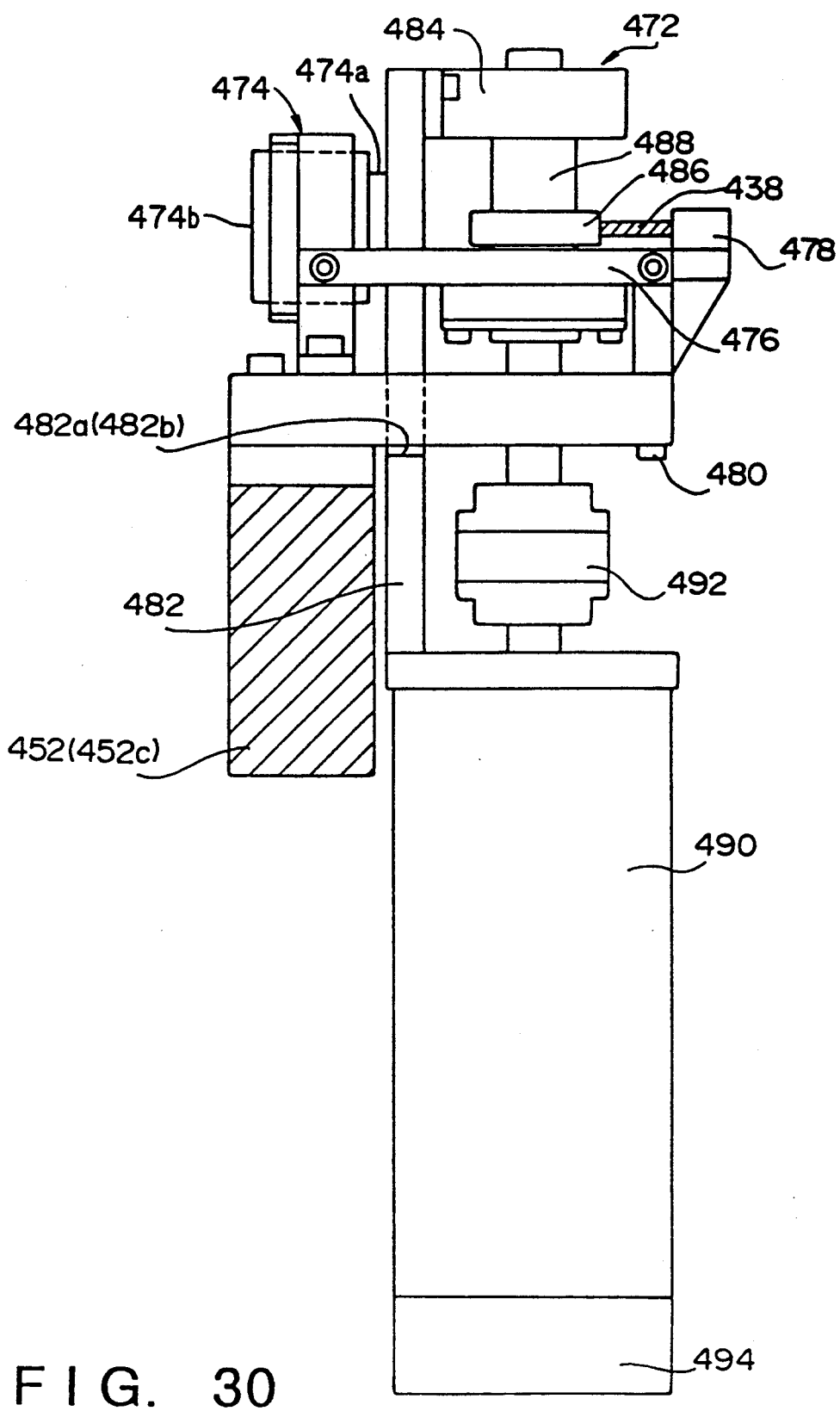
FIG. 30 is an enlarged side view of the rotary friction drive section shown in FIG. 29.

In the frictional drive mechanism 472 having the above arrangement, in a state shown in FIG. 30, upon rotation of the adjusting screw 474b of the leaf spring mechanism 474, the press lever 474a biases the support stay 482 radially inward, so that the drive roller 486 mounted on the support stay 482 is moved radially inward. Upon radially inward movement of the support stay 482, the leaf spring mechanism 474 receives a reaction force acting radially outward. As a result, the clamp roller 478 mounted on the press stay 476 is relatively moved radially outward.

As a result, the rotary table 438 receives a radially inward force from the drive roller 486 and a radially outward force from the clamp roller 478. The rotary table 438 is thus strongly clamped between the drive roller 486 and the clamp roller 478. In this manner, the rotary table 438 receives the difference between the urging forces from the rollers 486 and 478. Although the rolling force (frictional engaging force) by the drive roller 486 is increased, a shift in the center of rotation of the rotary table 438 does not occur.

When the drive motor 490 is started in a state wherein a rolling force acting from the drive roller 486 onto the rotary table 438, the drive shaft 488 is rotated and driven through the coupling mechanism 492. The drive roller 486 mounted integrally with the drive shaft 488 is rotated, and the rotary table 438 which is in rolling contact with the drive roller 486 is also rotated.

A rotary encoder 494 is mounted on the drive motor 490 to always numerically detect a drive amount of the drive motor 490, i.e., a rotation amount of the drive roller 486. The rotary table 438 is rotated and driven to a desired angular position on the basis of this detection result.

As described above in detail, in the printed circuit board rotation positioning device 400 of this embodiment, the X-axis frame 442 is driven through the X-axis drive motor 450, the Y-axis frame 452 supported on the X-axis frame 442 is driven through the Y-axis drive motor 464, and the rotary table 438 supported on the Y-axis frame 452 is driven about the Θ-axis through the frictional drive mechanism 472 having the drive motor 490. Any position of the printed circuit board 20 fixed on the rotary table 438 is shifted to a position accurately matched with the insertion position of the work W in the turret table device 200. At the same time, the angular relationship between the work W and the printed circuit board 20 can be arbitrarily set.

In the printed circuit board rotation positioning device 400 of this embodiment, the rotary table 438 is rotated and driven through the frictional drive mechanism 472 without using any belt or gear. Backlash and noise generated upon employment of a gear, as posed by a conventional mechanism, and a low-speed operation and complicated control upon employment of a belt can be satisfactorily eliminated.

The rotary table 438 and the printed circuit board 20 placed on the rotary table 438 are rotated by the arrangement of the frictional drive mechanism 472 serving as the rotation drive mechanism described above. However, when slight slip or wear occurs in a frictional contact surface (to be referred to as a P surface hereinafter) constituted by the outer circumferential surfaces of the rotary table 438 and the drive roller 486, errors caused by this are accumulated upon rotation of the rotary table 438. As a result, an angle detected by the encoder 494 becomes different from an angle corresponding to the actual angular position of the rotary table 438.

Figure 31A:
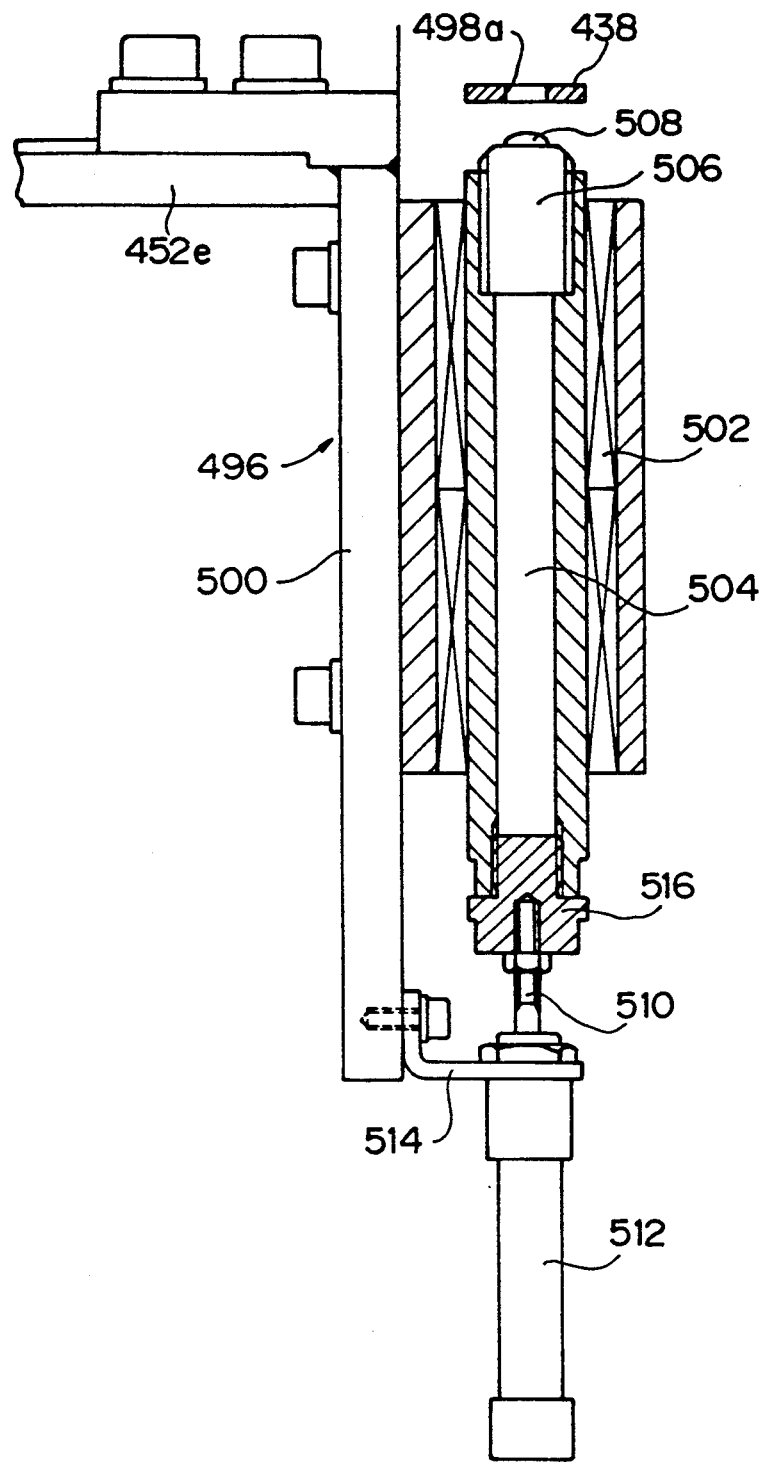
FIGS. 31A and 31B are a side sectional view and a front view, respectively, showing an error absorbing mechanism included in the printed circuit board rotation device shown in FIG. 28.

In this embodiment, an error absorbing mechanism 96 is arranged adjacent to the frictional drive mechanism 472 to absorb the errors (FIG. 31A). Stop positions of the rotary table 438 are set in units of 90°. Regulating holes 498a, 498b, 498c, and 498d are formed at four positions (i.e., 90°, 180°, 270°, and 360° (0°) positions) in correspondence with these stop positions, respectively.

Figure 31B:
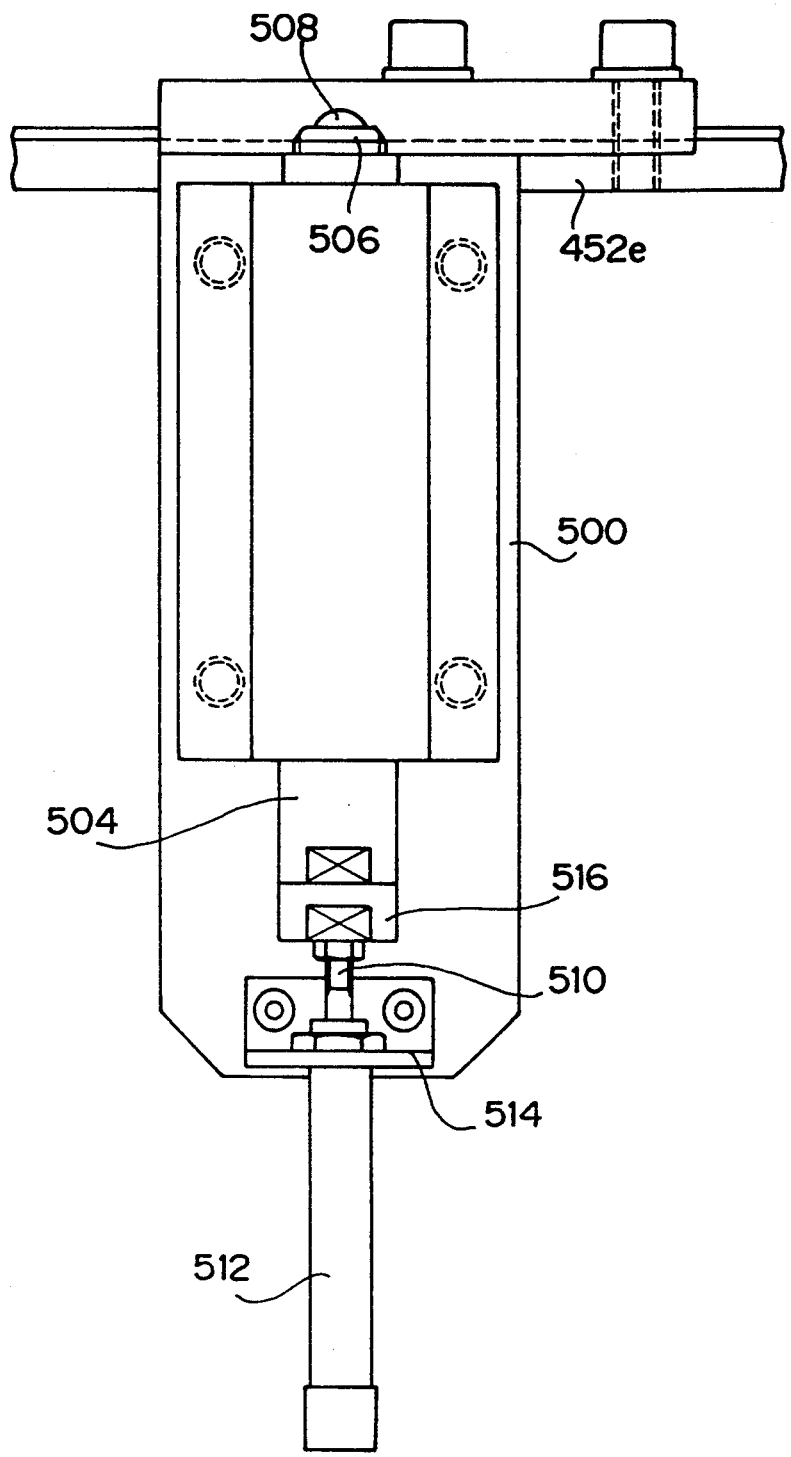

As shown, in the error absorbing mechanism 496, a vertically extending mounting member 500 in a suspended state, as shown in FIGS. 31A and 31B, is mounted on a connecting side 452e for connecting the first and fourth sides 452a and 452d of the Y-axis frame 452. A plunger rod 504 is vertically movably supported on the mounting member 500 through a slidable guide member 502. A plunger 506 is fixed to the upper end of the plunger rod 504. A semispherical positioning pin 508 is fixed on the upper surface of the plunger 506, so that the positioning pin 508 is inserted upward into one of the regulating holes 498.

A pneumatic cylinder 512 is fixed on the mounting member 500 through the mounting stay 514 to cause its piston rod 510 to be reciprocal below the plunger rod 504. The upper end of the piston rod 510 is connected to the lower end of the plunger rod 504 through a connecting rod 516.

The position of the positioning pin 508 is inserted upward into one of the four regulating holes 498a, 498b, 498c, and 498d when a corresponding one of the four 90°, 180°, 270°, and 360° positions on the rotary table 438 is set, so that the angular position of the rotary table 438 can be accurately defined.

The error absorbing mechanism 496 is arranged as described above. Even if slip or wear occurs on the P surface, the error can be corrected every time the rotary table 438 is stopped at each target position. The errors will not be accumulated, and the angle detected by the encoder 494 accurately coincides with the actual angle on the rotary table 438.

As described above, in this embodiment, every time the rotary table 438 is stopped at each target angular position, the error generated between the detection position and the actual position is mechanically eliminated by the error absorbing mechanism 496 on the basis of slip occurring on the P surface between the drive roller 486 and the rotary table 438. Therefore, error accumulation can be perfectly prevented. An accurate rotational operation of the rotary table 438, i.e., positioning of the angular position of the printed circuit board 20 placed on the rotary table 438, can be achieved.

In this embodiment, a correction mechanism for correcting slip or the like on the P surface comprises the error absorbing mechanism 496. For this reason, the rotary table 438 can be accurately rotated by frictional driving, and a low-noise, backlash-free, compact positioning mechanism for the printed circuit board 20 can be realized.

In the above embodiment, for example, since the rotary table 438 is stopped at each position as an integer multiple of 90°, the four regulating holes, i.e., holes spaced in units of 90° are formed in the rotary table 438. However, the present invention is not limited to this arrangement. For example, when the rotary table 438 is stopped at each position as an integer multiple of 45°, eight regulating holes may be formed at equal angular intervals. It is essential to form regulating holes in the rotary table 438 in accordance with angular stop positions.

In the above embodiment, the error absorbing mechanism 496 is described to be operated at every stop of the rotary table 438. However, the present invention is not limited to this. Error correction may be performed every two stops, every three stops, or every plurality of stops. Error correction may be performed during the first stop operation performed when a predetermined period of time has elapsed. Alternatively, error correction may be performed in the first stop operation when the rotary table is rotated by a predetermined rotation amount.

In the above embodiment, the X-axis frame 442, the Y-axis frame 452, and the rotary table 438 are stacked in the order named. However, the present invention is not limited this arrangement. For example, the rotary table 438, the Y-axis frame 452, the X-axis frame 442 may be stacked in this named order.

The timing, at which an angular position of the rotary table 438, upon fitting of the positioning pin 508 into one of the regulating holes may be given after the fitting operation or prior to the lock operation of a servo system of the drive motor 490 if the slip amount per revolution is very small, is known.

In the above embodiment, the drive roller 486 is brought into contact with the rotary table 438 laterally (with respect to the radial direction). However, the present invention is not limited to this. The drive roller 486 may be urged against the rotary table 438 from above.

<System Control>

The arrangements, operations and individual control operations of the parts feed device 100, the turret table device 200, the clinch device 300, the positioning device 400 (so-called X-Y-Θ table), and the like, as individual constituting devices of the mounting system 10, have been described above. Coordinate operations of the individual devices and interaction therebetween will be briefly described to clarify system control by a control device 21.

Main motor devices as control targets shown in FIGS. 1 to 31B are shown in FIG. 32 and will be described below. The turret table device 200 includes the turret table (drive) motor 219, the pickup cam (drive) motor 292, and the insertion cam (drive) motor 236. The clinch device 300 includes the motor 344 for rotating a table having a clinch head, and the motor 382 for driving a cam for vertically moving the clinch head. The positioning device 400 includes the X-axis (drive) motor 450, the Y-axis (drive) motor 464, and the Θ-axis (drive)

motor 490. The parts feed device 100 includes the drive motor 145 for moving and driving a plurality of sticks S (up to twenty types) mounted with parts in the Z-axis direction.

Figure 33:
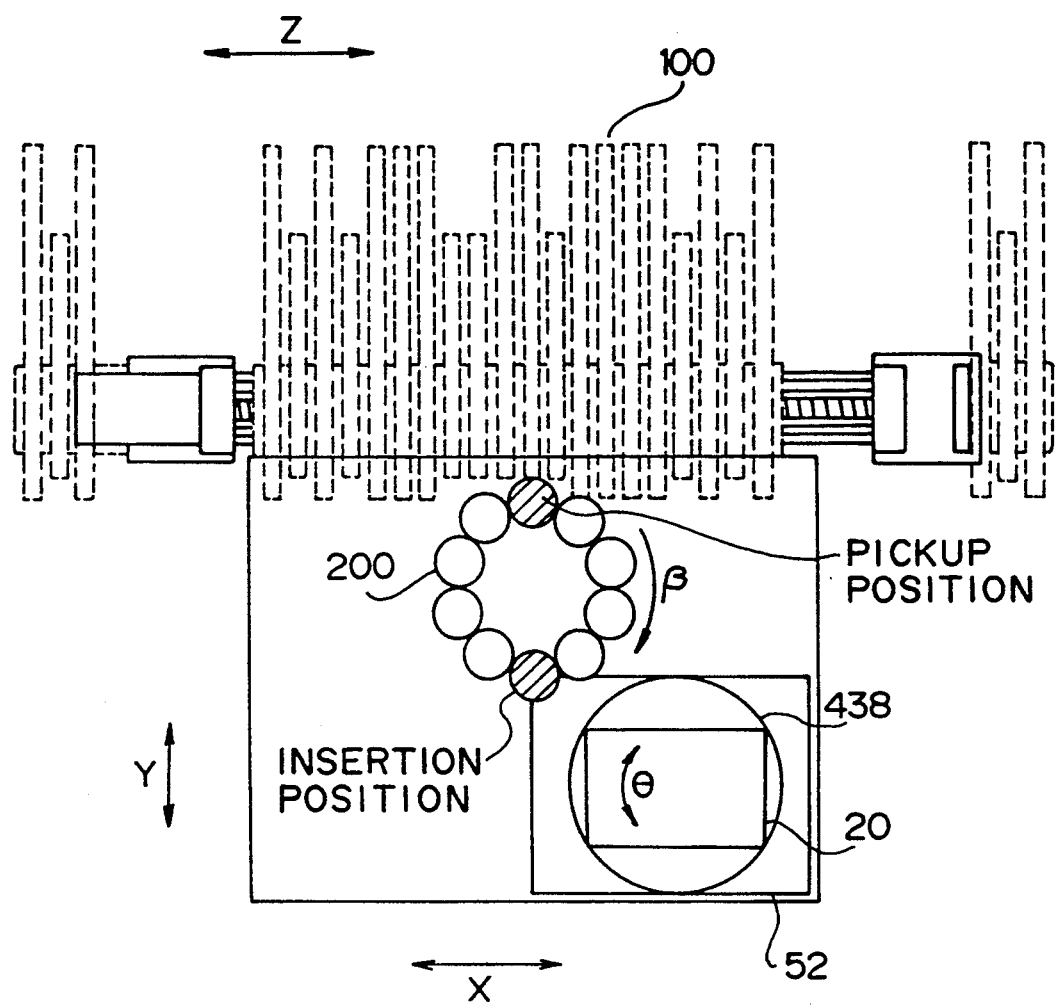
FIG. 33 is a view showing a relationship between pickup and insertion positions and a mounting position.

FIG. 33 shows a positional relationship between a stick movement direction Z of the parts feed device 100 and the positioning directions X, Y, and Θ of the positioning device 400 with respect to the turret table device 200. A so-called pickup position where a work is transferred from the feed device 100 to the turret table device 200 is fixed. The parts feed device 100 moves the sticks to the turret table device 200 with the works requested by a command from the control device 21. On the other hand, in the turret table device 200, ten heads are rotated in the β direction (FIG. 33). If a head coming to the pickup position is requested to grip a work requested by the control device 21, this head grips the work.

As shown in FIG. 33, in the turret table device 200, a head position (i.e., the insertion position) on the turret table 217 upon mounting of the work gripped by the head on the printed circuit board 20 is also fixed. The positioning device 400 adjusts such that the positions of the through holes of the work (e.g., an IC chip) to be mounted on the printed circuit board 20 are located immediately below the "insertion position".

Control Functions

The main functions of the control device 21 in the mounting system shown in FIG. 1 are summarized as follows.

(1) The pickup operation, the clinch operation, and the printed circuit board positioning operation in the turret table device 200 are systematically combined and are synchronously performed.

In the turret table device 200, a work from the parts feed device 100 is transferred to one head in the turret table device 200 at the pickup position. The rotary table 438 is moved in the X, Y, and Θ directions by the positioning device 400 while the work gripped by the head upon rotation of the turret table 217 reaches the "insertion position", so that the position of the work to be mounted on the printed circuit board 20 is located immediately below the "insertion position". The work is then inserted. As shown in FIG. 1, although the clinch device 300 is not illustrated, the turret table 217 of the turret table device 200 is rotated synchronously with the turret table 342 of the clinch device 300. The clinch operation is performed after the work is inserted on the printed circuit board 20.

(2-1) Another feature of the system of this embodiment aims at maintaining a mounting order of the works designated by an operator even if the turret table device 200 inserts the works on the printed circuit board 20.

For this purpose, there are provided a table for storing programs describing mounting procedures (to be referred to as a process table PT hereinafter in this embodiment) and a table for managing information associated with all heads on the turret table 217 (to be referred to as an insertion information table IT in this embodiment). Since the mounting order is maintained, the following effects are obtained.

An operation which requires the highest precision is an operation for positioning the printed circuit board 20 by means of the positioning device 400. Most of the tact time is the positioning time. If a mounting order is kept maintained, precision and tact time which are expected at the time of design of the mounting order can be obtained. That is, with this arrangement, the only operation performed by an operator throughout the mounting system is to set an efficient mounting order. The operator need not consider other factors. In other words, an increase in throughput of the mounting system can be easily achieved.

(2-2) Still another object of this embodiment is to eliminate dummy pickup operations by managing the above two tables.

That is, in this embodiment, the system has a function of eliminating the drawbacks in a conventional turret type mounting apparatus having the fixed "pickup position" and the fixed "insertion position". According to this function, at the "pickup position" or the "insertion position", the operation for stopping the turret table 217 at every step, which operation is indispensable in the conventional apparatus, can be eliminated. For this reason, a more efficient pickup/insertion operation than that in the conventional turret device can be performed.

(2-3) Since the tables PT and IT are managed to cause the control device 21 to perform autonomous control in accordance with the designed mounting order corresponding to a specific printed circuit board 20, teaching operations which are required in a conventional system can be eliminated.

(3) An emergency stop function is added to the system of this embodiment. This function is performed when the head unit 218 or the mechanism for vertically moving the head unit in the head turret device 200 is damaged, or when all sticks for a given type of work in the parts feed device 100 become empty.

General Description of Pickup Operation/Insertion Operation

A control operation of the control device 200 for a pickup operation/insertion operation in the turret table device 200 will be briefly described with reference to FIGS. 34 to 37C.

FIG. 34 shows an arrangement of the process table (to be referred to as a PT hereinafter) for storing a mounting sequence programmed by an operator. The process table PT is stored in a memory 21a in the control device 21. Referring to FIG. 34, reference symbols $S_1, S_2, \ldots$ denote a mounting order. The maximum value of the mounting order is represented by $S_{MAX}$. Reference symbols X, Y, and Θ represent printed circuit board positions where works are inserted in accordance with the process order S and are transmitted to the positioning device 400. Reference symbol Z denotes a stick number in the parts feed device 100. A specific work can be designated by Z. Information Z is transmitted to the parts feed device 100. The feed device 100 moves the designated stick to the pickup position upon reception of the information Z.

Reference symbol HD denotes a number assigned to each head unit 218 in the turret table device 200. For example, 16-pin DIP, 22-pin DIP, and QUIP heads are attached to the corresponding head units 218. A correspondence between the head units and the types of works is known to the operator since he or she inputs the sequence shown in FIG. 34.

Each entry point of the table PT is designated by a pointer SP (sequence pointer).

FIG. 35 shows an arrangement of the insertion table (to be referred to as an IT hereinafter). The table IT includes information representing that the head unit 218, which grips a work, and information (X,Y,Θ) representing a specific insertion position of the work on the printed circuit board 20. A storage position of the above information associated with the head in the table IT is represented by, e.g., P(1), which represents a head information position of head number 1. This table IT is generated by the control device 21 in accordance with the control program of FIGS. 39A and 39B on the basis of the process table PT of FIG. 34.

As will be apparent from the subsequent operation, information representing a mounting order is not explicitly set in the table IT. However, the position of the information in the table IT itself implicitly indicates the mounting order. This is a technical background wherein a mounting order designed by the operator is maintained in this embodiment.

Note that each entry point of the table IT is designated by a pointer IP (insertion pointer).

A change in the table IT of FIG. 35 and changes in angular positions of the head units 218 of the turret table device 200, and changes in gripping states of the head upon operation of the turret table device 200 in accordance with the mounting order shown in FIG. 34 will be described with reference to FIGS. 36A to 37B.

An $S_1$ mounting command from the table PT is accessed. In this command, a work for $Z=1$ is requested to be gripped by a head having head number 1. A description will be made with reference to FIGS. 39A and 39B together with a state (a) of FIG. 36A and a state (a) of 37A. A dot marked with each head number represents that this head grips a work in FIG. 36A and the like.

The control device 21 sends to the feed device 100 a command representing that the stick designated with $Z=1$ comes to the pickup position. When the turret table 217 is rotated to cause the first head to reach the "pickup position", the first head of the turret table device 200 grips the work for $Z=1$ (state (a) of FIG. 36A). In the state (a) of FIG. 37A, insertion position information X,Y,Θ of the work for $Z=1$ is stored at P(1) in the table IT. Since the work of the procedure $S_1$ is gripped by the first head, the pointer SP of the table PT is incremented by one.

An $S_2$ command is accessed from the table PT. This command is to cause the second head to grip the work for $Z=2$. Since a head next to the first head is the second head, the second head grips the work for $Z=2$ upon rotation of the turret table 217 by one pitch. This state is shown as a state (b) of FIG. 36A or a state (b) of FIG. 37A.

An $S_3$ command is then accessed. This command causes the fifth head to grip a work for $Z=3$. In order to execute this command, the turret table 217 is rotated until the fifth head reaches the "pickup position", i.e., by 3 pitches ($=36°\times3=108°$). During rotation by three pitches, no heads which come to the "insertion position" grip any works. For example, if the third head is located at the "pickup position", the head located at the "insertion position" is the eighth head. When the fourth head is located at the "pickup position", the head located at the "insertion position" is the ninth head. Neither the eighth nor ninth heads have works in the case shown in FIG. 36A. In other words, the turret table 217 is rotated by three pitches ($=108°$) from the state (b) of FIG. 36A, and the fifth head reaching the "pickup position" grips the work for $Z=3$. The state set upon rotation by three pitches is shown as a state (c) of FIG. 36A or a state (c) of FIG. 37A.

An $S_4$ mounting command is accessed. This command causes the sixth head to grip a work for $Z=4$. In this case, an operation for causing the sixth head to pick up the work is performed simultaneously with an operation for inserting a work gripped by the first head. In a state (d) of FIG. 36A and a state (e) of FIG. 36B, for illustrative convenience, the work is gripped by the sixth head, and the work gripped by the first head is then inserted.

An $S_3$ command in FIG. 34 is accessed. This command causes the ninth head to grip a work for $Z=5$. Since the work is fed to the sixth head in the state (e) of FIG. 36B, the turret table 217 must be rotated by an additional three pitches until the ninth head reaches the "pickup position". That is, even if preparation of the work for $Z=5$ is completed in the feed device 100 until the ninth head reaches the "pickup position", a pickup operation must be postponed. In other words, during a period from a time when the sixth head is located at the "pickup position" to time when the ninth head reaches the "pickup position", the second, third, and fourth heads sequentially reach the "insertion position".

When the second head reaches the "insertion position", the work gripped by the second head is inserted on the printed circuit board. This state is shown as a state (f) of FIG. 36B and a state (f) of FIG. 37B.

Upon rotation of the turret table by two pitches, when the ninth head reaches the "pickup position", the work for $Z=5$ is gripped by the ninth head. This state is shown as a state (g) of FIG. 36B and a state (g) of FIG. 37B.

An $S_6$ command is then accessed. This command cause the tenth head to grip a work for $Z=6$. Upon rotation of the turret table by one pitch, this work is gripped by the tenth head. This state is shown in a state (h) of FIG. 36B and a state (h) of FIG. 37B.

Figure 36A:
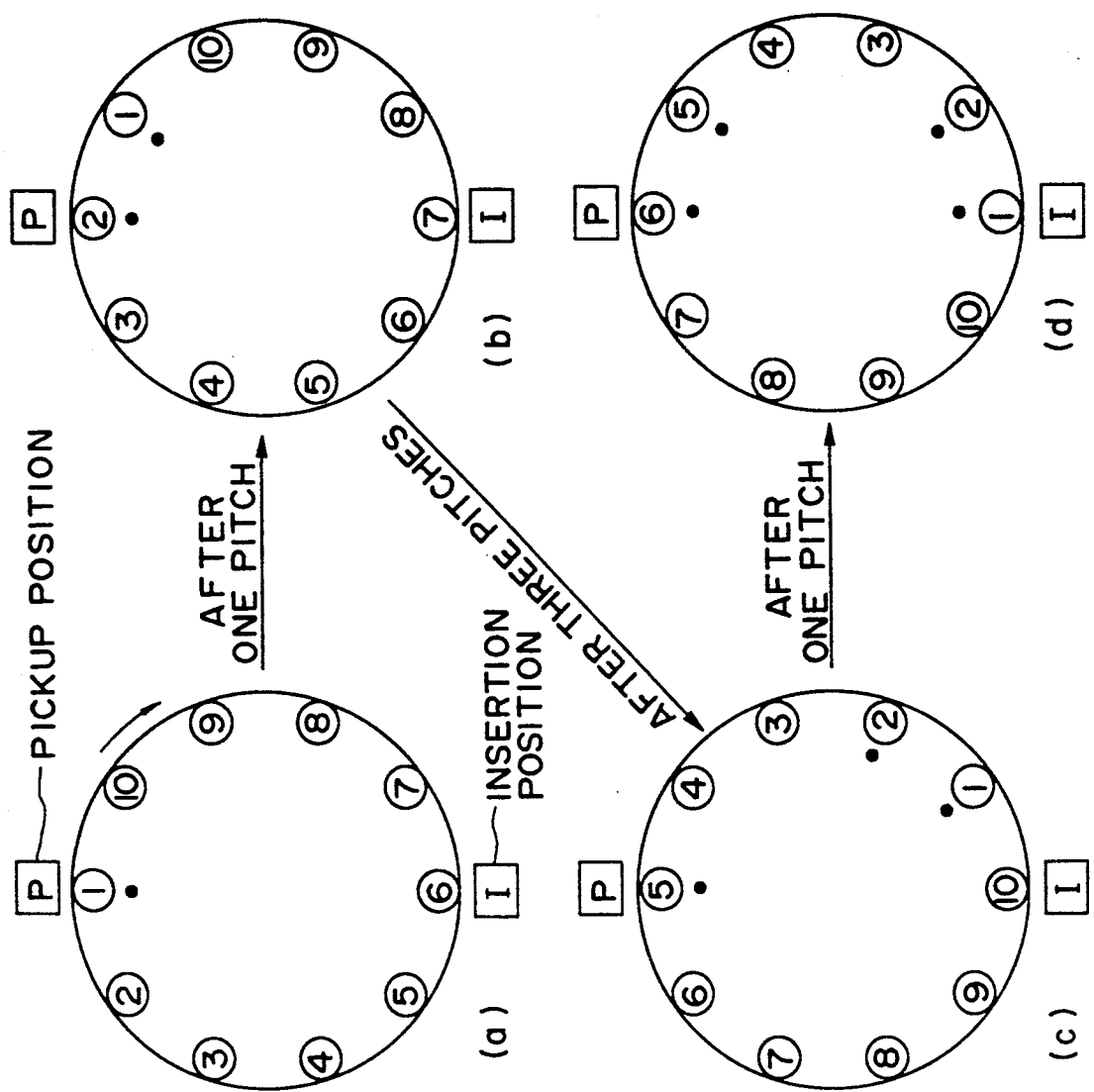
FIGS. 36A to 36C are views for briefly explaining pickup and insertion operations in consideration of a positional relationship between head units.
Figure 36B:
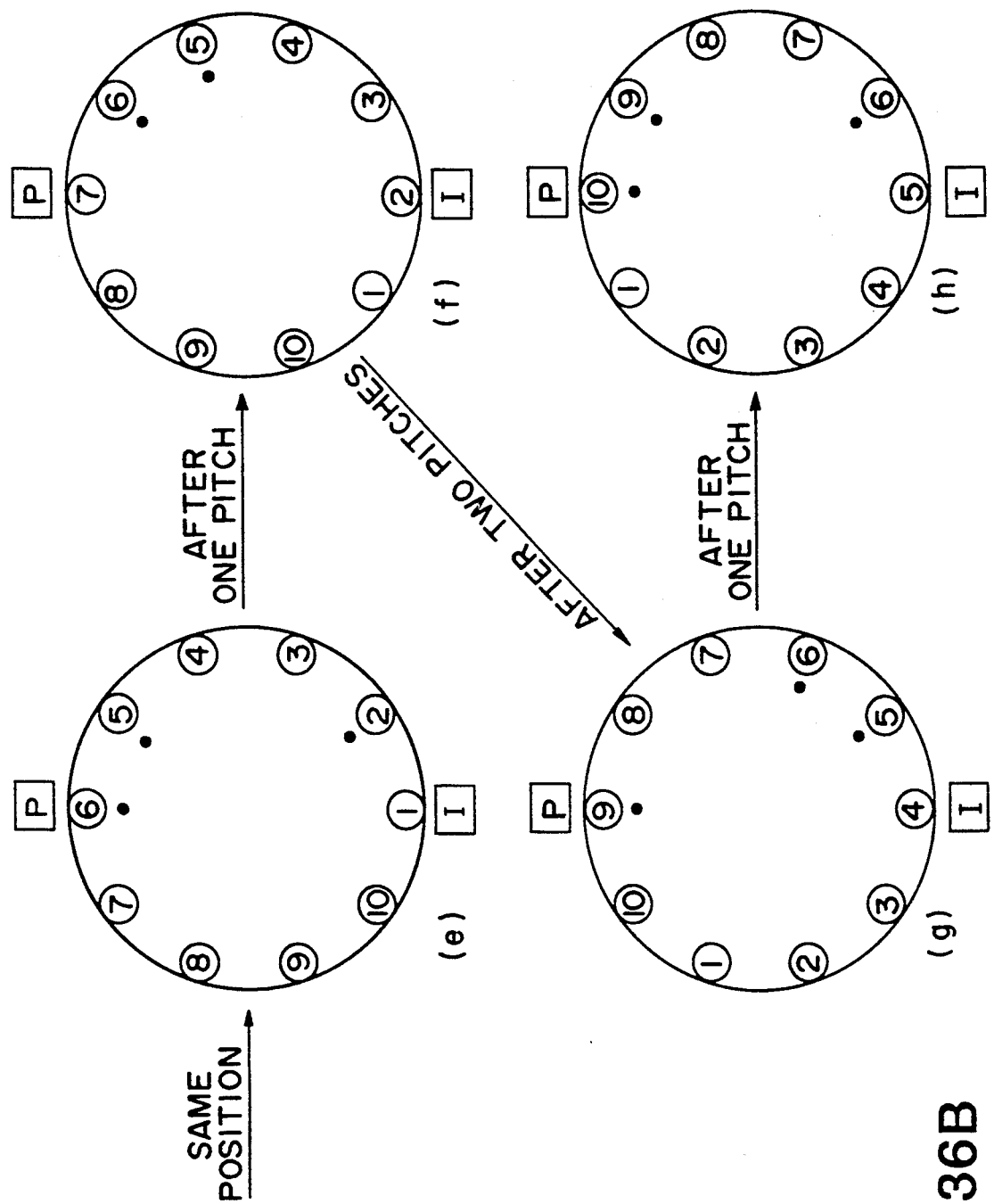
Figure 36C:
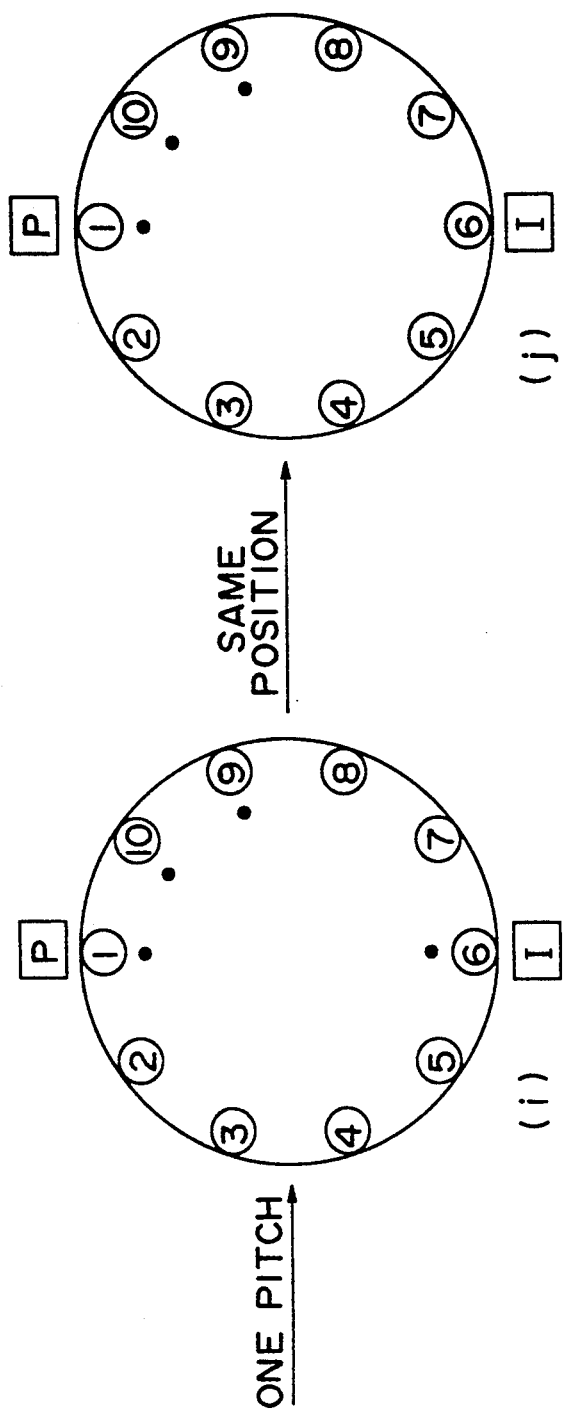

When an $S_7$ command is accessed, a head state is changed from the state (h) of FIG. 36B to states (i) and (j) of FIG. 36C. In this case, the table IT is changed from the state (h) of FIG. 37B to states (i) and (j) of FIG. 37C.

In the pickup and insertion operations described above, it is important to determine the necessity of the pickup operation corresponding to each mounting command S and the necessity of the insertion operation. These determination operations will be described below.

Assume that the turret table 217 is stopped at a given position. In the control operations of FIGS. 36A to 37C, the turret table 217 is rotated by a predetermined unit angle ($=36°$) prior to actual rotation of the turret table 217. The determination for the necessity of the pickup operation, corresponding to the mounting command S, is to determine whether a mounting command for causing a head supposed to come to the "pickup position" to grip a work is present within the table PT. The determination for the necessity of the insertion operation is to determine whether a head supposed to come to the "insertion position" actually grips a work to be inserted. These determination operations are simultaneously performed.

If both results of these determination operations are negative, assume that the head turret table 217 is further rotated by the unit rotation angle ($=36°$), and the two determination operations as described above are performed again.

The above operations are repeated until the mounting command S for causing a head to come to the "pickup position" to grip the work is determined to be present in the table, or until a head moved to come to the "insertion position" actually grips a work. Every time both determination operations are negative, a negative count is stored. As will be apparent from the following description, the negative count is stored in a counter n.

Assume that one of the results of the determination operations is affirmative. If a current negative count is n, a head subjected to grip a work comes to the "pickup position" or a head which actually grips the work to be inserted comes to the "insertion position" when the table 217 is rotated by 36°×n. The turret table 217 is rotated by 36°×n, and the pickup operation (FIG. 40B), the insertion operation (FIG. 40A), or the pickup & insertion operation (FIGS. 40CA and 40CB) is performed.

Multitask Control

Control of the control device 21 for the head turret table device 200, the clinch device 300, the positioning device 400, and the parts feed device 100 is performed in accordance with a multitask scheme. FIG. 38 shows a relationship between tasks for controlling the entire system, i.e., a correspondence between tasks and components (motors) under the control of the control device 21. Note that sensors, actuators, and the like serving as control targets in FIG. 38 are omitted. As can be apparent from a comparison between FIG. 38 and FIG. 32, the tasks and the components do not have any one-to-one correspondence because there are components which can be simultaneously controlled even within each individual device. It is more effective to simultaneously control the components by different tasks.

As shown in FIG. 38, four tasks are simultaneously operated under the control of a multitask OS (Operating System).

Figure 39B:
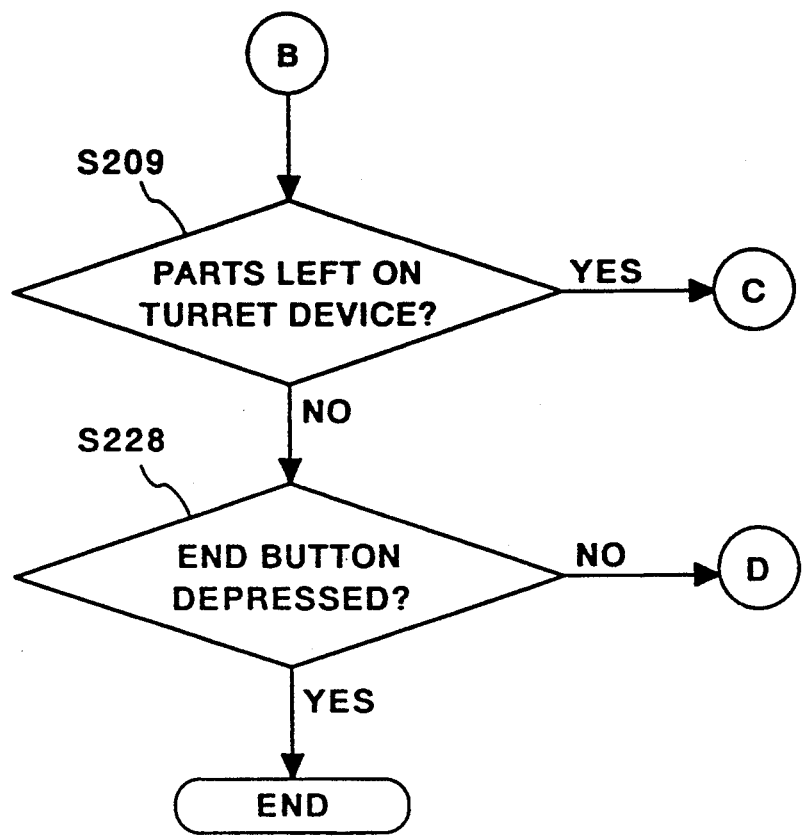
Figure 40A:
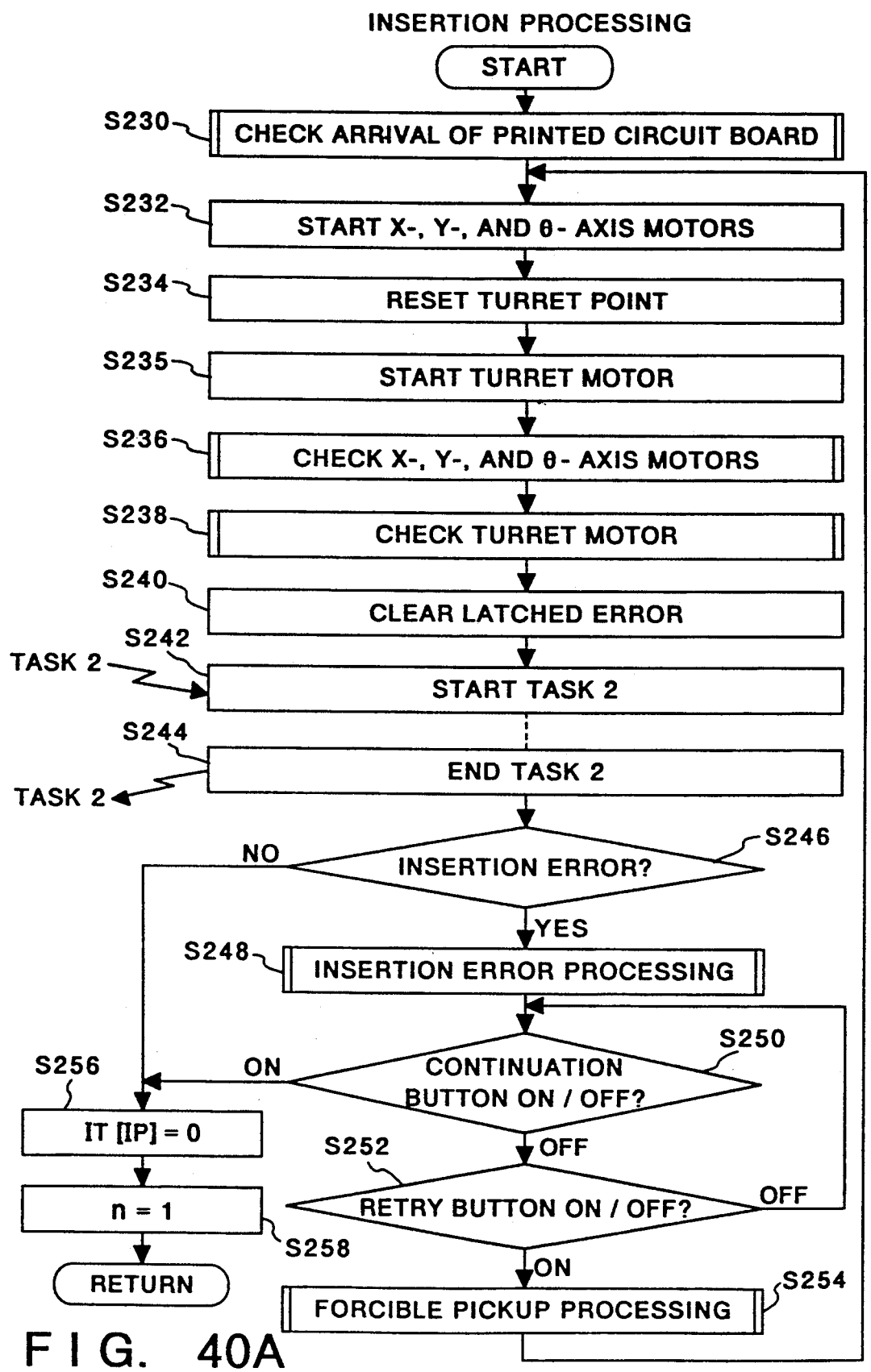
FIG. 40A is a flow chart showing a control sequence of insertion processing.

Task (TASK) 1 controls the X-, Y-, and Θ-axis motors 450, 464, and 490 of the positioning device 400, the stick movement motor 145 (Z-axis motor) of the feed device 100, the motor 219 for rotating the turret table 217, and the motor 344 for rotating the table 342 having the clinch head. The detailed content of TASK 1 is shown in FIGS. 39A and 39B and includes three subroutines, i.e., insertion processing (FIG. 40A), pickup processing (FIG. 40B), and pickup & insertion processing (FIGS. 40CA and CB).

TASK 2 controls the insertion cam motor 236 and the clinch cam motor 382.

TASK 3 controls the pickup cam motor 292. TASK 4 controls a motor (not shown) of a printed circuit board convey mechanism.

TASK 1 serves as a master task, while TASK 2, TASK 3, and TASK 4 serve as slave tasks. More specifically, TASK 1 waits until another task is started and a result is transmitted to TASK 1 from the started task, as needed. TASK 1 continues its own control upon reception of the result from another task. In other words, a flag representing a task enable state is assigned to each task, and simultaneous operations between tasks whose flags are enabled are permitted by the OS (Operating System). When a plurality of tasks can be executed simultaneously, these tasks are executed in a given order. When these tasks are completely executed by one cycle, the execution order of the executable tasks is sequentially shifted in accordance with a so-called round robin scheme. Alternatively, a given task is executed until a result of another task is obtained. That is, a synchronous operation between the tasks can be achieved by checking information in a common inter- task mail box in accordance with a so-called TEST & WAIT scheme.

TASK 1

An operation of TASK 1 will be described with reference to FIG. 39A. TASK 1 is started upon depression of a run button on an operation panel 250 shown in FIG. 1. The mounting command program shown in FIG. 34 is restored in the table PT.

In step S200, the start positions of the head turret table 217 and the clinch turret table 342 are checked. In this embodiment, at the start time of the program, the tenth head of the head device 200 is located at the "pickup position", and the fifth clinch head is located at the "insertion position".

In step S202, the process table PT is cleared. In step S204, TASK 4 is started to instruct a convey device (loader) so that the printed circuit board 20 to be mounted with works is loaded on the printed circuit board positioning table or rotary table 438 (the program sequence of TASK 4 is not specifically illustrated). A table which carries the printed circuit board 20 is moved to the printed circuit board positioning table 438, and this printed circuit board is shifted to the table 438 and is placed at a predetermined position thereon. When the printed circuit board is placed on the table 438, TASK 4 sets a flag (assigned in the memory of the control device 21) representing that the printed circuit board is placed on the table 438.

In step S206, initialization is performed. In this initialization, the order pointer SP representing the entry point of the process table and the counter PP representing the head number corresponding to the "pickup position" are set to "1", the pointer IP (this pointer also represents the head number corresponding to the "insertion position") is set to "6", and counter n is set to "1". The counters PP and the pointer IP store the head number corresponding to a head which comes to the predetermined position upon rotation of the turret table 217 by one pitch. The above initialization operations are required because the tenth head of the head device is located at the "pickup position", and the fifth clinch head is located at the "insertion position", as described with reference to step S200.

It is determined in step S208 whether the pointer SP represents the last line of the mounting order program table PT. Since NO in step S208, the flow advances to step S210. One command is accessed from the table PT. This command to be accessed from the table PT is designated by the pointer SP. The pointer SP is initialized to "1" in step S206.

In step S212, HD information of the entry point of the process table PT which is designated by the pointer SP is compared with the counter PP representing the head number of a head which comes to the "pickup position" next. The HD information is represented as follows:

*HD: PT [SP]* where [SP] indicates that the table PT is indexed by SP.

When it is determined in step S212 that a coincidence is established, the head type (defined by the HD number) requested by the mounting command coincides with the head type of the head which comes to the "pickup position" (defined by the PP counter) next. In the case of FIG. 34, in response to the $S_1$ mounting command, the following operations are performed:

$HD:PT\,[SP] = 1,$ $PP = 1$

In this case, the designated work should be gripped by this head unit. In step S213, the X,Y,Θ data portion of the mounting command is stored in the table IT. That is, $IT\,[PP] = PT\,[SP]$ The flow advances to step S214 to determine whether, of all the entries of the insertion table IT, significant data is present in the entry designated by the insertion pointer IP. An entry having significant data is exemplified as an entry for data except for all "0"s in the IT in FIG. 35. The pointer IP is initialized to "6" in step S206. In the case of FIG. 34, until the $S_4$ command is executed, i.e., until IP=1 is established in the case of FIG. 34, YES cannot be obtained in step S214. The flow advances to step S216, and pickup processing is performed. The pickup processing will be described in detail later. The flow advances from step S216 to step S217 to count up the pointer SP. That is, SP=SP+1.

Pickup Processing

Figure 40B:
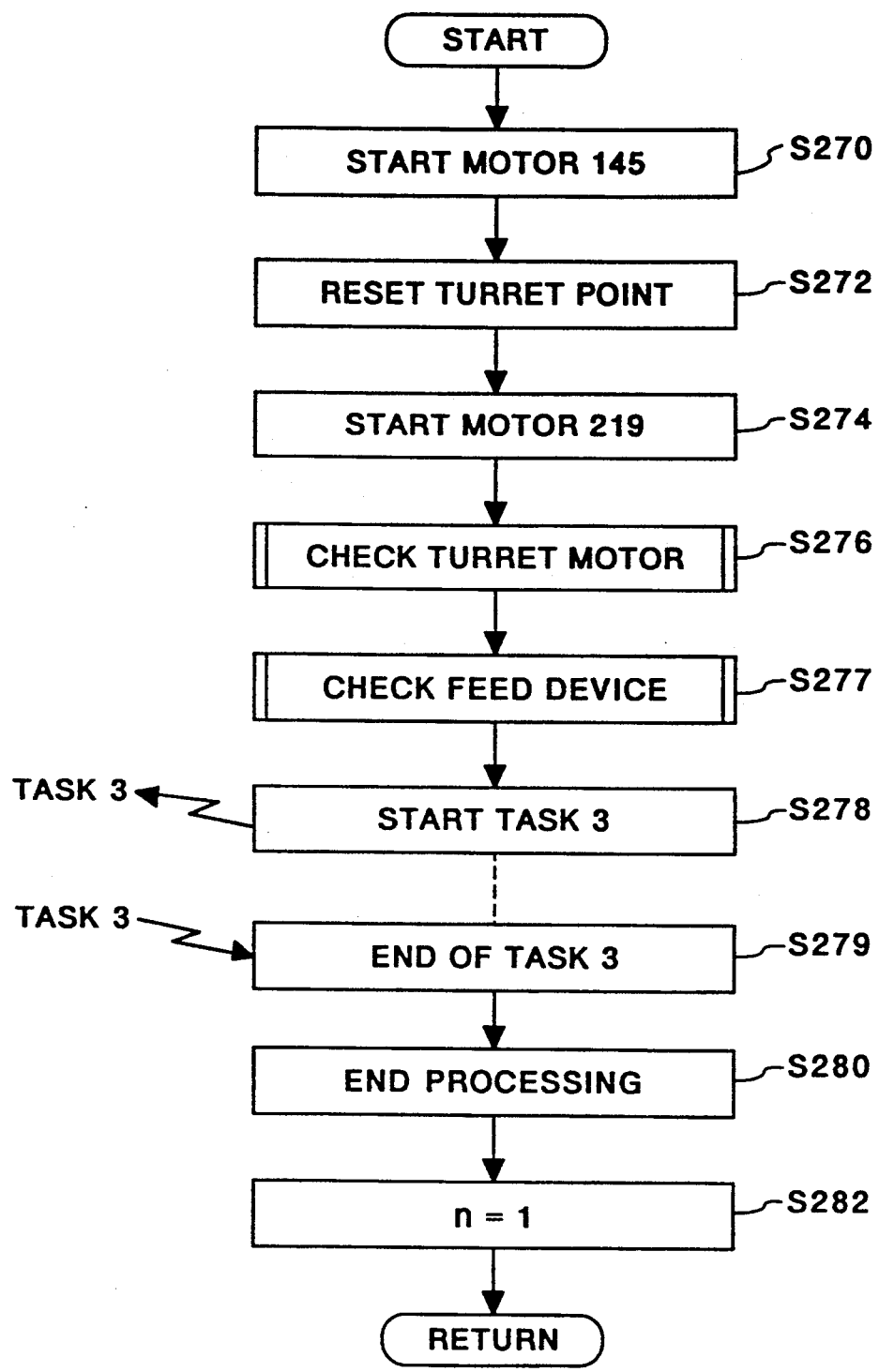
FIG. 40B is a flow chart showing a control sequence of pickup processing.
Figure 40C:
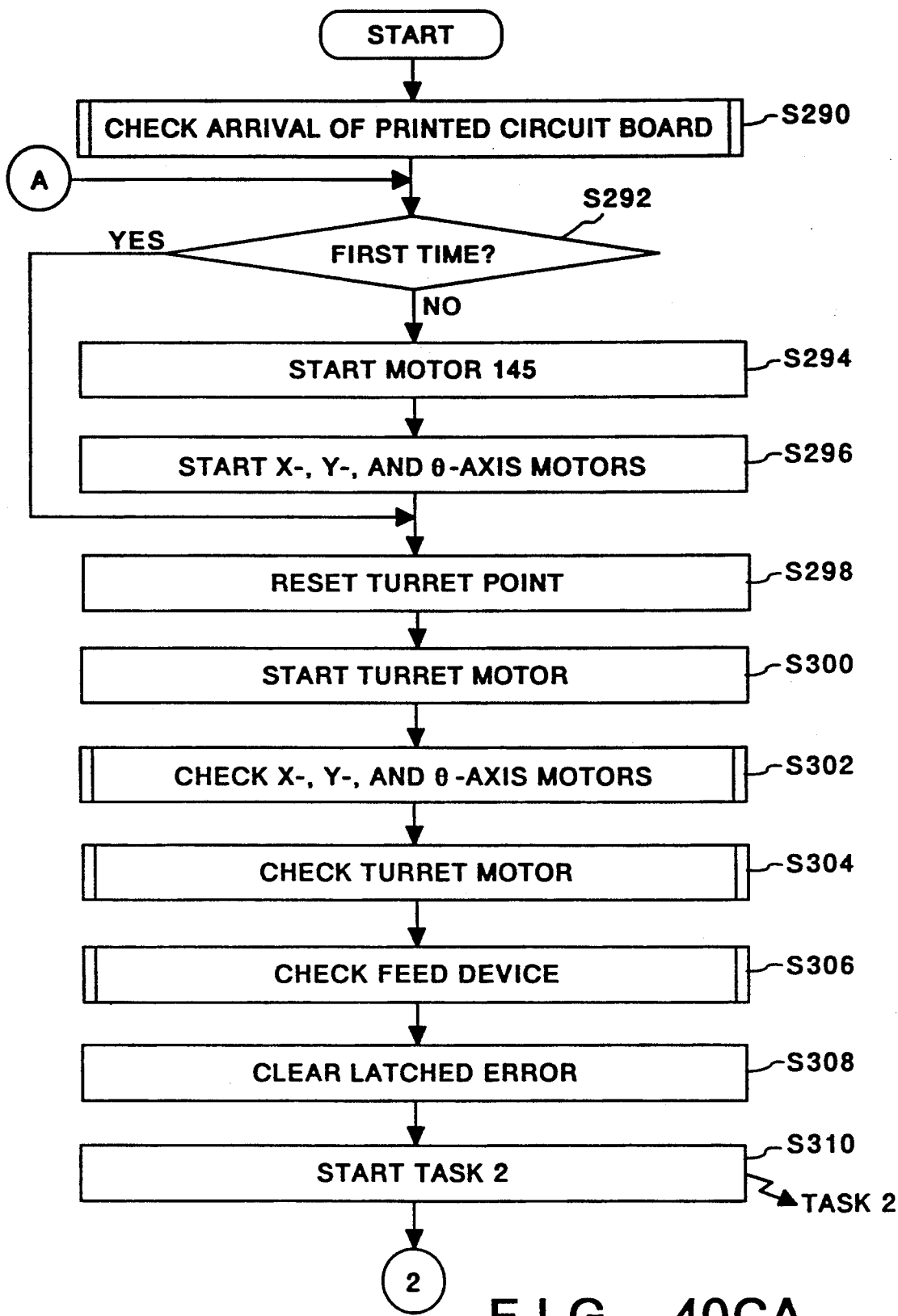
FIGS. 40CA and 40CB are flow charts showing a control sequence of pickup & insertion processing.
Figure 40C:
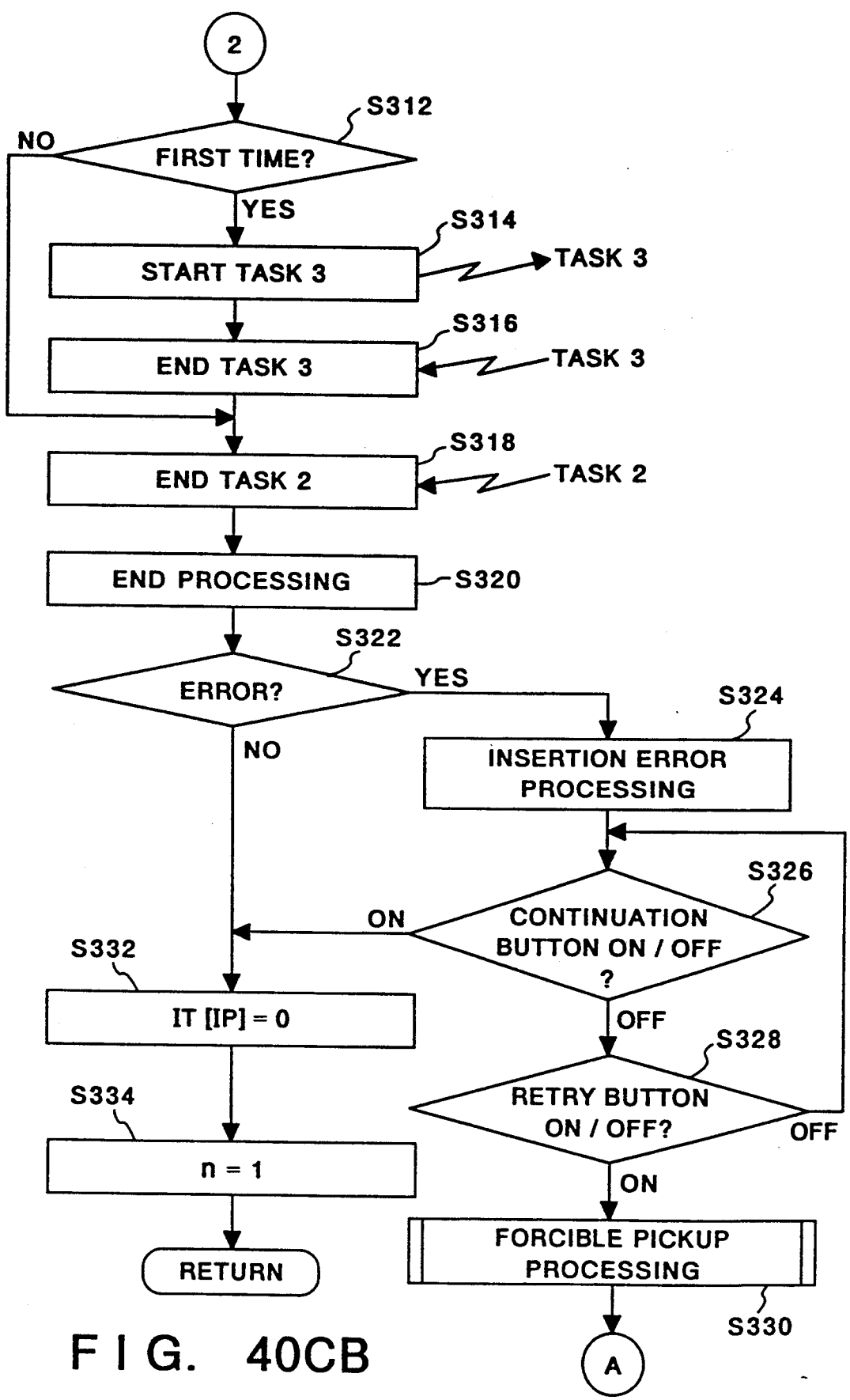

The detailed content of the pickup processing is shown in FIG. 40B. In the pickup processing, in order to allow the head device 200 to pick up a required work, the stick which stores this type of work is moved to the pickup position, and the work located at the standby position $P_1$ must be dropped to the separation position $P_1$ (FIG. 5) in the feed device 100. In the head turret device 200, in order to move the predetermined head to the pickup position so as to grip the separated work, the turret table 217 must be rotated.

For this purpose, a start signal for the Z-axis motor 145 in the feed device 100 is supplied in step S270 of FIG. 40B. The motor 145 is then rotated.

The information Z is supplied to a servo control circuit for the motor 145 in the feed device 100. Z represents a position of the stick number corresponding to the work requested to be picked up and can be readily understood by the operator. The stick number Z is converted into a rotation stop position Z of the motor 145 upon creation of a program.

In step S272, the turret point is reset. Prior to rotation of the motor 219, a rotation amount (36°×n) is calculated, where n is a count determined such that neither insertion nor pickup operations are performed during a period from the time when the turret table 213 is rotated previously to the time when the turret table 213 is rotated this time. In the case of FIG. 34, "1" set in step S206 is set in the counter n. In step S274, the head turret motor 219 is started.

By the above control operations, the motor 145 is rotated in the feed device 100, and the motor 219 is rotated in the head turret device 200. That is, upon simultaneous rotation of the two motors, simultaneous processing can be achieved.

It is then checked in step S276 whether the turret motor 219 is stopped. This check control is shown in FIG. 46A in detail. Control of FIG. 46A will be described later in association with emergency stop control.

Figure 44:
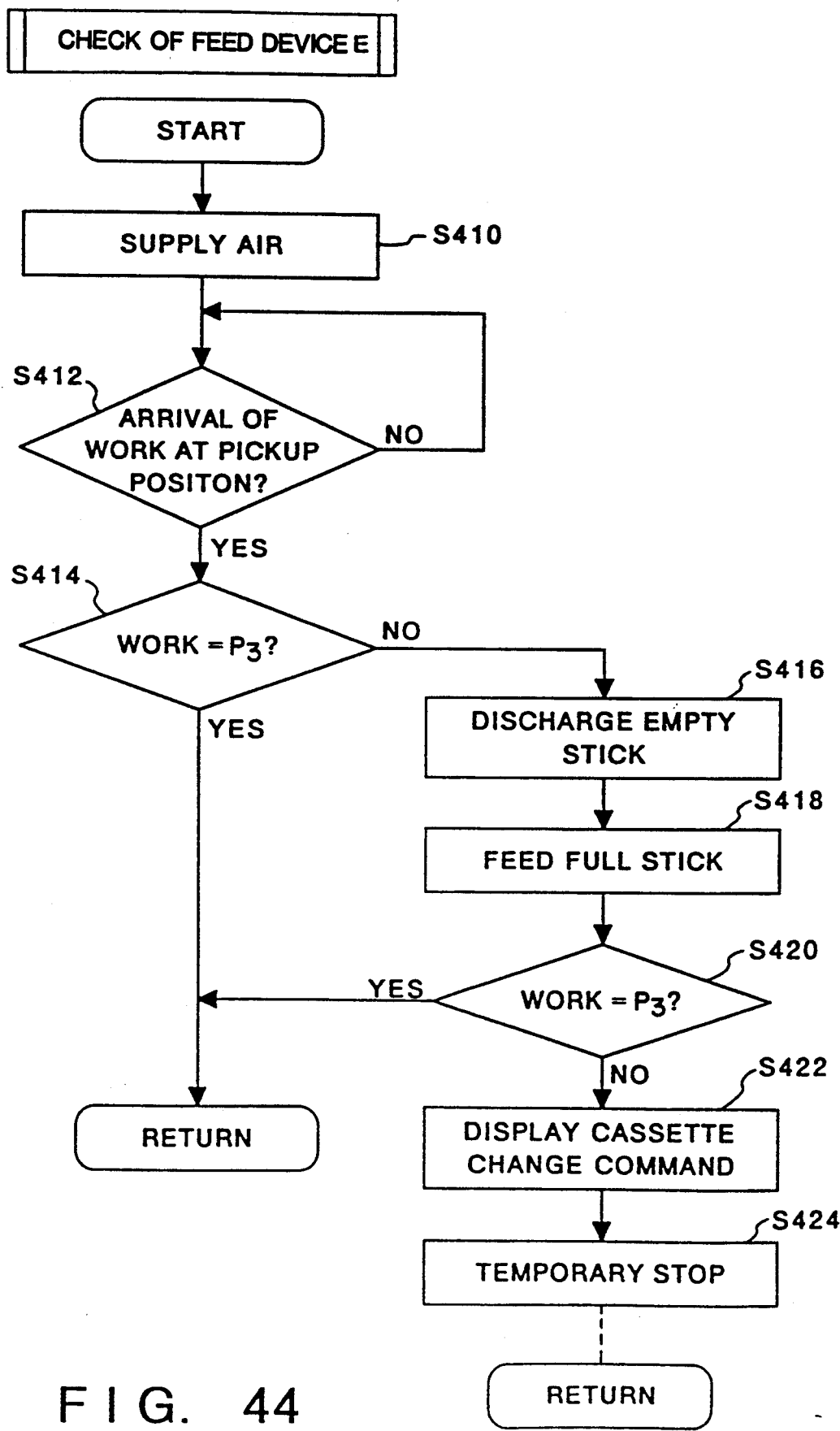
FIG. 44 is a flow chart showing a control sequence for checking an end of operation in a parts feed device 100.

When stop of the motor 219 is confirmed in step S276, the feed device 100 is checked in step S277. The details of this check control are shown in FIG. 44.

Control for Feed Device

A control sequence in the feed device 100 will be described with reference to the flow chart in FIG. 44. In step S410 of FIG. 44, air is supplied to the air cylinder 148 corresponding to the stick having the requested works. As described with reference to FIG. 4, one work located at the standby position $P_2$ is dropped to the separation position $P_1$.

The motor 145 started in step S270 in FIG. 40B drives the ball screw 144 so that the work feed unit 124 which stores the desired type of work W has been moved in a direction of the arrow A (FIG. 1). When it is detected in step S412 that the separation position $P_1$ in the work feed unit 124 coincides with the pickup position $Q_1$, this movement is stopped in step S414.

It is then determined in step S414 through the detection mechanism 164 that the work W is present at the standby position $P_3$. If YES in step S414, i.e., if it is determined that the light-receiving element 164b in the detection mechanism 164 does not receive light from the light-emitting element 164a and the work W is present at the standby position $P_3$, no trouble occurs in the work pickup operation. That is, two works W wait. In this case, the flow returns to the corresponding step in the main routine. In the control sequence of TASK 1 as the call source, if the requested head has already reached the pickup position $Q_1$ (i.e., the separation position $P_1$), the pickup operation of the separated work W is executed. Otherwise, control waits until the requested head reaches the pickup position.

If NO in step S414, i.e., it is determined that the light-receiving element 164b in the detection mechanism 164 receives light from the light-emitting element 164a and the work W is not present at the standby position $P_3$, it is determined that the lowermost stick $S_1$ is empty. In step S416, the empty stick S' is discharged, and in step S418, a new stick is fed as the lowermost stick $S_1$, as described above.

When the discharge operation of the empty stick S' and the feed operation for the lowermost stick $S_1$ are completed in step S418, it is determined again in step S420 through the detection mechanism 164 whether the work W is present at the standby position $P_3$.

If YES in step S420, i.e., when it is determined that the work W is present at the standby position $P_3$, the works wait at both the lock position $P_2$ and the standby position $P_3$, so that control returns to the main routine.

If, however, NO in step S420, i.e., when it is determined that no work W is present at the standby position $P_3$, it is determined that all the sticks S in the cassette 138 are empty. In step S422, a cassette change signal is output to cause replacement of the cassette 138, followed by a temporary stop step S424 thereby completing all the operations.

As is apparent from the above description, since one detection mechanism 164 is arranged to detect the presence/absence of the work W at the standby position $P_3$, empty detection of the works W in the stick and discharge (absence) detection of all the sticks S in the cassette 38 can be performed. As described above, as compared with a conventional arrangement wherein two detection mechanisms (sensors) are required in each unit 124, only one detection mechanism is required in the present invention. Therefore, the wiring pattern can be simplified, and the wiring operations at the time of function switching can be reduced.

Continuation of Pickup Processing

The description will return to the pickup processing in FIG. 40B. TASK 3 is started in step S278 to drive cams for picking up a work.

TASK 3

Figure 42:
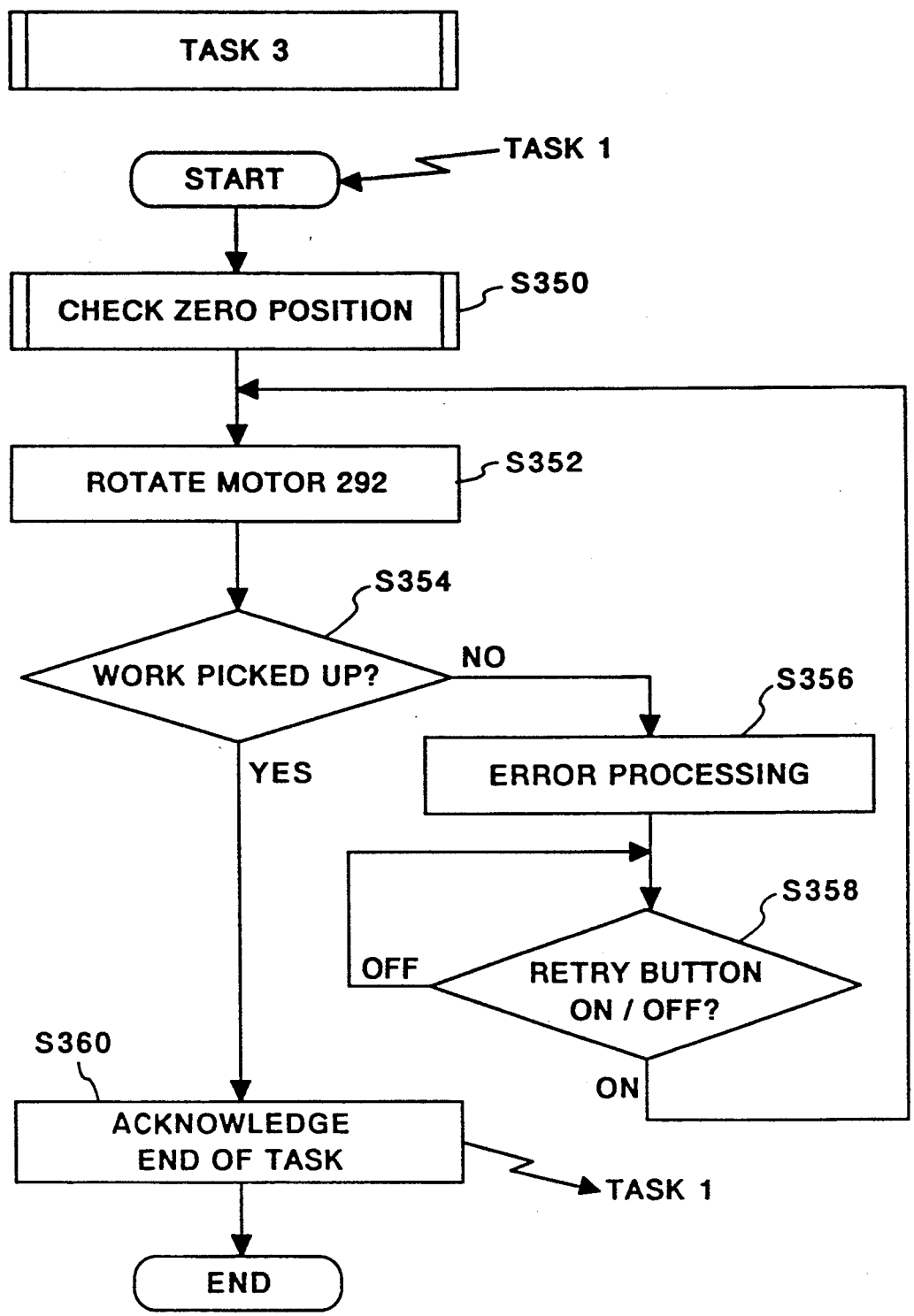
FIG. 42 is a flow chart showing a control sequence of TASK 3.

A description of TASK 3 started in step S278 will be made with reference to FIG. 42.

In order to cause the head unit 218 to start a work pickup operation, the pickup cam must be located at the zero position as described with reference to FIGS. 26A, 26BA and 26B. In step S350 in FIG. 42, the zero position is checked. Details of this check control are shown in FIG. 46B and will be described later with reference to emergency stop control.

When it is determined in step S350 that the zero position of the cam is confirmed, TASK 3 proceeds to step S352 where the motor 292 is driven to drive the pickup cam by one revolution. It is determined in step S354 by a sensor arranged on the gripper head whether a work is actually picked up. If a pickup operation has failed, and a retry button for retrying the pickup operation is depressed, the pickup operation is retried until the pickup operation is successful.

Continuation of Pickup Processing

When the pickup operation is successful, TASK 1 is started.

Referring back to step S280 in FIG. 40B, end processing for pickup processing is performed. That is, air is removed from the cylinder, and other operations are performed. The counter n is reset to "1" in step S282.

When the pickup processing as a subroutine in FIG. 40B is completed, control returns to step S217 in FIG. 39A. In step S217, the pointer SP representing a position for accessing the mounting command S is incremented by one because the work corresponding to this procedure S has already been picked up. In step S226, the counter PP representing the head number of the head which comes to the "pickup position" and the pointer IP representing the head number corresponding to the "insertion position" are incremented. That is,

PP=PP+1

IP=IP+1

The flow then returns to step S208, the next mounting command is accessed, and the above operations are repeated.

Control for Counter n

The $S_2$ command is fetched from the table PT in FIG. 34. A work (Z=2) designated by this command is gripped (state (b) in FIG. 36A), and the $S_3$ command (Z=3) is fetched in step S210. This operation will be described in detail below.

In this case, the value of the counter PP which represents the head number of the head supposed to come to the "pickup position" next is "3". Since HD:PT [SP]=5 is given, NO is obtained in step S212, and the flow advances to step S220. It is determined in step S220 whether significant data representing that the work to be inserted has been stored is present at an entry designated by the pointer IP in the insertion table IT as in step S214. In this case, since NO is obtained in step S220, the flow advances to step S224. In this step, the turret table 217 is not rotated, and neither the insertion nor pickup operations are performed. The value of the counter n which represents the number of nonoperations of both the insertion and pickup operations is incremented.

The flow advances to step S226 without incrementing the pointer SP, and only the pointers PP and IP are incremented (PP=4 and IP=9). The flow then returns to step S208.

In step S210, since the SP is not incremented, the same command $S_3$ is fetched. The flow advances in an order of steps S212, S220, and S224, and the counter n is incremented. In step S226, the pointers PP and IP are incremented. The flow then returns to step S208.

It should be noted that only the counter n is incremented in step S224. Advance of the flow to step S224 indicates that no pickup processing, insertion processing, and pickup & insertion processing are performed. In step S226, only the pointers PP and IP are incremented. The flow then returns to step S208, and the operations from step S212 are performed again. This operation sequence indicates that the counter n incremented in steps S224 has a function of storing a count representing that no pickup processing, insertion processing, and pickup & insertion processing are performed. Therefore, for example, a rotation amount of the turret motor 219 in step S235 of the insertion processing subroutine (FIG. 40A) or in step S300 of the insertion & pickup processing subroutine (FIG. 40CA) is determined as follows:

$$36° \times n.$$

The head turret motor 219 is kept rotated until the head which requires the next insertion operation and/or the next pickup operation is moved to the "insertion position" and/or the "pickup position". In a conventional head turret mechanism, the turret motor is temporarily stopped due to the following reason. In a conventional arrangement, in order to obtain a versatile teaching sequence, a dummy pickup operation (no work is gripped although the cam motor is driven) is performed although the head need not pick up the work. If the motor is not stopped, the moving head collides with the parts feed device to damage the head mechanism during the dummy pickup operation. To the contrary, according to this embodiment, such a dummy pickup operation can be eliminated, thus achieving high efficiency.

Parallel Processing of Pickup and Insertion

An operation for fetching the mounting command $S_4$ in step S210 will be described below, as described in association with the state (d) of FIG. 36A and the state (e) of FIG. 36B. The pickup and insertion operations are simultaneously performed in accordance with the $S_4$ command. Control is performed in an order of step S210, step S212, step S213, step S214, and step S218, thereby performing pickup & insertion processing.

This pickup & insertion processing will be described with reference to FIGS. 40CA and 40CB. It is checked in step S290 that TASK 4 signals that the printed circuit board 20 is placed on the positioning table 438. Otherwise, control waits until this is signaled from TASK 4. In order to perform insertion processing, the printed circuit board must be placed on the table 438. It should be noted that checking in step S290 should not be performed in the pickup processing (FIG. 40B) due to the following reason. When insertion is not performed, even if the printed circuit board 20 is not placed on the table 438, it is possible to cause the head of the turret table 217 to grip a work. Conveyance of the printed circuit board 20 and gripping of a work by the turret table device 200 can be simultaneously performed.

The control sequence shown in FIGS. 40CA and 40CB has many points similar to those of pickup processing in FIG. 40B.

It is determined in step S292 whether pickup processing to be performed is being retried. If pickup processing is performed for the first time, the flow advances to step S294 to start the Z-axis motor 145 of the feed device 100. In step S296, the three-axis (X, Y, and Θ) motors (450, 464, and 490) are started in the positioning device 400. In steps S298 and S300, the turret motor 219 is started. An operation for moving the desired stick in the feed device 100 to the pickup position, an operation for positioning the printed circuit board 20 on the positioning device 400, and an operation for rotating the head turret table 217 are simultaneously started.

It is determined in step S302 whether the X-, Y-, and Θ-axis motors are stopped. A detailed control sequence of this check is shown in FIG. 45.

Control for Positioning Device

As described with reference to FIGS. 28 to 31, positioning in the X-, Y-, and Θ-axes is performed in the positioning device 400. At the same time, forcible positioning of the printed circuit board 20 is performed. This forcible positioning is performed because positioning in the Θ-axis has been performed by frictional driving by means of the positioning device 400.

The X-, Y-, and Θ-axis motors (450, 464, and 490) have been started in step S296 (FIG. 40CA) or step S232 (FIG. 40A). It is then determined in step S500 in accordance with a detection result from the rotary encoder 494 whether a mounting position of the requested work reaches a position immediately under the "insertion position" on the head turret table 217. When the work reaches the target position, only the X- and Y-axis motors 450 and 464 are servo-locked. That is, servo control is performed even if torques are generated to displace the printed circuit board 20 in the X- and Y-axis.

The position of the rotary table 438 is based on a detection result from the rotary encoder 494 directly connected to the drive motor 490 (FIG. 30). When slip occurs in the P surface between the rotary table 438 and the drive roller 486 directly driven by the motor 490, the detection output value from the rotary encoder 494 does not accurately represent an actual angular position of the rotary table 438. In other words, it is unknown if the rotary table 438 actually reached the target position.

For this reason, control from step S504 is performed. More specifically, the servo system of the drive motor 490 is set free, so that the rotary table 438 can be freely rotated. In step S506, compressed working air is supplied to the pneumatic cylinder 512 to extend the piston rod 510 upward. The positioning pin 508 is fitted upward in the regulating hole 498a (corresponding to the 90° position of the holes 498a to 498d) corresponding to the predetermined angular positions on the rotary table 438.

As a result, even if slip occurs on the P surface between the drive roller 486 and the rotary table 438, and an error occurs between the detected position and the actual position, the rotary table 438 is forcibly pivoted to eliminate the error upon fitting of the positioning pin 508 in the regulating hole 498a, so that the rotary table 438 is positioned to the accurate angular position.

In step S508, the servo system of the drive motor 490 is locked, and the angular position of the rotary table 438 is fixed. In step S510, the detection position based on the detection result from the rotary encoder 494 is indexed to the "90°" position.

A series of operations for absorbing the error by the error absorbing mechanism 496 are completed, and an operation for moving the rotary table 438 to the 90° position is completed.

By the above control for the positioning device 400, every time the rotary table 438 is stopped at the target angular position, an error between the detection position and the actual position on the basis of the slip occurring on the P surface between the drive roller 486 and the rotary table 438 can be mechanically eliminated. The errors cannot be accumulated. An accurate rotational operation of the rotary table 438, i.e., positioning of the printed circuit board 20 placed on the rotary table 438, is performed.

Since the error absorbing mechanism 496 is arranged as a mechanism for correcting slip on the P surface in the positioning device 500 of this embodiment, the rotary table 438 can be accurately rotated by frictional driving. Therefore, a low-noise, backlash-free, compact positioning mechanism for the printed circuit board 20 can be realized.

Parallel Processing of Pickup and Insertion (Continued)

Referring back to control in FIGS. 40CA and 40CB, when an end of operation in the positioning device is checked, an operation for checking stop of the turret motor 219 is performed in step S304 (details are described in FIG. 46A). When the stop of the turret motor is confirmed, an end of operation of the feed device is checked in step S306. This check operation has been described in association with FIG. 44.

When the end of operation of the feed device is confirmed, the latch (FIG. 22A) for storing a clinch error is cleared in step S308. In step S310, TASK 2 is started.

TASK 2

Figure 41:
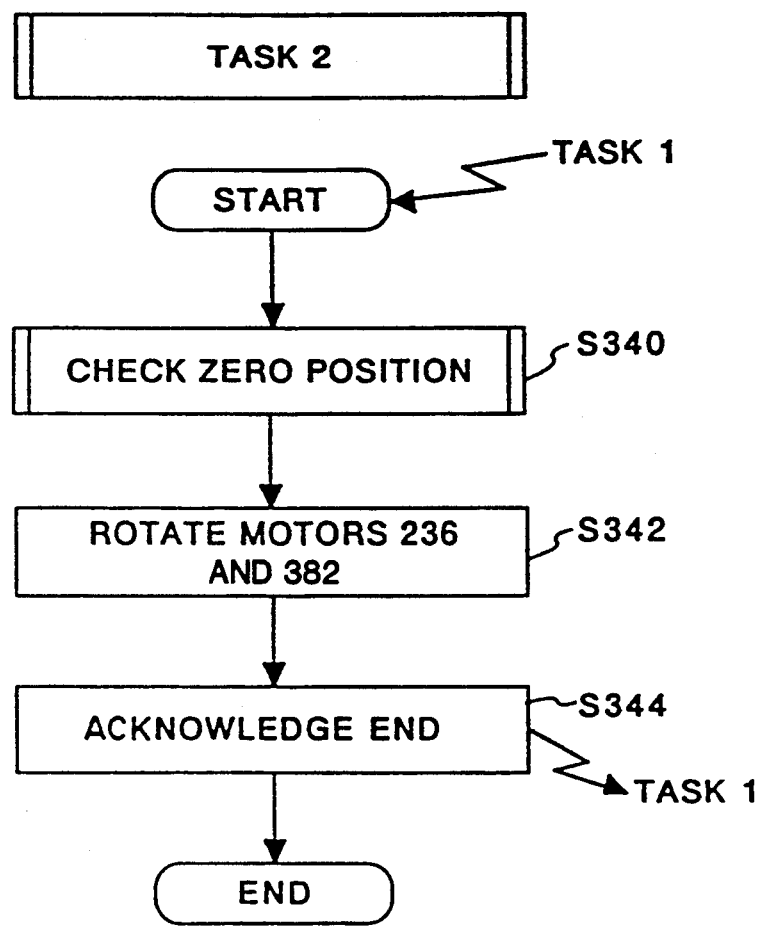
FIG. 41 is a flow chart showing a control sequence of TASK 2.

A general sequence of TASK 2 is shown in FIG. 41. The insertion cam motor 236 and the clinch cam motor 382 are driven under the control of TASK 2. That is, in step S340, the same check operation as the zero position check described in association with step S350 in TASK 3 is performed. The cam operation performed by motor driving has been described in detail. In step S342, the cam motors are rotated by one revolution. In step S344, an end of TASK 2 is acknowledged.

Parallel Processing of Pickup and Insertion (Continued)

Description will be continued, referring back to step S310 in FIG. 40CA. In step S310, TASK 2 is started, and at the same time operations from step S312 are performed because multitask control is performed.

Operations in steps S312 to S316 are performed to start TASK 3 required to pick up the work, as previously described.

In step S318, the end of cam operation for the insertion operation (i.e., the end of TASK 2) is confirmed. End processing is performed in step S320.

An insertion error is checked in step S322. This can be determined by insertion error information stored in the latch 363 in FIG. 22A. If no error is detected, operations from step S332 are performed.

If an error is detected, insertion error processing is performed in step S324. Operations in steps S326 to S330 are procedures for confirming whether a retry operation is performed, which is to be signaled to the operator, when a pickup or insertion error is detected. A continuation button (i.e, a button on the operation panel in FIG. 1) in step S326 is a button operated by the operator to determine whether the operation is continued regardless of the presence of an insertion or pickup error. A retry button (i.e., a button on the operation panel in FIG. 1) in step S328 is a button for retrying the pickup or insertion operation.

When the continuation button is depressed, a retry operation is not performed, and the flow advances to operations from step S332. When the continuation button is not depressed but a retry button is depressed, the flow advances to step S330 to perform forcible pickup processing. The flow then returns to step S292 to perform a retry cycle of insertion.

This forcible pickup processing is an operation for forcibly returning a head having an insertion error to the pickup position, causing this head to grip a necessary work, rotating it through 180°, and moving this head to the insertion position. In steps S292 and S312 in FIGS. 40CA and 40CB, respectively, it is determined whether the operation is performed for the first time because part feeding, work pickup, and positioning of the printed circuit board are not required for the second and subsequent operations.

As described above, the insertion and pickup operations are simultaneously performed.

Insertion Processing

Referring back to FIGS. 39A and 39B, a case in which only the insertion operation is performed will be described below. In this case, after execution of the S4 mounting command, only the insertion operation is performed when the S5 mounting command is fetched (see the states (e) and (f) of FIG. 36B). In this case, NO is obtained in step S212 because $HD:PT [SP]=9$, $PP=7$ In step S220, YES is obtained because pointer IP=2. Insertion processing is performed in step S222. Details of this insertion processing are shown in FIG. 40A and are substantially the same as those of the insertion processing in the pickup & insertion processing in FIG. 40CA, and a detailed description thereof will be omitted.

End Processing

It is checked in step S208 whether the pointer SP represents the last line of the mounting order table PT. If YES in step S208, all works to be mounted on one printed circuit board are completely gripped by the predetermined heads. It is then checked in step S209 whether heads which grip the works are left on the turret table 217 because fetching of the last mounting command is finished prior to the final work insertion on the printed circuit board 20. If YES in step S209, the flow advances to step S212, and the mounting operation is continued. However, if NO in step S209, the flow advances to step S228 to check whether the end button is depressed by the operator. This button is arranged on the operation panel. If this button is not depressed, the flow returns to step S204 to insert works on the printed circuit board.

Emergency Stop Processing

This stop processing is to protect gripper and insertion mechanisms on the head device. There are three reasons for performing stop processing. First, the cam (e.g., 381) for performing the insertion and pickup operations is not set at zero position upon starting of its rotation (FIG. 26A). Second, the drive member 224 and the like do not return to the normal positions when the insertion and pickup operations are performed at the insertion and pickup positions. Third, all work sticks are empty in the feed device 100. Emergency stop (all motors are immediately stopped) is performed due to the first and second reasons since the device is damaged. All the motors need not be stopped but system control is temporarily interrupted for the third reason because the system restores the normal state upon replacement of sticks.

Figure 46C:
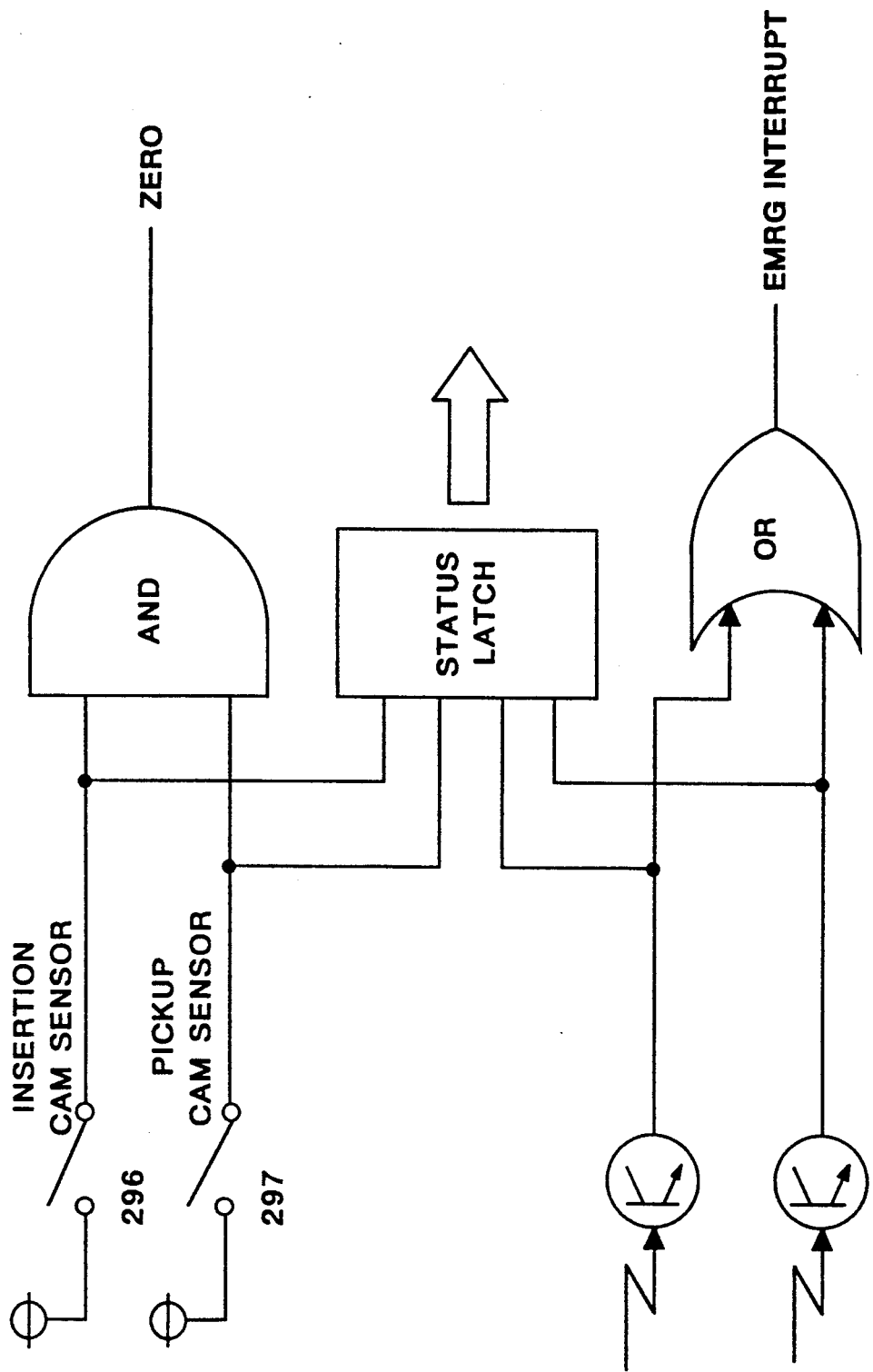
FIG. 46C is a chart showing a generator for generating a signal for detecting an emergency state.

FIG. 46C shows a circuit for generating a first stop signal (zero signal) and a second stop signal (EMRG).

The zero signal will be described first. As described in association with FIGS. 26A., 26BA and 26BB, when the cam is not located at zero position at the time of start of its rotation, the member 234a collides with the head member 224 on the cam side at the insertion position. The member 290b collides with the head at the pickup position. In TASK 2 and TASK 3, check operations shown in FIG. 46B are performed in steps S340 and S350 before rotation of the cam is started. Referring to FIG. 46C, when non-zero position is detected by the insertion cam sensor 296 or the pickup cam sensor 297, a signal ZERO goes low. When the signal ZERO of low level is detected in step S650 before the cam is driven, all the motors are stopped in step S652 of FIG. 46B. A status latch is read in step S654. As shown in FIG. 46C, this latch is a latch for storing one of the four error states. The error state is displayed in step S656, and all control is stopped.

A generation state for the second reason will be described with reference to FIGS. 8 and 14. The sensors 294b (insertion position side) and 295b (pickup position side) comprise photointerrupter type sensors. As shown in FIG. 8, the sensors 294b and 295b are located near the insertion and pickup positions, respectively. When the turret table 217 is rotated to cause the member 224 to interrupt light incident on the sensor 294b near the insertion position, or to cause the head member 224 to interrupt light incident on the sensor 295b at the pickup position, a signal EMRG is generated by the circuit shown in FIG. 46C. Since the sensors 294b and 295b have a positional relationship shown in FIG. 8, the signal EMRG is not generated regardless of any vertical movement of the head member 224 in accordance with the insertion and pickup operations. In other works, when the signal EMRG is set high, an abnormal state occurs. This signal EMRG serves as an interrupt signal. When the signal EMRG is generated, control in steps S606 to S610 is necessarily executed.

FIG. 46A shows a sequence for checking the stop of the turret motor 219. Since an emergency operation is performed in association with rotation of the turret table, an emergency stop operation based on the second reason will be described with reference to FIG. 46A. It is checked in step S600 whether the signal EMRG is generated. If YES in step S600, control in steps S606 to S610 is executed. This stop control has been described in steps S652 to S656.

In step S602, the end of rotation of the turret table motor 219 is detected by an interrupt signal from a servo control circuit (not shown) for the motor 219.

Check of End of Motor Operation

An operation for awaiting the end of rotation of the turret motor 219 and the like prior to actual execution of the pickup and insertion operations will be described again.

In the insertion processing, an end of rotation of the turret drive motor 219 for moving the requested head to the "insertion position" is detected in step S236. An end of positioning in the X-, Y- and Θ-axes by the positioning motors 450, 464, and 490 in the positioning device 400 is detected in step S500. In the pickup processing, the end of rotation of the Z-axis motor 145 in the feed unit 100 is detected in step S412.

Figure 43:
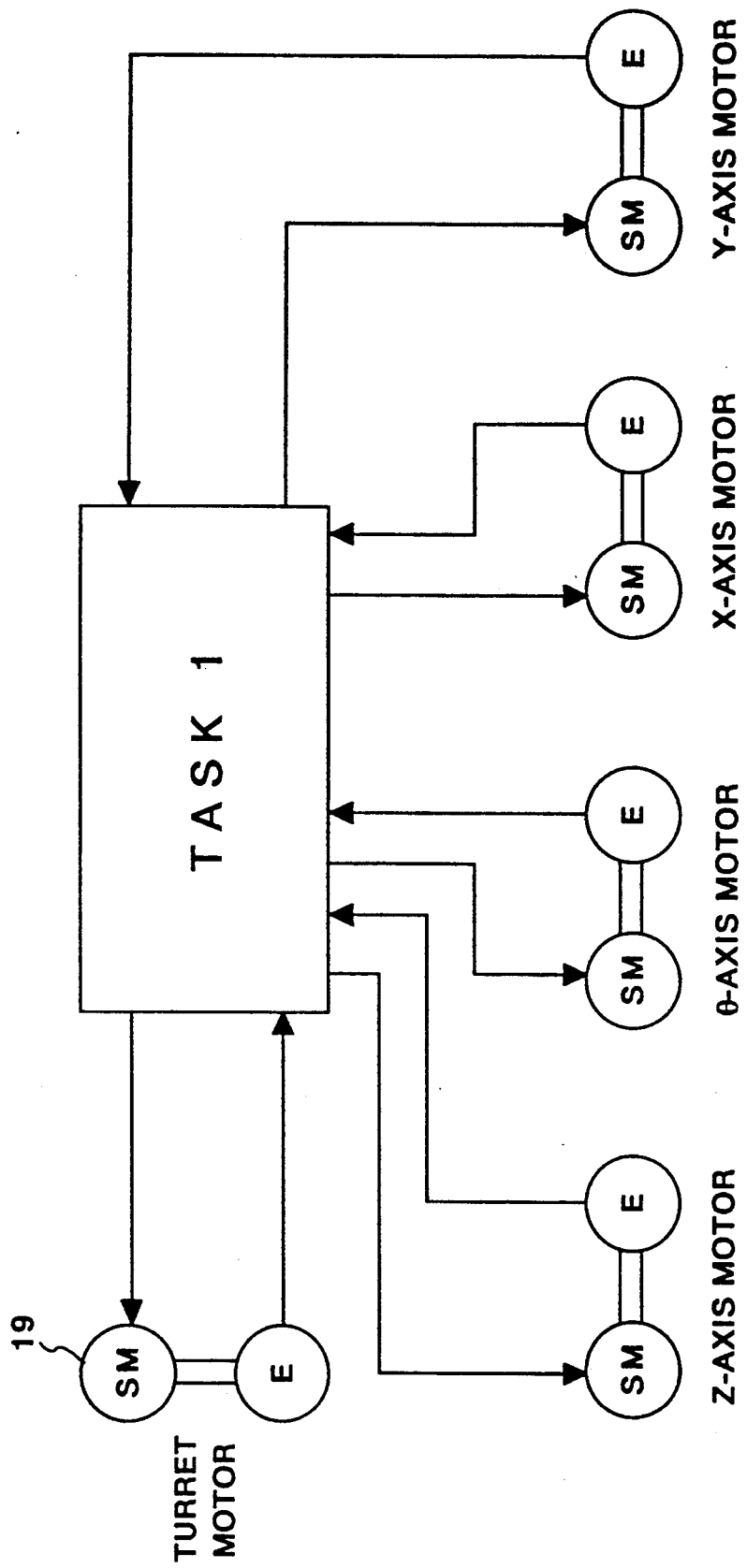
FIG. 43 is a chart for explaining stop acknowledgement of the motors in TASK 1.

Such standby control is performed as follows. As shown in FIG. 43, the motors (these motors are servo motors and represented by SM in FIG. 43) comprise encoders (represented by E in FIG. 43) for outputting signals representing angular positions. TASK 1 can detect that the motors reach the target angular positions by these position signals.

<Effect of Embodiment>

Control of the embodiment as has been described above has the following effects.

(1) The pickup, clinch, and printed circuit board positioning operations by the turret table device 200 are systematically combined and synchronized with each other.

In the turret table device 200, a work from the parts feed device 100 is transferred to one head in the turret table device 200 at the "pickup position" (i.e., a parts pickup position). When the turret table 217 is rotated and the gripped work reaches the "insertion position", the positioning device 400 moves the table 438 in the X-, Y, and Θ-axes, so that the work comes to a position immediately above the head located at the "insertion position". The work is then inserted on the printed circuit board. The turret table 217 of the turret table device 200 is synchronously rotated with the turret table 342 of the clinch device 300. After the work is inserted on the printed circuit board, a clinch operation is performed.

(2) A work mounting order designated by the operator is kept maintained even when the works are inserted on the printed circuit board by the turret table device 200.

That is, in control of this embodiment, there are provided the table PT for storing programs which describe mounting orders and the table IT for managing information associated with all heads on the turret table 217. As a result, the following effects can be obtained.

(2-1) The throughput of the mounting system can be easily increased. The positioning operation of the printed circuit board 20 by the positioning device 400 requires the highest precision. Most of the tact time is a period required for this positioning. When the mounting order is kept maintained, the same precision and tact time as expected at the time of design of the mounting order can be obtained. That is, the operator focuses himself or herself on design for obtaining an efficient mounting order without considering influences of other factors, thereby increasing the throughput of the mounting system as a whole.

For example, assume that the mounting system is applied to an operation for mounting ICs on a printed circuit board. The operator considers the best insertion order for ICs inserted on the printed circuit board by considering the most efficient positioning operation in the positioning device 400 and the best layout order for sticks which store ICs in the feed unit 100. The control device can automatically perform the pickup and insertion operations without sacrificing efficiency in the positioning device 400 and efficiency in the feed unit 100. Therefore, the throughput of the mounting system as a whole can be easily increased.

(2-2) An efficient pickup/insertion operation can be performed.

By managing the two tables described above, unnecessary dummy pickup operations need not be performed, thus improving efficiency. That is, the system of this embodiment has a function of eliminating all the drawbacks of the conventional turret type mounting apparatus having a fixed "pickup position" and a fixed "insertion position". In the conventional apparatus, an operation for stopping the turret table 217 is an indispensable operation. However, this operation can be eliminated in the mounting system of this embodiment. A more efficient pickup/insertion operation than that in the conventional turret device can be performed.

(2-3) Since the table is provided so that the control device 21 autonomously controls the system in accordance with a mounting order designed in correspondence with a specific printed circuit board, teaching operations required in the conventional apparatus can be eliminated.

(3) A quick and accurate response can be provided at the time of emergency.

<Control Modifications>

Various modifications may be made without departing from the spirit and scope of the invention.

M-1

In the above embodiment, the tables PT and IT, the pointers SP and IP representing entries of the tables PT and IT, and the counter PP representing the head number of a head which comes close to the "pickup position" are used. By using these pointers, the next operation can be managed as only the pickup operation, only the insertion operation, both the pickup and insertion operations, or no operations. In other words, the head position represented by these pointers is changed in correspondence with rotation of the turret table 217.

The following modification is also available. The pointer may be fixed (i.e., this can be achieved since both the "pickup position" and the "insertion position" are fixed), and the data in the table IT are rotated upon rotation of the turret table 217, thereby obtaining the same effect as described above.

M-2

In the above embodiment, the rotational direction of the head table is always the same, i.e., the α direction. However, the present invention is also applicable to rotation of the head table in another direction.

M-3

In the above embodiment, by using three pointers, the next operation can be managed as only the pickup operation, only the insertion operation, both the pickup and insertion operations, or no operations. However, the following modification is also available.

That is, when the mounting command is fetched before the turret table 217 is rotated, a distance ($R_1$) required to bring the requested head to the "pickup position" is compared with a moving amount ($R_2$) required for moving the first head gripped with the work to the "insertion position. When $R_1$ is smaller than $R_2$, only the pickup operation is performed. When $R_2$ is smaller than $R_1$, only the insertion operation is performed. However, if $R_1=R_2$, both the pickup and insertion operations are performed.

Finally, a control sequence of a modification of an insertion operation of the work W by the control unit 30 will be described with reference to FIGS. 47AA, 47AB, 47BA and 47BB.

The control unit 30 drives the five drive motors 219, 236, 292, 344, and 382, respectively, through the first to fifth motor drivers 220a to 220e. Drive mounts (pivot amounts) of these motors are always detected by the control unit 30 through rotary encoders (not shown). The first to fifth drive motors 219, 236, 292, 344, and 382 are controlled on the basis of the detected pivot amounts.

Figure 47A:
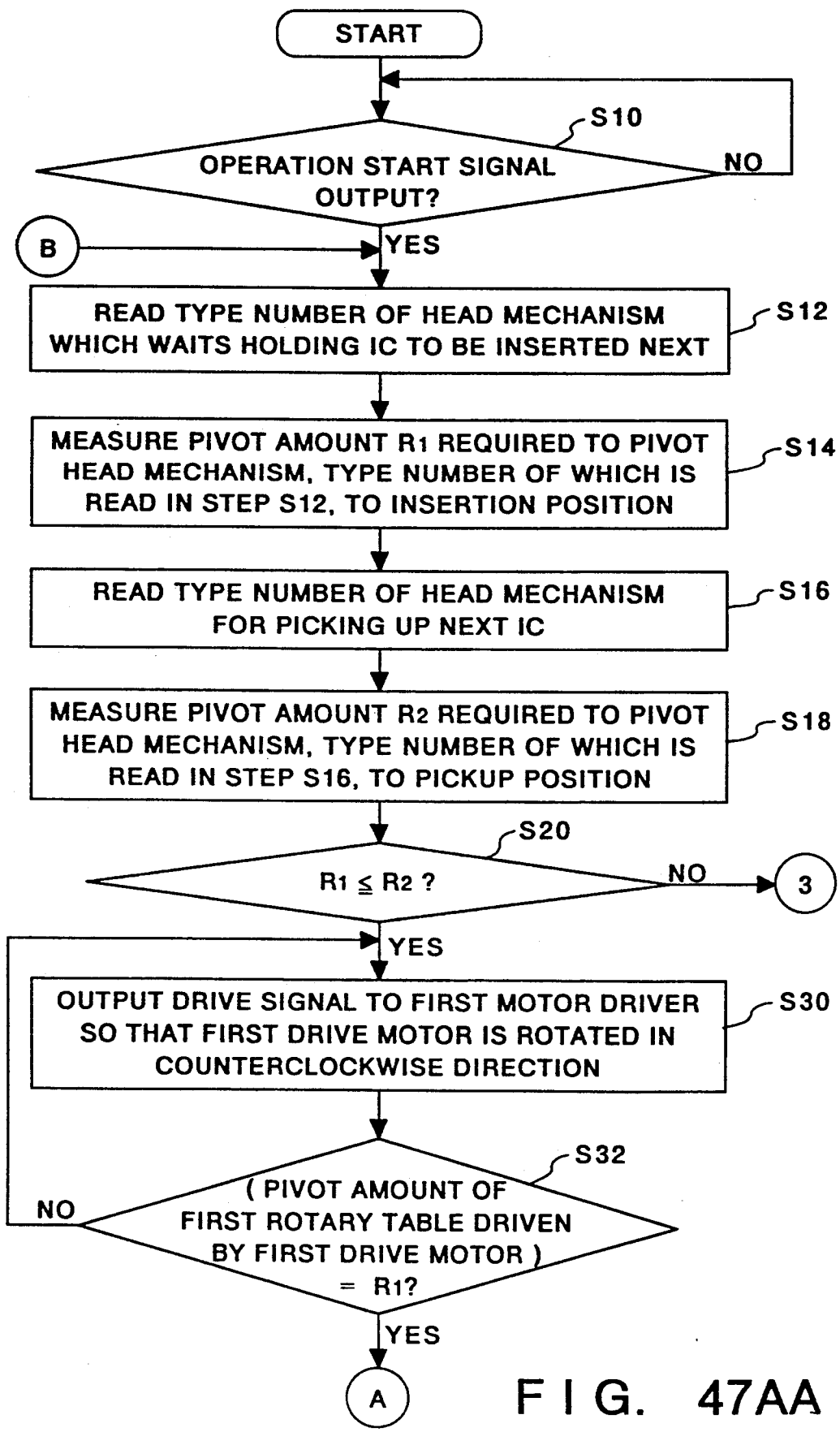
FIGS. 47AA, 48AB, 47BA and 47BB are flow charts showing a control sequence in a modification of the turret table device.
Figure 47B:
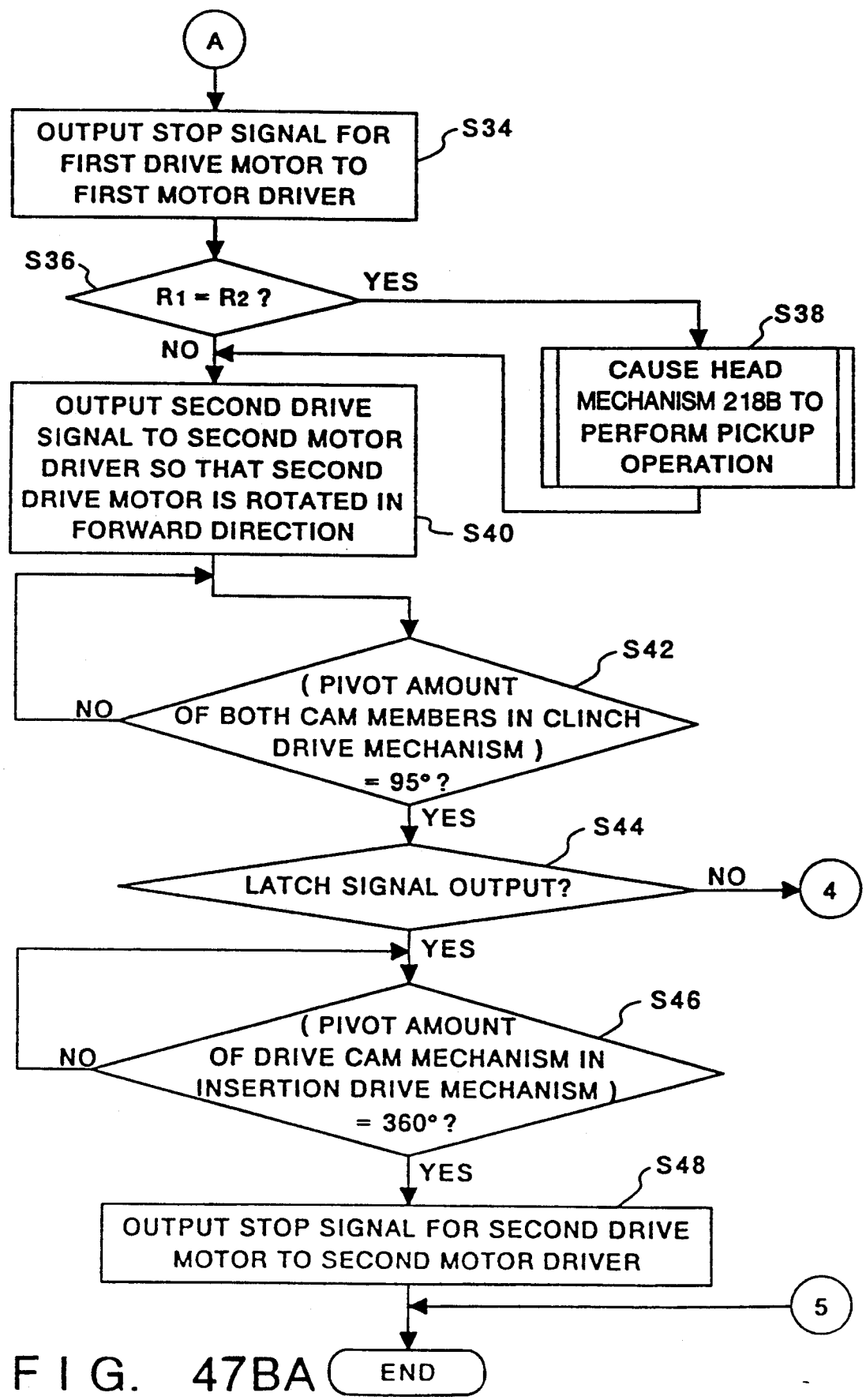
Figure 47B:
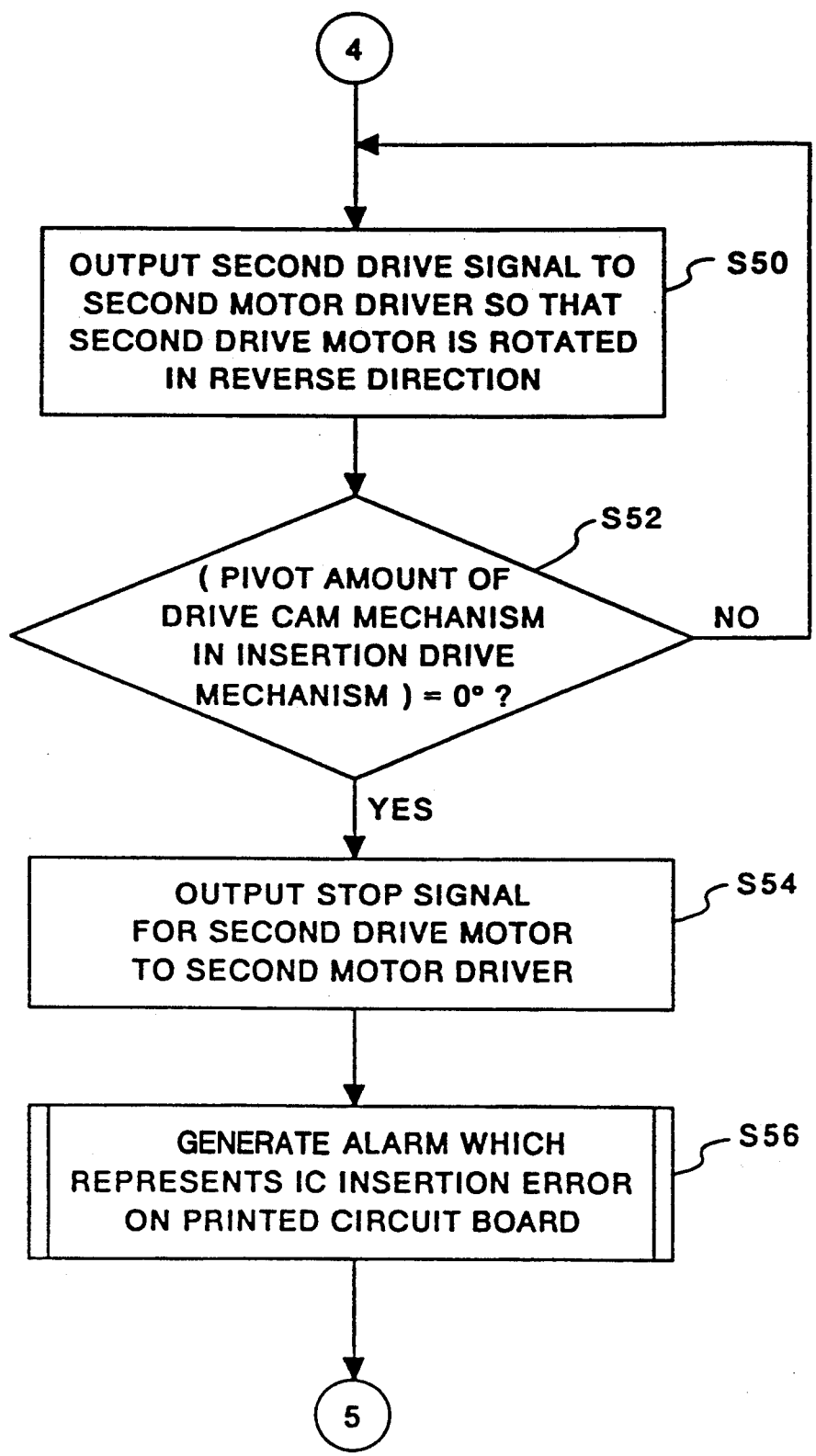

As shown in FIGS. 47AA, 47AB, 47BA and 47BB when an operation start signal is detected in step S10, a type number of the head unit 218 which waits and grips the work W to be inserted next is loaded in step S12. In step S14, the first pivot amount $R_1$ required for pivoting the head unit 218 having the type number loaded in step S12 to the insertion position is measured. On the other hand, a type number of the head unit 218 which grips the work W to be picked up next is loaded in step S16. In step S18, the second pivot amount $R_2$ required to pivot the head unit 218 having the type number loaded in step S16 to the pickup position is measured.

In step S20, the first and second pivot amounts $R_1$ and $R_2$ respectively loaded in steps S14 and S18 are compared with each other to determine whether the first pivot amount $R_1$ is smaller than or equal to the second pivot amount $R_2$. If NO in step S20, i.e., it is determined that the second pivot amount $R_2$ is smaller than the first pivot amount $R_1$ and a drive signal for driving the first rotary table 217 counterclockwise is output to the first motor driver 220a in step S22. This operation in step S22 continues until the pivot amount of the head turret motor 219 reaches the second pivot amount $R_2$. When it is determined in step S24 that the first rotary table 217 is rotated by the second pivot amount $R_2$, a drive stop signal for the head turret motor 219 is output to the first motor driver 220a in step S26. In step S28, the pickup operation for the work W is performed through an insertion drive mechanism (not shown) by the head unit 218B pivoted to the pickup position.

Since it is determined in step S20 that the second pivot amount $R_2$ for pivoting the head unit 218 for gripping the work W to be picked up next to the pickup position is smaller than the first pivot amount $R_1$ required for pivoting the head unit which grips the work W to be inserted next to the insertion position, the first rotary table 217 has been rotated by the second pivot amount $R_2$. The head unit 218 which grips the work W to be inserted next does not reach the insertion position.

For this reason, in step S28, the pickup operation is completed, the flow returns to step S12 to compare the first pivot amount $R_1$ required for pivoting the head unit which grips the work W to be inserted to the insertion position with the second pivot amount $R_2$ required for pivoting the head unit 218 which grips the work W to be inserted next to the pickup position.

If YES in step S20, i.e., if it is determined that the first pivot amount $R_1$ is smaller than the second pivot amount $R_2$, a drive signal for the head turret motor 219 is output in step S30 to the first motor driver 220a so that the first rotary table 217 is pivoted counterclockwise. The operation in step S30 continues until the pivot amount of the head turret motor 219 reaches the first pivot amount $R_1$. When it is determined in step S32 that the first rotary table 217 has been rotated by the first pivot amount $R_1$, a drive stop signal for the head turret motor 219 is output to the first motor driver 220a in step S34.

It is then determined in step S36 whether the first pivot amount R is equal to the second pivot amount $R_2$. If YES in step S36, i.e., when it is determined that the first pivot amount $R_1$ is equal to the second pivot amount $R_2$, the head unit 218 has been rotated to the pickup position. In step S38, the pickup operation of the work W is performed by the head unit 218B pivoted to the pickup position. The flow then advances to step S40. However, if NO in step S36, i.e., when it is determined that the first pivot amount $R_1$ is not equal to the second pivot amount $R_2$, the head unit 218 subjected to the pickup operation does not reach the pickup position. In this case, the operation in step S38 is not performed, and the flow directly jumps to step S40.

In step S40, a second drive signal is output to the second motor driver 220b to rotate the head insertion motor 236 in the insertion drive mechanism 232 in the forward direction (i.e., counterclockwise direction). Thereafter, it is determined in step S42 that the pivot amount of each of the cam members 381a and 381b in the clinch drive mechanism 371 reaches 95° in a clinch operation (to be described later). When it is determined in step S42 that the pivot amount of each of the cam members 381a and 381b reaches 95° (i.e., a pivot amount advanced by 5° from the start of push-down operation), it is then determined in step S44 whether a latch signal is output from the latch circuit 363.

If YES in step S44, i.e., when it is determined that the LED 361 is turned on and the latch signal is output from the latch circuit 363, it is determined that the work W is accurately inserted on the printed circuit board 20 by this head unit 218A and all the lead wires Wb extend below the printed circuit board 20. The first drive signal is kept output to the second motor driver 220b in step S40. As a result, as described above, the insertion operation for the work W continues. After the gripper portion inserts the work W on the printed circuit board 20, it releases the work W and is moved upward while the work W is left on the printed circuit board.

When it is determined in step S46 that a pivot amount of each of the drive cam mechanisms 235a and 235b in the insertion drive mechanism 232 reaches 360°, a drive stop signal for the head insertion motor 236 is output to the second motor driver 220b in step S48. When the empty gripper portion of the head unit 218A returns to the uppermost position, driving of the insertion drive mechanism 232 is stopped, thereby completing the first control sequence of the turret table device 200.

If NO in step S44, i.e., when it is determined that the LED 361 remains off at an angular position advanced by 5° from the start of push-down operation and the latch signal is not output from the latch circuit 363, the work W is not correctly inserted on the printed circuit board 20 by this head unit 218A, or at least one lead wire Wb does not extend through the printed circuit board 20. In step S50, a head insertion signal for rotating the head insertion motor 236 in the reverse direction is output to the second motor driver 220b. The gripper portion of the head unit 218A repeats the above operations in the reverse order while it grips the failed work W. This operation continues until it is detected in step S52 that the pivot amount of each of the drive cam mechanisms 235a and 235b in the insertion drive mechanism 232 returns to 0°.

When it is determined in step S52 that the pivot amount of each of the drive cam mechanisms 235a and 235b returns to 0°, a stop signal for the head insertion motor 236 is output to the second motor driver 220b in step S54. Driving of the insertion drive mechanism 232 is stopped while the gripper portion which grips the failed work W in the head unit 218A returns to the uppermost position. In step S56, an alarm tone is generated to signal the failure of insertion of the work W on the printed circuit board, thereby completing the first control sequence.

In the first control sequence, the control unit 30 drives both the drive cam mechanisms 235a and 235b by one revolution (in the forward direction) so as to perform one insertion and/or pickup operation cycle. When the insertion failure of the inserted work W is detected by the detection process performed prior to the clinch process, both the drive cam mechanisms 235a and 235b are rotated in the reverse direction at the time of detection of the failure. The gripper portion is moved upward while it grips the failed work w. The gripper portion returns to the initial position, i.e., the 0° pivot positions of the drive cam mechanisms 235a and 235b.

According to this modification, even if the insertion failure of the work W occurs, the operations performed up to the detection of the failure are performed in the reverse order since the work W is not yet clinched. Therefore, the failed work can be easily moved upward and removed from the printed circuit board 20. Therefore, a reset operation upon occurrence of the insertion failure can be easily performed.

As many apparent widely different embodiments of the present invention can be made without departing from the spirit and scope thereof, it is to be understood that the invention is not limited to the specific embodiments thereof except as defined in the appended claims.

What is claimed is:

1. A mounting system for picking up one of several different types of works from a pickup position where the different type works are selectively fed, and for moving a picked up work to an insertion position to mount the work on an object board, which comprises:

a rotary member arranged to be rotatable;

a plurality of head means mounted on said rotary member for picking up one of the plurality of works at the pickup position, for holding the picked up works and for inserting the held work on the board at the insertion position;

means for storing a pickup order in which designated works are sequentially picked-up at the pickup position and an insertion order in which the designated held works are sequentially inserted onto the object board at the insertion position;

driving means for rotating and stopping said rotary member;

determining means for determining whether or not one of said head means, which is the closest and is approaching the pickup or insertion position, is designated by the pickup or insertion order as being driven to pickup or insert the work, on the basis of the content of the storing means; and control means for controlling the driving means to continue to rotate the rotary member passed the pickup or insertion position, if one head means, which is determined not to be designated by the pickup or insertion order to pickup or insert the work, is approaching the pickup or insertion position.

2. The mounting system according to claim 1, further comprising:

means for determining first and second ones of said plurality of said head means which are next to pickup a work at the pickup position and next to insert a held work at the insertion position; and calculating means for calculating an amount of movement of said first head means to the pickup position and an amount of movement of said second head means up to the insertion position, wherein said control means preferentially drives and controls said head means to the pickup or insertion position on the basis of the amount of movement.

3. The mounting system according to claim 1, wherein said storing means stores an address representing the mounting order and a head means number corresponding to the address, and said control means continuously drives and controls one of said head means, jumping the pickup or insertion position of another head means when the head means number is not stored in accordance with an order of addresses of the mounting order.

4. The mounting system according to claim 1, which further comprises:

first arithmetic means for calculating the moving amount from the pickup position where a predetermined type of work is fed to one of said head means which picks up the predetermined type of work;

second arithmetic means for calculating a moving amount of a given work to the insertion position, the given work picked up by the one of said head means which picked up the work; and selecting means for comparing arithmetic results of said first and second arithmetic means and for selecting a moving amount of said rotary member.

5. A method of picking up different types of works and of inserting the picked up works on an object board placed on a reference plane, which comprises the steps of:

sliding a work to be picked up along a surface inclined by an angle 2α with respect to the reference plane and feeding the slid work to a pickup position;

driving a head mechanism mounted on a rotary member rotated about an axis of rotation inclined by an angle α with respect to a vertical axis perpendicular to the reference plane, so that the work is gripped and picked up from the pickup position along the vertical axis with respect to the inclined surface;

rotating the rotary member to move the head mechanism which grips the work to an insertion position which is positioned opposite to the pickup position with regard to the rotating axis of the rotary member; and causing the head mechanism to insert the work gripped therewith on the object board along the vertical axis perpendicular to the reference plane.

6. A control device for a turret type mounter having a turret table with a plurality of work holding mechanisms and having a fixed feed position for holding an externally fed work and a fixed release position for releasing a held work so as to mount the held work, which comprises:

a memory for storing a process program table which describes a work mounting order and a holding status table representing whether each of said holding mechanisms holds a work or not;

determining means for accessing said process program table and said holding status table to determine whether a process for feeding a work by one holding mechanism supposed to reach the feed position is present in said process program table, and to determine whether another holding mechanism reaching the release position simultaneously with arrival of said one holding mechanism at the feed position holds a work; and command means for instructing, when at least one of two determination results is affirmative, to rotate and stop said turret table to allow a work holding operation and a work release operation of an affirmatively determined one of said one holding mechanism and said another holding mechanism, to respectively reach the feed and release positions.

7. The control device according to claim 6, wherein said holding mechanisms are numbered in order, and said process program table comprises a plurality of commands consisting of work designation information, work holding mechanism number information, and position information representing a position at which a work is mounted on a product, said plurality of commands being stored in said process program table in a mounting order, and said holding status table comprises position information storage areas in an array in accordance with the order of said holding mechanisms, and said determining means further comprises:

means for accessing the commands in the mounting order;

means for determining whether holding mechanism number information in an accessed command coincides with a holding mechanism approaching the feed position; and means for storing the position information in the command in the area of said holding status table when a coincidence is established in said determining means.

8. The control device according to claim 6, wherein said plurality of work holding mechanisms are arranged at equal angular intervals on said turret table for every unit rotational angle, and said determining means further comprises:

means for accumulating the unit rotational angle as a rotation amount when the two determination operations are determined to be negative; and means for rotating said turret table by an accumulated rotation amount when at least one of the two determination operations is affirmative.

9. A mounting system for mounting a work at an arbitrary position on an object board, said mounting system comprising:

a positioning device for holding an object board on which a work is to be mounted, and positioning the object board in X, Y, and rotational directions;

a finger head mechanism having a plurality of finger heads which are located vertically above said positioning device while holding works to be mounted on the object board, and which are vertically moved to mount the works on the object board;

a clinch head mechanism having a plurality of head mechanisms, located below said positioning device, for upwardly clinching a work mounted by said finger head on said object board; and administration means for (i) administrating mounting positions of the works on the object board, (ii) specifying a finger head and a clinch head to be used for holding and clinching a work, respectively, and a mounting position of the work on the board, (iii) relative-position-controlling the positioning device, the finger head mechanism and clinch head mechanism so that the specified finger and clinch heads are over the mounting position, and (iv) causing the finger head mechanism and clinch head mechanism to cooperate for insertion and clinch operations.

10. The mounting system according to claim 9, which further comprises:

control means for synchronously rotating said finger head mechanism and said clinch head mechanism.

11. A mounting system for mounting a work at an arbitrary position on an object board, said mounting system comprising:

a work feed mechanism which stores a plurality of works, said work feed mechanism being arranged to separate a target work from other works upon dropping of one work from a standby position by weight of said one work and to locate a separated work to a gripping position where a finger head can grip the separated work;

a positioning device for holding an object board on which a plurality of works are mounted, and for positioning the object board in X, Y, and rotational directions; and a finger head rotation mechanism, having a turret table rotatably mounted with a plurality of finger heads, for rotating an arbitrary finger head to the gripping position or rotating said arbitrary finger head to a release position at which the work is released from said arbitrary finger, each of said finger heads being mounted on said turret table so that an operating direction of said finger head is perpendicular to said positioning table at the release position and the operating direction is inclined at a gripping position by an angle $2\alpha$ from a vertical direction, said turret table having an axis of rotation inclined by an angle $\alpha$ from the vertical direction.

12. A mounting system for picking up one work from a pickup position where works having different types are selectively fed, and for moving a picked up work to an insertion position where the work is mounted on an object board, which comprises:

a rotary member arranged to be rotatable;

a plurality of head means, mounted on said rotary member, for picking up and inserting the works;

a single first driving means, connected to each of said head means which reaches the insertion position, for moving each of said head means in an insertion direction; and first detecting means for detecting a connection enable/disable state of said head means connectable to said first driving means before one of said head means which picked up a work is connected to said first driving means.

13. The mounting system according to claim 12, wherein
said head means are rotated and stopped stepwise at every rotation single determined by a number of said head means; and
said detecting means is arranged to perform a detection operation at a position before the insertion position.

14. The mounting system according to claim 12, which further comprises:
second driving means, connected to each of said head means reaching the pickup position, for moving each of said head means in a pickup direction; and
second detecting means for detecting a connection enable/disable state of one of said head means which inserted a work and can be connected to said second driving means before said head means which inserted the work is connected to said second driving means.

15. The mounting system according to claim 14, which further comprises:
stop control means for receiving detection signals from said first and second detecting means and for stopping an operation of said head means on the basis of an abnormal detection operation of at least one of said first and second detecting means.

16. The mounting system according to claim 15, wherein said first and second detecting means detect the connection enable state when one of said head means to be detected is located at an upper standby position and detect a connection disable state when said one head means to be detected is not located at the upper standby position.

17. The mounting system according to claim 16, which further comprises:
third detecting means for detecting a connection enable/disable state of said first driving means connectable to one of said head means which picked up a work when said head means which picked up the work is connected to said first driving means; and
fourth detecting means for detecting a connection enable/disable state of said second driving means connectable to one of said head means which inserted a work when said head means which inserted the work is connected to said second driving means.

18. The mounting system according to claim 17, wherein said stop control means stops an operation of said one head means when one of said third and fourth detecting means detects the connection disable state.

19. The mounting system according to claim 18, wherein said third and fourth detecting means detect the connection enable states when first and second driving means to be detected are located at an uppermost position and detect the connection disable states when said first and second driving means to be detected are not located at the uppermost position.

20. A method of changing a head mechanism in a mounting apparatus having said head mechanism for performing a pickup operation of a work and an insertion operation of the work on an object board, which comprises the steps of:
mounting a cam member on a gripper member for pickup up the work;
holding a slidable member to be slidable on a head body, said slidable member being mounted with a cam follower engaged with said cam member to open/close said gripper member; and
engaging said cam member of said gripper member with said cam follower at a predetermined position when said gripper member is changed.

21. A mounting method of sequentially picking up a work at a pickup position and inserting the work onto an object board at an insertion position using a mounting apparatus having a rotary member arranged to be rotatable and a plurality of head units which are capable of picking up and holding the works, said method comprising the steps of:
storing a pickup order in which designated works are sequentially picked-up at the pickup position and an insertion order in which designated held works are sequentially inserted onto the object board at the insertion position;
determining whether or not the head unit, which is the closest and is approaching the pickup or insertion position, is designated by the pickup or insertion order to pickup or insert the work, on the basis of the stored content; and
controlling operation to stop the rotary member at the pickup or insertion position, only if the head means, which is determined to be designated by the pickup or insertion order to pickup or insert the work, is approaching the pickup or insertion position.

* * * * *

UNITED STATES PATENT AND TRADEMARK OFFICE
CERTIFICATE OF CORRECTION

PATENT NO. : 5,313,401
DATED : May 17, 1994
INVENTOR(S) : Shozo KASAI, et al.

It is certified that error appears in the above-indentified patent and that said Letters Patent is hereby corrected as shown below:

ON THE COVER PAGE:

IN THE TITLE:

"HAND" should read --HEAD--.

IN THE DRAWINGS:

In Fig. 44, "DEVICE E" should read --DEVICE-- and "POSITON?" should read --POSITION?--.

COLUMN 1:

Line 3, "HAND" should read --HEAD--.

COLUMN 7:

Line 48, "FIG." should read --FIG. 15;--.

COLUMN 8:

Line 52, "48AB," should read --47AB,--.

UNITED STATES PATENT AND TRADEMARK OFFICE
CERTIFICATE OF CORRECTION

PATENT NO. : 5,313,401
DATED : May 17, 1994
INVENTOR(S) : Shozo KASAI, et al.

It is certified that error appears in the above-indentified patent and that said Letters Patent is hereby corrected as shown below:

COLUMN 11:

Line 49, "the-standby" should read --the standby--.

COLUMN 18:

Line 64, "he" should read --the--.

COLUMN 20:

Line 47, "thick-and" should read --thick and--.

COLUMN 21:

Line 61, "$343_m$" should read --$343_{10}$--.

COLUMN 22:

Line 15, "b" should read --by--; and
Line 43, "through third" should read --through hole 350b (FIG. 18) into which the upper end of the third--.

COLUMN 31:

Line 12, "is" should be deleted.

UNITED STATES PATENT AND TRADEMARK OFFICE
CERTIFICATE OF CORRECTION

PATENT NO. : 5,313,401
DATED : May 17, 1994
INVENTOR(S) : Shozo KASAI, et al.

It is certified that error appears in the above-indentified patent and that said Letters Patent is hereby corrected as shown below:

COLUMN 32:

Line 39, "side 442a" should read --side 442c--.

COLUMN 34:

Line 6, "roller 86" should read --roller 486--.

COLUMN 35:

Line 18, "mechanism 96" should read --mechanism 496--.

COLUMN 36:

Line 33, "limited" should read --limited to--.

COLUMN 40:

Line 31, "cause" should read --causes--.

COLUMN 43:

Line 31, "position $P_1$" should read --position $P_2$--.

UNITED STATES PATENT AND TRADEMARK OFFICE
CERTIFICATE OF CORRECTION

PATENT NO. : 5,313,401
DATED : May 17, 1994
INVENTOR(S) : Shozo KASAI, et al.

It is certified that error appears in the above-indentified patent and that said Letters Patent is hereby corrected as shown below:

COLUMN 50:

Line 35, "step S650 before" should read --step S650 of FIG. 46B which represents a timing immediately before--.

COLUMN 53:

Line 9, "position." should read --position".--; and
Line 43, "amount R2" should read --amount $R_2$--.

COLUMN 55:

Line 32, "work w." should read --work W.--; and
Line 62, "the" should be deleted.

COLUMN 56:

Line 7, "if" should read --if said--; and
Line 43, "work" should read --work being--.

UNITED STATES PATENT AND TRADEMARK OFFICE
CERTIFICATE OF CORRECTION

PATENT NO. : 5,313,401
DATED : May 17, 1994
INVENTOR(S) : Shozo KASAI, et al.

It is certified that error appears in the above-indentified patent and that said Letters Patent is hereby corrected as shown below:

COLUMN 59:

Line 9, "single" should read --angle--;
Line 22, "said" should read --said one--;
Line 45, "said" should read --said one--; and
Line 51, "said" should read --said one--.

COLUMN 60:

Line 20, "pickup" should read --picking--.

Signed and Sealed this

Twentieth Day of December, 1994

Attest:

BRUCE LEHMAN

Attesting Officer  Commissioner of Patents and Trademarks